United States Patent
Kimura

(10) Patent No.: US 8,350,785 B2
(45) Date of Patent: Jan. 8, 2013

(54) SEMICONDUCTOR DEVICE AND DRIVING METHOD OF THE SAME

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1298 days.

(21) Appl. No.: 10/595,158

(22) PCT Filed: Sep. 6, 2004

(86) PCT No.: PCT/JP2004/013381
§ 371 (c)(1),
(2), (4) Date: Mar. 9, 2006

(87) PCT Pub. No.: WO2005/027085

PCT Pub. Date: Mar. 24, 2005

(65) Prior Publication Data

US 2006/0284800 A1     Dec. 21, 2006

(30) Foreign Application Priority Data

Sep. 12, 2003  (JP) ................................. 2003-321613

(51) Int. Cl.
*G09G 3/30* (2006.01)
(52) U.S. Cl. ....... 345/76; 345/82; 315/169.1; 315/169.3
(58) Field of Classification Search .............. 345/76–82, 345/204; 315/169.1, 169.3
See application file for complete search history.

(56) References Cited

U.S. PATENT DOCUMENTS

| | | | |
|---|---|---|---|
| 4,992,677 A | 2/1991 | Ishibashi et al. |
| 5,689,460 A | 11/1997 | Ooishi |
| 5,723,950 A | 3/1998 | Wei et al. |
| 5,881,014 A | 3/1999 | Ooishi |
| 6,072,742 A | 6/2000 | Ooishi |
| 6,191,534 B1 | 2/2001 | Schuler et al. |
| 6,229,506 B1 | 5/2001 | Dawson et al. |
| 6,343,046 B1 | 1/2002 | Matsui |
| 6,373,454 B1 | 4/2002 | Knapp et al. |

(Continued)

FOREIGN PATENT DOCUMENTS

EP   1071070 A2   1/2001

(Continued)

OTHER PUBLICATIONS

PCT International Search Report (PCT/JP2004/013381); Jan. 11, 2005.

(Continued)

*Primary Examiner* — Amare Mengistu
*Assistant Examiner* — Jennifer Zubajlo
(74) *Attorney, Agent, or Firm* — Fish & Richardson P.C.

(57) ABSTRACT

In the case of reducing an effect of variations in current characteristics of transistors by inputting a signal current to a transistor in a pixel, a potential of a wiring is detected by using a precharge circuit. In the case where there is a difference between a predetermined potential and the potential of the wiring, a charge is supplied to the wiring to perform a precharge by charging rapidly. When the potential of the wiring reaches the predetermined potential, the supply of charge is stopped and a signal current only is supplied. Thus, a precharge is performed only in a period until the potential of the wiring reaches the predetermined potential, therefore, a precharge can be performed for an optimal period.

23 Claims, 45 Drawing Sheets

U.S. PATENT DOCUMENTS

| | | | |
|---|---|---|---|
| 6,424,585 B1 | 7/2002 | Ooishi | |
| 6,535,448 B2 | 3/2003 | Matsui | |
| 6,556,475 B2 | 4/2003 | Yamazaki et al. | |
| 6,567,327 B2* | 5/2003 | Tsuchi | 365/203 |
| 6,690,615 B2 | 2/2004 | Matsui | |
| 6,693,388 B2* | 2/2004 | Oomura | 315/169.3 |
| 6,859,193 B1 | 2/2005 | Yumoto | |
| 6,909,242 B2 | 6/2005 | Kimura | |
| 6,963,336 B2 | 11/2005 | Kimura | |
| 6,989,826 B2 | 1/2006 | Kasai | |
| 7,015,882 B2 | 3/2006 | Yumoto | |
| 7,138,967 B2 | 11/2006 | Kimura | |
| 7,180,479 B2 | 2/2007 | Kimura | |
| 7,193,591 B2 | 3/2007 | Yumoto | |
| 7,193,619 B2 | 3/2007 | Kimura | |
| 7,256,756 B2 | 8/2007 | Abe | |
| 7,378,882 B2 | 5/2008 | Kimura | |
| 7,379,039 B2 | 5/2008 | Yumoto | |
| 7,388,564 B2 | 6/2008 | Yumoto | |
| 7,528,812 B2 | 5/2009 | Tsuge et al. | |
| 7,576,734 B2 | 8/2009 | Kimura | |
| 7,583,032 B2 | 9/2009 | Kimura | |
| 7,583,257 B2 | 9/2009 | Kimura | |
| 7,742,064 B2 | 6/2010 | Kimura | |
| 7,791,566 B2 | 9/2010 | Kimura | |
| 7,796,110 B2 | 9/2010 | Abe | |
| 7,859,520 B2 | 12/2010 | Kimura | |
| 7,915,830 B2 | 3/2011 | Kimura | |
| 7,940,235 B2 | 5/2011 | Kimura | |
| 7,948,453 B2 | 5/2011 | Kimura | |
| 7,961,159 B2 | 6/2011 | Kimura | |
| 8,035,626 B2 | 10/2011 | Kimura | |
| 8,120,551 B2 | 2/2012 | Yumoto | |
| 8,164,548 B2 | 4/2012 | Kimura | |
| 2001/0032990 A1 | 10/2001 | Koyama et al. | |
| 2003/0006713 A1 | 1/2003 | Kim et al. | |
| 2003/0020413 A1 | 1/2003 | Oomura | |
| 2003/0030602 A1 | 2/2003 | Kasai | |
| 2003/0107859 A1 | 6/2003 | Pan et al. | |
| 2003/0160744 A1 | 8/2003 | Yoshida et al. | |
| 2003/0214245 A1 | 11/2003 | Yamazaki et al. | |
| 2004/0232952 A1 | 11/2004 | Kimura et al. | |
| 2005/0030264 A1 | 2/2005 | Tsuge et al. | |
| 2005/0041002 A1 | 2/2005 | Takahara et al. | |
| 2005/0057189 A1 | 3/2005 | Kimura | |
| 2005/0057580 A1* | 3/2005 | Yamano et al. | 345/690 |
| 2005/0259054 A1* | 11/2005 | Wu | 345/82 |
| 2006/0001613 A1* | 1/2006 | Routley et al. | 345/76 |
| 2006/0119552 A1 | 6/2006 | Yumoto | |
| 2006/0139279 A1 | 6/2006 | Yamazaki et al. | |
| 2009/0033649 A1 | 2/2009 | Kimura | |
| 2011/0134163 A1 | 6/2011 | Kimura | |
| 2011/0169008 A1 | 7/2011 | Kimura | |
| 2011/0205216 A1 | 8/2011 | Kimura | |
| 2011/0234573 A1 | 9/2011 | Kimura | |
| 2011/0254880 A1 | 10/2011 | Kimura | |

FOREIGN PATENT DOCUMENTS

| | | |
|---|---|---|
| EP | 1130565 A1 | 9/2001 |
| EP | 1 274 065 | 1/2003 |
| EP | 1 282 104 A1 | 2/2003 |
| EP | 1 288 901 A2 | 3/2003 |
| EP | 1296310 A2 | 3/2003 |
| EP | 1 333 422 A1 | 8/2003 |
| EP | 1333422 A1 | 8/2003 |
| EP | 1 341 147 A2 | 9/2003 |
| EP | 1424674 A1 | 6/2004 |
| EP | 1434193 A1 | 6/2004 |
| EP | 1441324 A1 | 7/2004 |
| EP | 1447787 A1 | 8/2004 |
| EP | 1450341 A1 | 8/2004 |
| EP | 1450342 A1 | 8/2004 |
| EP | 1486942 A1 | 12/2004 |
| EP | 1 494 203 A2 | 1/2005 |
| EP | 1619570 A1 | 1/2006 |
| EP | 1 624 358 | 2/2006 |
| EP | 2 148 317 A2 | 1/2010 |
| EP | 2290642 A2 | 2/2011 |
| EP | 1463026 B1 | 10/2011 |
| JP | 61-248604 | 11/1986 |
| JP | 2001615 A | 1/1990 |
| JP | 04-175666 A | 6/1992 |
| JP | 05-016765 B2 | 3/1993 |
| JP | 05-062842 B | 9/1993 |
| JP | 5243937 A | 9/1993 |
| JP | 08-190437 | 7/1996 |
| JP | 08-237882 A | 9/1996 |
| JP | 11-003067 | 1/1999 |
| JP | 2000-030455 | 1/2000 |
| JP | 2000-331477 | 11/2000 |
| JP | 2001085984 A | 3/2001 |
| JP | 2002-514320 A | 5/2002 |
| JP | 2002-517806 A | 6/2002 |
| JP | 2002-261588 A | 9/2002 |
| JP | 2003-066908 A | 3/2003 |
| JP | 2003-114645 | 4/2003 |
| JP | 2003108066 A | 4/2003 |
| JP | 2003-195812 A | 7/2003 |
| JP | 2003-195815 A | 7/2003 |
| JP | 2003-255894 | 9/2003 |
| JP | 2004-054200 A | 2/2004 |
| JP | 2004-354758 | 12/2004 |
| WO | 98/48403 A1 | 10/1998 |
| WO | 99/65011 A2 | 12/1999 |
| WO | WO0106484 A1 | 1/2001 |
| WO | 02/39420 A1 | 5/2002 |
| WO | WO03023752 A1 | 3/2003 |
| WO | 03/027997 A1 | 4/2003 |
| WO | 03/038793 A1 | 5/2003 |
| WO | 03/038794 A1 | 5/2003 |
| WO | 03/038795 A1 | 5/2003 |
| WO | 03/038796 A1 | 5/2003 |
| WO | 03/038797 A1 | 5/2003 |

OTHER PUBLICATIONS

PCT Written Opinion (PCT/JP2004/013381); Jan. 11, 2005.
European Search Report (Application No. 04773054.4) dated Sep. 6, 2007, 3 pages.
Office Action (Application No. 04773054.4) dated Mar. 24, 2010, 5 pages.
Okamura, M, "Fig. 3-13 Circuit Example of Simplified Op-Amp," Standard Text OP-Amp Circuit Design, Sep. 30, 1990, CQ Publishing Co., Ltd., p. 88 (4 pages with English translation).
Bhowmick. S et al., "P-100: An Improved Four TFT Circuit for Active-Matrix Organic Light Emitting Diode (OLED) Display,", SID Digest '02 : SID International Symposium Digest of Technical Papers, May 1, 2002, vol. 33, No. 1, pp. 606-609.
Dawson, R et al., "24.1: Invited Paper: Pursuit of Active Matrix Organic Light Emitting Diode Displays," SID Digest '01 : SID International Symposium Digest of Technical Papers, 2001, vol. 32, No. 1, pp. 372-375.
Dawson, R et al., "The Impact of the Transient Response of Organic Light Emitting Diodes on the Design of Active Matrix OLED Displays," IEDM 98: Technical Digest of International Electron Devices Meeting, 1998, pp. 875-878.
Hattori, R et al., "Analog-Circuit Simulation of the Current-Programmed Active-Matrix Pixel Electrode Circuits Based on Poly-SI TFT for Organic Light-Emitting Displays," AM-LCD '01 Digest of Technical Papers, Jul. 11, 2001, pp. 223-226.
Hattori, R et al., "Current-Writing Active-Matrix Circuit for Organic Light-Emitting Diode Display Using a-Si:H Thin-Film-Transistors," IEICE Trans. Electron, (IEICE Transactions on Electronics), May 1, 2000, vol. E83-C, No. 5, pp. 779-782.
He, Y et al., "Electrical Reliability of Two—and Four—a-Si:H TFT Pixel Electrode Circuits for Active-Matrix OLEDs," Conference Record of the 2000 IDRC (International Display Research Conference), 2000, pp. 354-357.
He, Y et al., "Four-Thin Film Transistor Pixel Electrode Circuits for Active-Matrix Organic Light-Emitting Displays," Jpn. J. Appl. Phys. (Japanese Journal of Applied Physics), Mar. 1, 2001, vol. 40, No. 3A, pp. 1199-1208.

Hong, Y et al., "4.5:200 dpi 4-a-Si:H TFTs Current-Driven AM-PLEDS," SID Digest '03: SID International Symposium Digest of Technical Papers, May 1, 2003, vol. 34, No. 1, pp. 22-25.

Kanicki, J et al., "Amorphous Silicon Thin-Film Transistors Based Active-Matrix Organic Light-Emitting Displays," Asia Display/IDW '01, 2001, pp. 315-318.

Lin. Y et al., "P-101: Current Driving Pixel Circuities for Active Matrix Organic Light Emitting Diode Display," SID Digest '02 : SID International Symposium Digest of Technical Papers, May 1, 2002, vol. 33, No. 1, pp, 610-613.

Mazhari, B et al., "Design of Current Programmed Amorphous Silicon AMOLED Pixel Circuit," Proceedings of the 8th Asian Symposium on Information Display, 2003, pp. 327-330.

Sanford, J L et al., "4.2: TFT Amoled Pixel Circuits and Driving Methods," SID Digest '03 : SID International Symposium Digest of Technical Papers, May 1, 2003, vol. 34, No. 1, pp. 10-13.

European Office Action (EP Application No. 04773054.4) dated Oct. 11, 2012.

* cited by examiner

-- PRIOR ART --

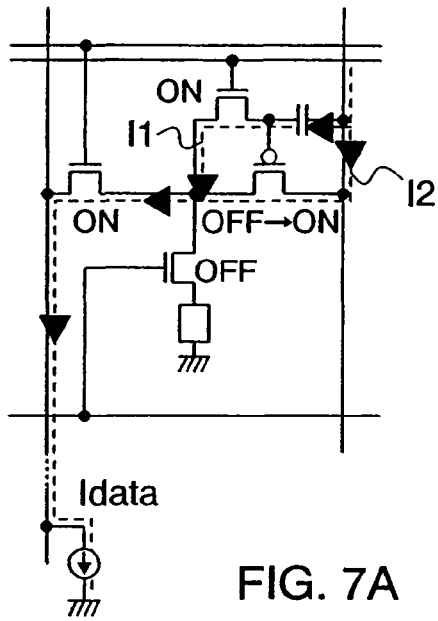
FIG. 7A
-- PRIOR ART --
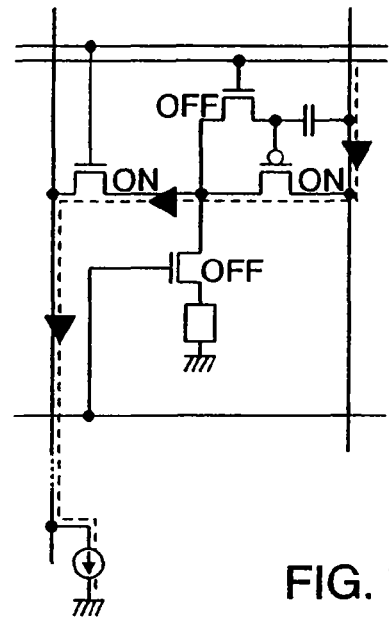
FIG. 7B
-- PRIOR ART --
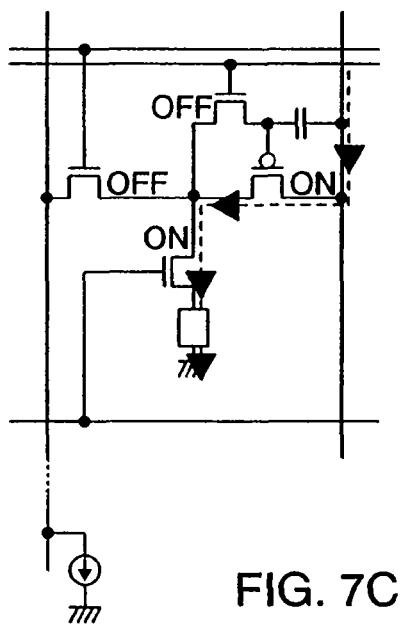
FIG. 7C
-- PRIOR ART --
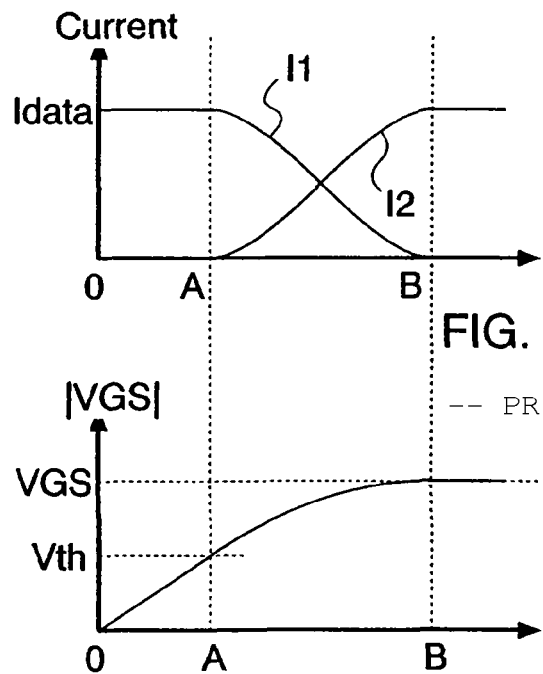
FIG. 7D
-- PRIOR ART --
FIG. 7E
-- PRIOR ART --

-- PRIOR ART --

-- PRIOR ART --

-- PRIOR ART --

-- PRIOR ART --

SEMICONDUCTOR DEVICE AND DRIVING METHOD OF THE SAME

TECHNICAL FIELD

The present invention relates to a semiconductor device provided with a function to control by a transistor a current to be supplied to a load. In particular, the invention relates to a pixel formed of a current drive type light emitting element of which luminance changes according to a current, a semiconductor device including a signal driver circuit which drives a pixel, and a driving method thereof.

BACKGROUND ART

In a display device using such a self-luminous light emitting element as OLED (Organic Light Emitting Diode), organic EL element and EL (Electro Luminescence) element, a passive matrix method and an active matrix method are known as its driving method. The former has a simple structure, but has a problem such that a realization of a large and high luminance display is difficult. Therefore, the active matrix method is developed in recent years in which a current flowing to the light emitting element is controlled by a thin film transistor (TFT) provided in a pixel circuit.

In the case of a display device of the active matrix method, there is a problem that a current flowing to a light emitting element varies due to a variation in current characteristics of driving TFTs, which varies a luminance.

That is, in the case of a display device of the active matrix method, a driving TFT which drives a current flowing to the light emitting element is used in a pixel circuit. When characteristics of these driving TFTs vary, a current flowing to the light emitting element varies, which varies a luminance. Then, various circuits are suggested in which a current flowing to a light emitting element does not vary even when characteristics of driving TFTs in a pixel circuit vary to suppress a variation in luminance. (For example, refer to Patent Documents 1 to 4)

Patent Documents 1 to 3 disclose circuit configurations for preventing variations of current value to be supplied to a light emitting element due to variations in characteristics of driving TFTs provided in pixel circuits. This configuration is referred to as a current write type pixel or a current input type pixel. Patent Document 4 discloses a circuit configuration for suppressing variations of a signal current due to variations of TFTs in a source driver circuit.

FIG. 6 shows a first configuration example of a conventional active matrix display device disclosed in Patent Document 1. The pixel shown in FIG. 6 comprises a source signal line 601, first to third gate signal lines 602 to 604, a current supply line 605, TFTs 606 to 609, a capacitor 610, an EL element 611, and a current source 612 for inputting a video signal.

An operation from a write of a signal current to a light emission is described with reference to FIGS. 7A to 7E. Reference numerals denoting each portion in the drawings correspond to those in FIG. 6. FIGS. 7A to 7C each schematically shows a current flow. FIG. 7D shows a relationship of a current flowing through each path when writing a signal current. FIG. 7E shows a voltage accumulated in the capacitor 610 when writing a signal current, that is a gate-source voltage of the TFT 608.

First, a pulse is inputted to the first gate signal line 602 and the second gate signal line 603 and the TFTs 606 and 607 are turned ON. At this time, a current flowing through the source signal line, that is a signal current is denoted as Idata.

As the current Idata flows through the source signal line, the current path is divided into I1 and I2 in a pixel as shown in FIG. 7A. These relationships are shown in FIG. 7D. It is needless to say that Idata=I1+I2 is satisfied.

A charge is not held in the capacitor 610 at the moment the TFT 606 is turned ON, therefore, the TFT 608 is OFF. Therefore, I2=0 and Idata=I1 are satisfied. In other words, current only flows into the capacitor 610 to be accumulated in the meantime.

After that, as the charge is gradually accumulated in the capacitor 610, a potential difference starts to generate between both electrodes (FIG. 7E). When the potential difference between the both electrodes reaches Vth (a point A in FIG. 7E), the TFT 608 is turned ON and I2 generates. As described above, as Idata=I1+I2 is satisfied, current still flows and a charge is further accumulated in the capacitor while I1 decreases gradually.

The charge keeps being accumulated in the capacitor 610 until the potential difference between the both electrodes, that is a gate-source voltage of the TFT 608 reaches a desired voltage, that is a voltage (VGS) which can make the TFT 608 flow the current Idata. When the charge stops being accumulated (a point B in FIG. 7E), the current I2 stops flowing and the TFT 608 flows a current corresponding to VGS at that time and Idata=I1 is satisfied (FIG. 7B). In this manner, a steady state is obtained. Thus, a write operation of a signal is terminated. At last, selections of the first gate signal line 602 and the second gate signal line 603 are terminated to turn OFF the TFTs 606 and 607.

An operation to set to supply a predetermined current in this manner is referred to as a set operation.

Subsequently, a light emitting operation starts. A pulse is inputted to the third gate signal line 604 to turn ON the TFT 609. As the capacitor 610 holds VGS which is written before, the TFT 608 is ON and the current Idata flows from the current supply line 605. Thus, the EL element 611 emits light. Provided that the TFT 608 is set to operate in a saturation region, Idata keeps flowing without changing even when a source-drain voltage of the TFT 608 changes.

An operation to output a set current in this manner is hereinafter referred to as an output operation. As a merit of the current write type pixel of which example is shown above, a desired current can be accurately supplied to an EL element because a gate-source voltage required to flow the current Idata is held in the capacitor 610 even when the TFTs 608 have variations in characteristics and the like. Therefore, a luminance variation due to the variations in characteristics of TFTs can be suppressed.

The aforementioned examples relate to a technology for compensating a change of current due to variations of driving TFTs in pixel circuits, however, the same problem occurs in a source driver circuit as well. Patent Document 4 discloses a circuit configuration for preventing a change of a signal current due to variations of the TFTs in the source driver circuit generated in fabrication.

[Patent Document 1]
Published Japanese Translation of PCT International Publication for Patent Application No. 2002-517806
[Patent Document 2]
International Publication WO01/06484
[Patent Document 3]
Published Japanese Translation of PCT International Publication for Patent Application No. 2002-514320
[Patent Document 4]
International Publication WO02/39420

[Patent Document 5]
Published Japanese Translation of PCT International Publication for Patent Application No. 2003-66908

DISCLOSURE OF INVENTION

In the case of a technology disclosed in Patent Document 5, however, a charge is supplied from a voltage source to a source signal line in a certain period at the beginning of a row selection period, and after that, the voltage source is changed to a current source by a power source changing means, thereby a charge is supplied to the source signal line. A configuration at this time is shown in FIG. 43. A voltage source 4311 is changed to a current source 4301 by a power source changing means 4321, thereby the set operation is performed to a transistor 4302. Here, a wiring 4304 is connected to the current source 4301 and a wiring 4314 is connected to the voltage source 4311 respectively, and a wiring 4307, a capacitor 4303, and a wiring 4305 are connected to the transistor 4302.

That is, in this case, a period for supplying a charge from the voltage source 4311 is fixed. Therefore, a period for supplying a charge from the voltage source 4311 and a period for supplying a charge from the current source 4301 are not optimal in length.

FIG. 44 shows a graph showing a change over time of a potential of a source signal line as an example. It is assumed that an initial potential of the source signal line is 3 V. It is also assumed that the potential of the source signal line in a steady state obtained by supplying a current from a current source is V1' in FIG. 44(a) and V2' in FIG. 44(b). Then, a charge is supplied from the voltage source to the source signal line up to a time T1 while a charge is supplied from the current source to the source signal line from the time T1.

First, as the potential of the voltage source is V1 in the case of FIG. 44(a), the potential of the source signal line approaches from V3 to V1. However, as a potential difference between V3 and V1 is large, the potential of the source signal line is quite far from V1 in the time T1. A charge is supplied from the current source from the time T1, however, the potential of the source signal line is still far from V1' which is a potential in the steady state, even in a time T2 because an amount of charge is small. Therefore, in this case, a period for supplying a charge from the voltage source is required to be longer.

In the case of FIG. 44(b), on the other hand, the potential of the source signal line approaches from V3 to V2 as the potential of the voltage source is V2. At this time, a potential difference between V3 and V2 is small, therefore, the potential of the source signal line is close to V2 in the time T1. A charge is supplied from the current source from the time T1, however, the steady state can be obtained even with a small amount of charge because the potential difference is small. That is, the potential of the source signal line in the time T2 is equal to V2' which is a potential in the steady state. Therefore, in this case, a period for supplying a charge from the voltage source is optimal in length.

A period for supplying a charge from the voltage source is short in the case of FIG. 44(a). Now, the case of supplying a charge from the voltage source for a longer period, that is up to the time T2 is described. FIG. 45 shows a graph showing a change over time of the potential of the source signal line in that case.

In the case of FIG. 45(a), the potential of the voltage source is V1, therefore, the potential of the source signal line approaches from V3 to V1. The potential difference between V3 and V1 is large, however, a period for supplying a charge from the voltage source is long. Therefore, the potential of the source signal line is close to V1 in the time T2. A charge is supplied from the current source from the time T2, however, the steady state can be obtained even with a small amount of charge because the potential difference is small. That is, the potential of the source signal line in a time T3 is equal to a potential in the steady state V1'. Therefore, in this case, a period for supplying a charge from the voltage source is optimal in length.

In the case of FIG. 45(b), on the other hand, the potential of the voltage source is V2, therefore, the potential of the source signal line approaches from V3 to V2. At this time, as a potential difference between V3 and V2 is small, therefore, the potential of the source signal line is equal to V2 when passing the time T1. However, a charge is supplied from the voltage source up to the time T2, therefore, the potential of the source signal line remains V2. A charge is supplied from the current source from the time T2, however, the steady state can be obtained even with a small amount of charge because the potential difference is small.

That is, in the case of FIG. 44(b), the potential of the source signal line in the time T2 is equal to V2' which is a potential in the steady state. In the case of FIG. 45(b), however, the potential of the source signal line in the time T2 remains V2 and the time T3 is also required to obtain the steady state.

In this manner, in the case where a period for supplying a charge from the voltage source is short as shown in FIG. 44, it takes a while until the steady state is obtained when the potential difference is large (FIG. 44(a)), while in the case where the period for supplying a charge from the voltage source is long, it takes a long time until the steady state is obtained not only when the potential difference is large (FIG. 45(a)) but also when the potential difference is small (FIG. 45(b)).

In this manner, a length of a period for supplying a charge from the voltage source determined, the potential of the signal line cannot be changed sufficiently and a part of a period for writing a signal becomes waste, which results in requiring more time until the steady state is obtained.

There is another problem besides the aforementioned that a voltage value supplied at the beginning of a row selection period is not optimal, which results in requiring much time until the steady state is obtained.

In view of the aforementioned, the invention provides a semiconductor device which is capable of reducing an effect of variations in characteristics of transistors, supplying a predetermined current, and improving a write speed of a signal sufficiently independently of an amount of potential change of a signal line.

According to the invention, when a potential of a wiring is detected and the potential has a difference from a predetermined potential, a charge is supplied. When the potential of the wiring reaches the predetermined potential, the aforementioned purpose is achieved by stopping the supply of charge.

In order to perform such an operation, a precharge circuit is provided. The precharge circuit has a function to supply a charge when a potential of a wiring is detected and the potential has a difference from the predetermined potential, and stop the supply of charge when the potential of the wiring reaches the predetermined potential.

The precharge circuit includes a comparison control circuit and a precharge switch. The comparison control circuit detects a potential of a wiring and has a function to control ON/OFF of the precharge switch in the case where the potential is different from a predetermined potential. The precharge switch has a function to control whether to supply a charge to a wiring or not.

The invention provides a semiconductor device including a current supply means, a wiring, a transistor, and a precharge circuit. The current supply means is connected to the transistor through the wiring. The precharge circuit detects a potential of the wiring and has a function to supply a charge to the wiring depending on a relation with a predetermined potential.

According to the invention having the aforementioned structure, the comparison control circuit is formed by using an operational amplifier, a chopper inverter comparator or a differential circuit.

According to the invention having the aforementioned structure, the transistor supplies a current to a light emitting element or a pixel.

A kind of a transistor applicable to the invention is not particularly limited. It may be a thin film transistor (TFT) using a non-single crystalline semiconductor film represented by amorphous silicon or polycrystalline silicon, a MOS transistor formed by using a semiconductor substrate or an SOI substrate, a junction transistor, a bipolar transistor, a transistor using an organic semiconductor or a carbon nanotube, or other transistors. Furthermore, a substrate on which a transistor is mounted is not exclusively limited to a certain type. It may be a single crystalline substrate, an SOI substrate, a glass substrate, and the like.

Note that, in the invention, connection means electrical connection. Therefore, in a structure disclosed in the invention, other elements (for example, another element, a switch and the like) which provide an electrical connection may be disposed as well in addition to predetermined connections.

According to the invention, in the case of supplying a current to a transistor of a pixel or a signal driver circuit, a precharge operation is performed in advance. Therefore, a write of current is terminated rapidly. Furthermore, as a period for performing the precharge operation is controlled appropriately, a current can be set accurately without waste. Moreover, rapid precharge can be achieved to obtain a predetermined potential. As a result, an effect of variations in characteristics of transistors can be reduced, a predetermined current can be supplied, and a write speed of a signal can be improved sufficiently independently of an amount of potential change of a signal line even with a small signal current.

Although the present invention will be described by way of example with reference to the accompanying drawings, it is to be understood that various changes and modifications will be apparent to those skilled in the art. Therefore, unless such changes and modifications depart from the scope of the invention, they should be construed as being included therein.

BRIEF DESCRIPTION OF DRAWINGS

FIGS. 7A to 7E are diagrams showing operations of a conventional pixel.

BEST MODE FOR CARRYING OUT THE INVENTION

Embodiment Mode 1

According to the invention, a pixel is formed of an element which is capable of controlling a luminance according to a current value supplied to a light emitting element. Typically, an EL element can be applied. Among various known structures of an EL element, any element structure can be applied to the invention as long as it can control a luminance by a current value. That is, an EL element is formed by freely combining a light emitting layer, a charge transporting layer, and a charge injection layer, for which materials can be selected from a low molecular weight organic material, medium molecular weight organic material (organic light emitting material having no sublimation property and of which number of molecules is 20 or less, or a length of chain molecules is 10 μm or less) or a high molecular weight organic material. Further, the aforementioned material mixed or dispersed with non-organic material may be used.

First, a configuration based on the basic principle of the invention is described. A wiring 107A is connected to a current source 101 and a transistor 102 to which a current supplied from the current source 101 is inputted and a signal is written. A gate terminal of the transistor 102 which holds a gate potential is connected to a capacitor 103 to which a wiring 106 is connected. Note that the capacitor 103 can be omitted when using a gate capacitance of a transistor and the like.

Figure 1:
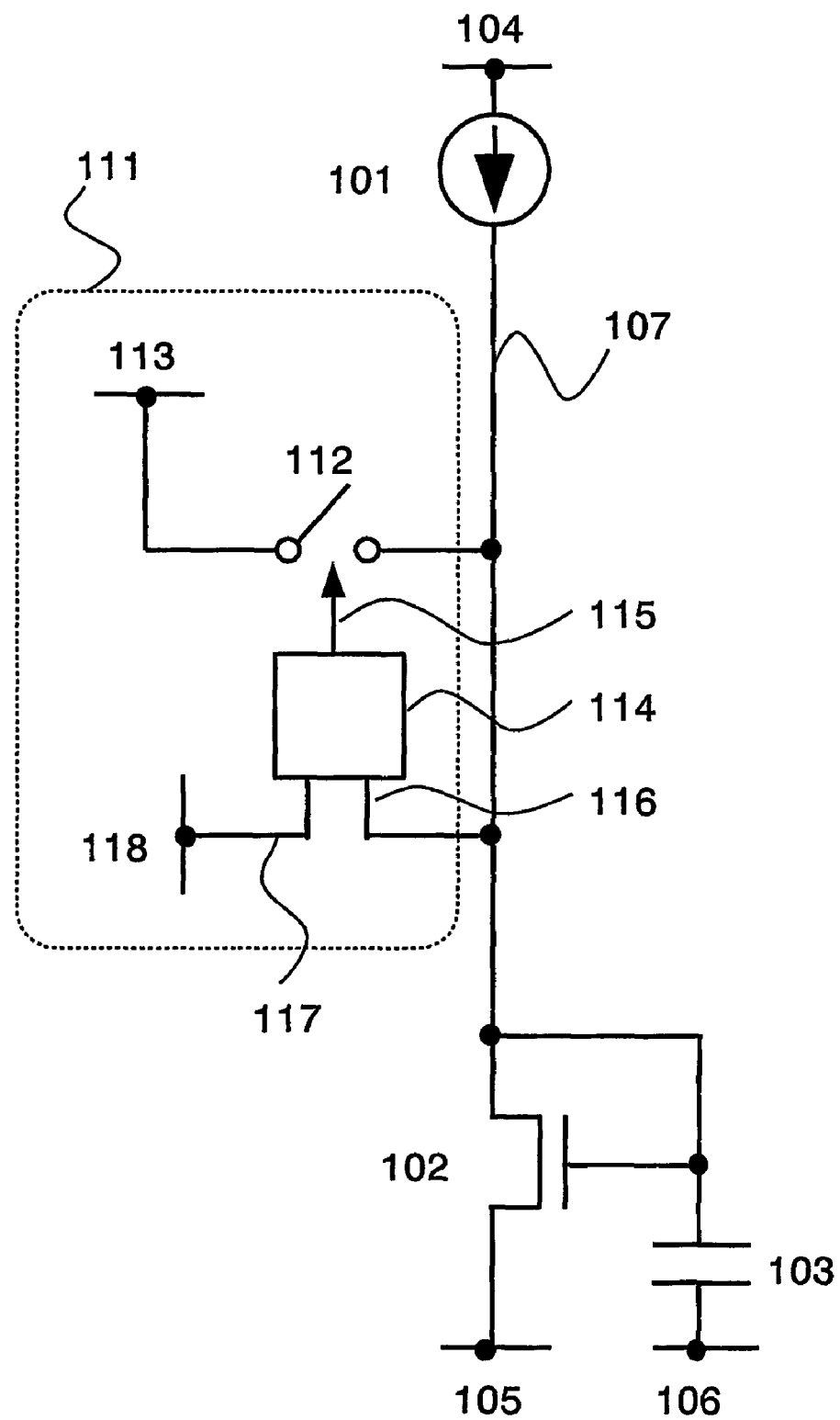
FIG. 1 is a diagram showing a configuration of a semiconductor device of the invention.
Figure 2:
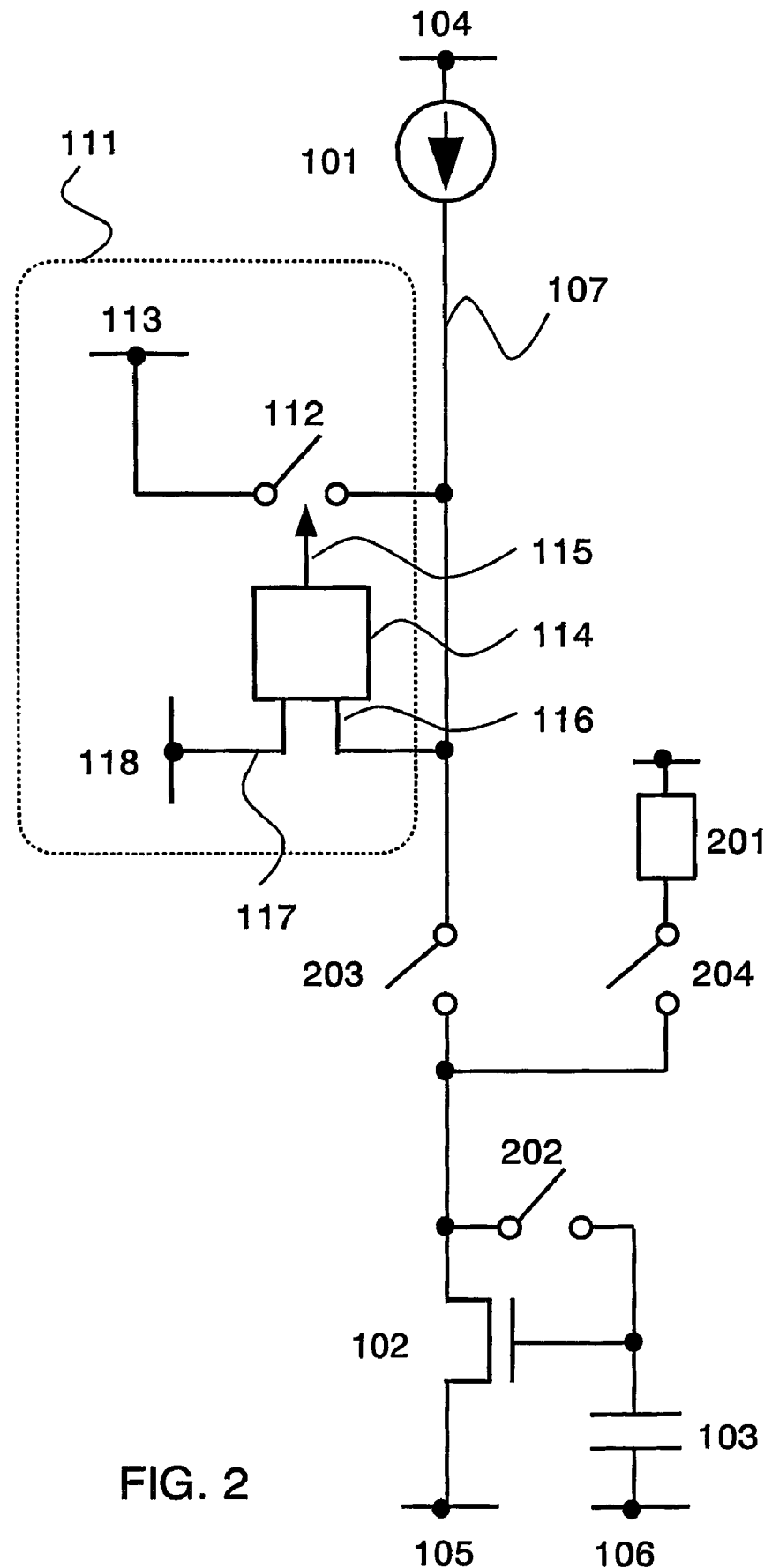
FIG. 2 is a diagram showing a configuration of a semiconductor device of the invention.
Figure 3:
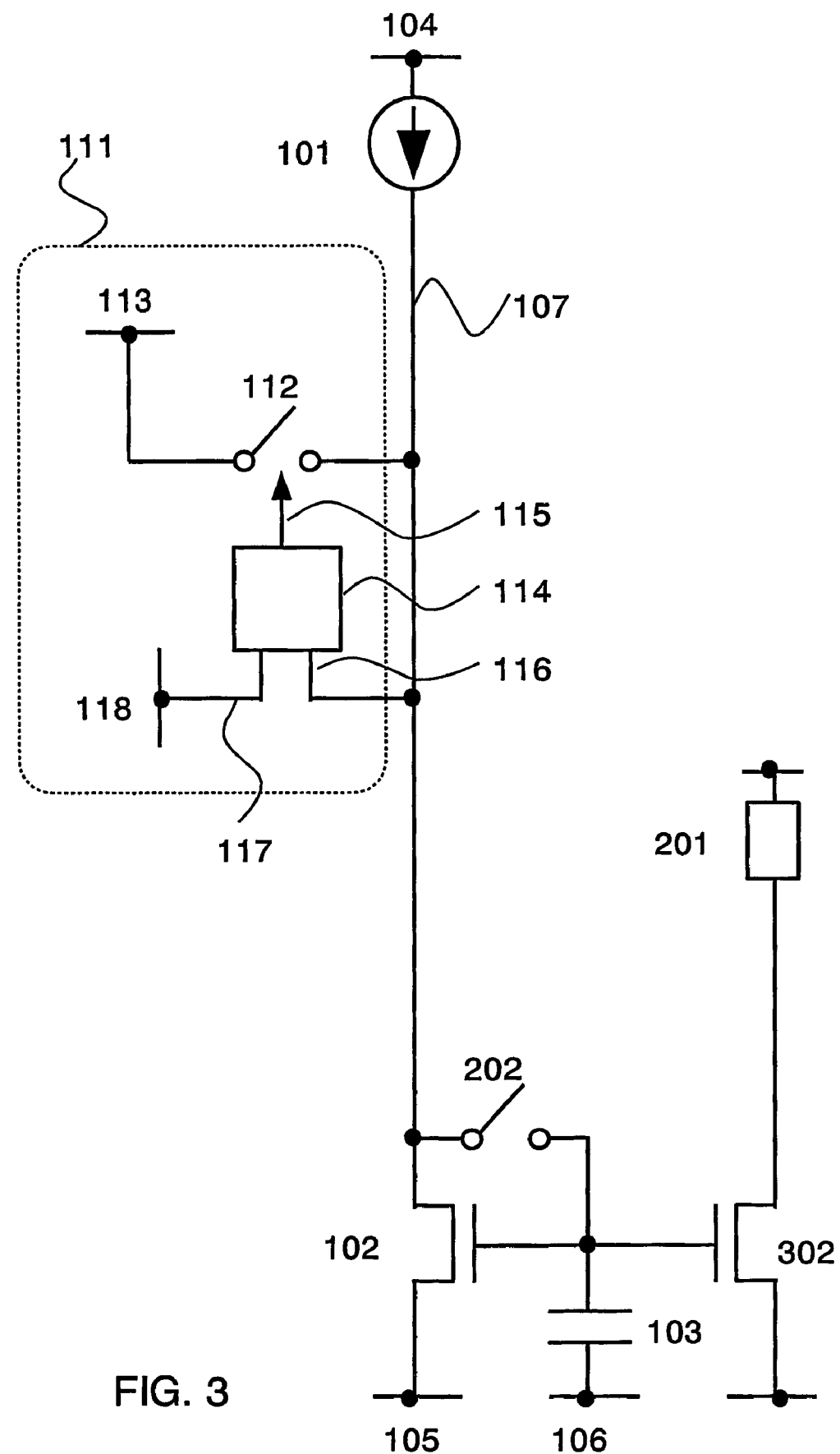
FIG. 3 is a diagram showing a configuration of a semiconductor device of the invention.
Figure 4:
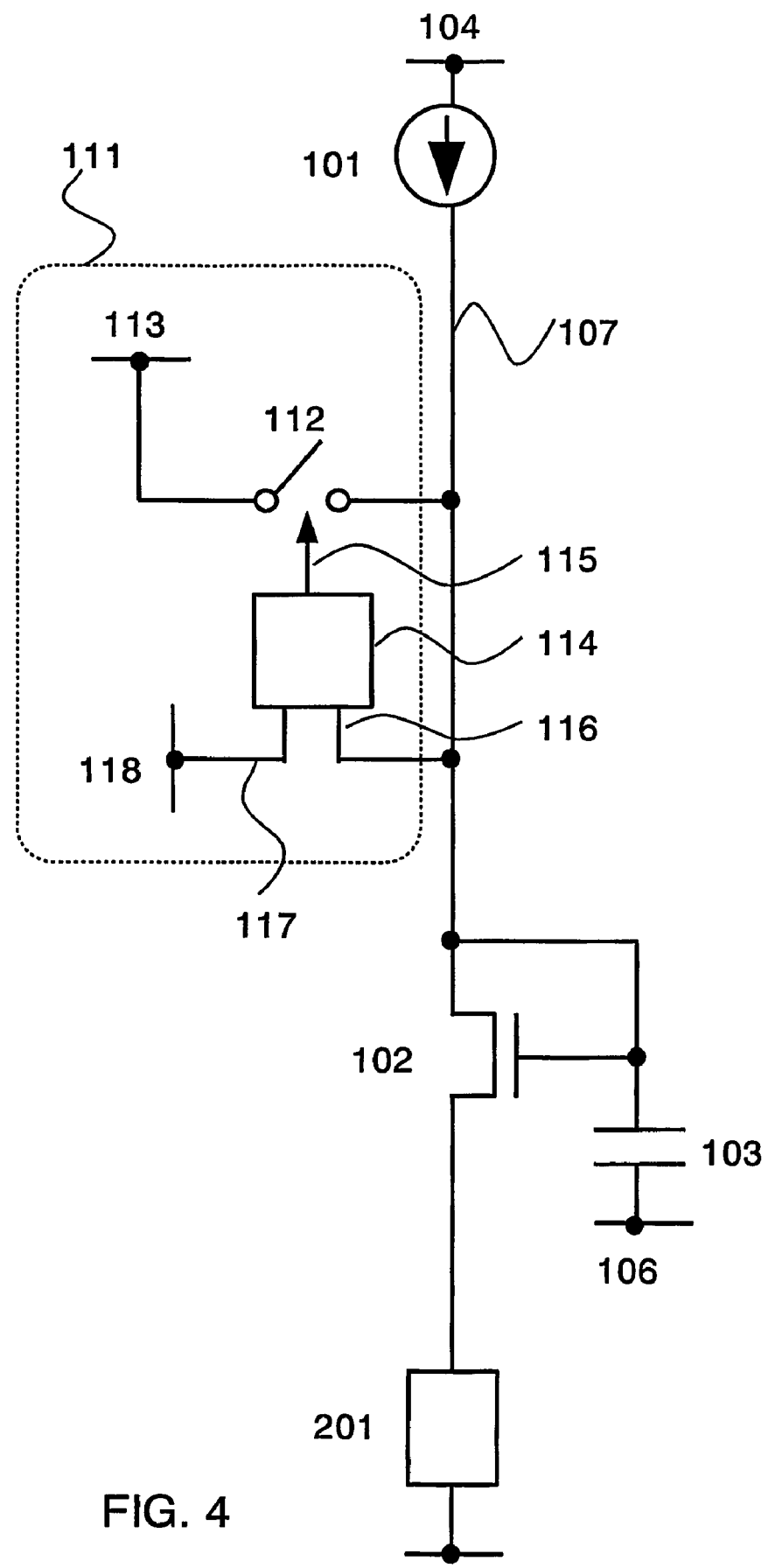
FIG. 4 is a diagram showing a configuration of a semiconductor device of the invention.
Figure 5:
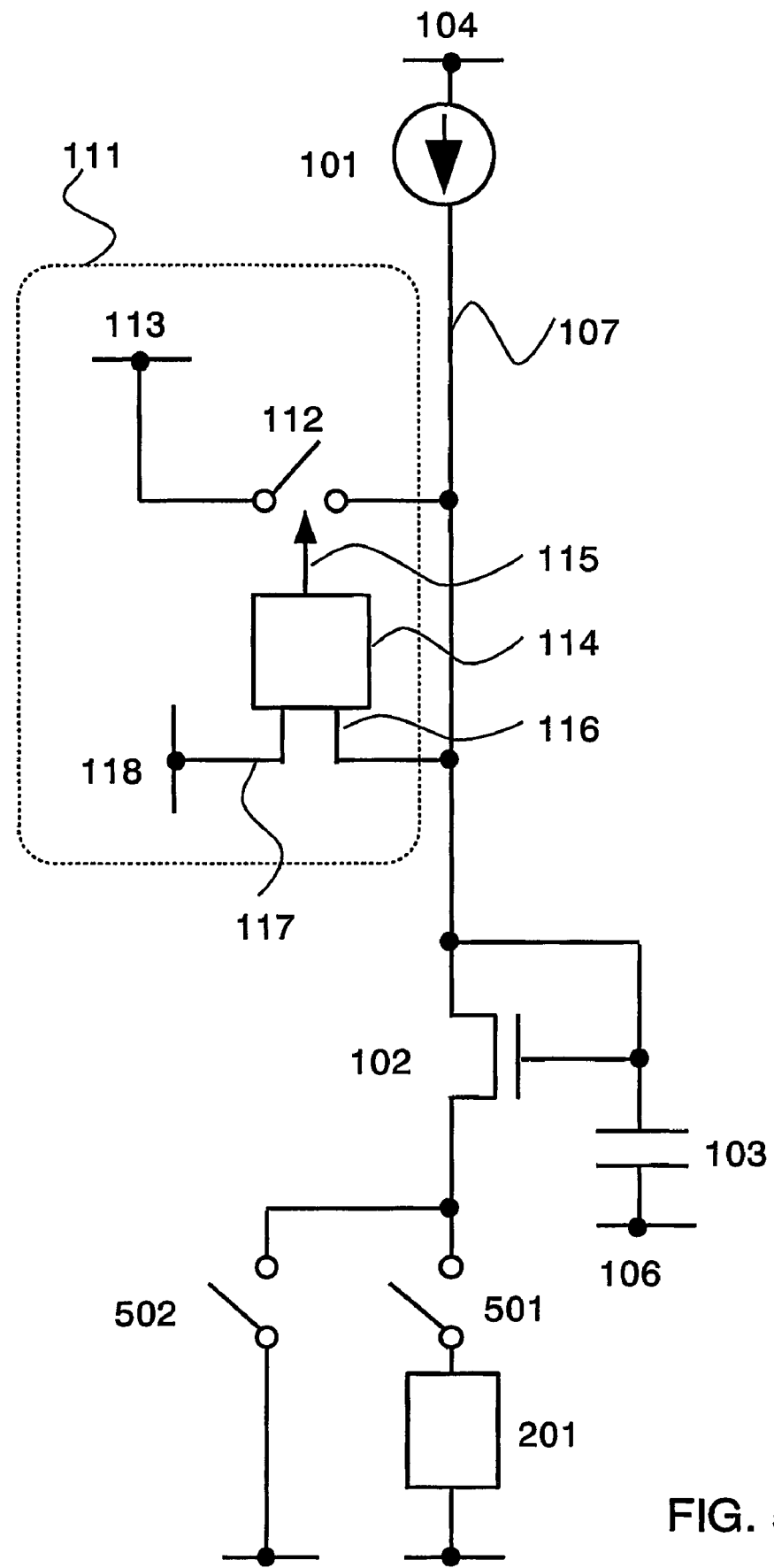
FIG. 5 is a diagram showing a configuration of a semiconductor device of the invention.
Figure 6:
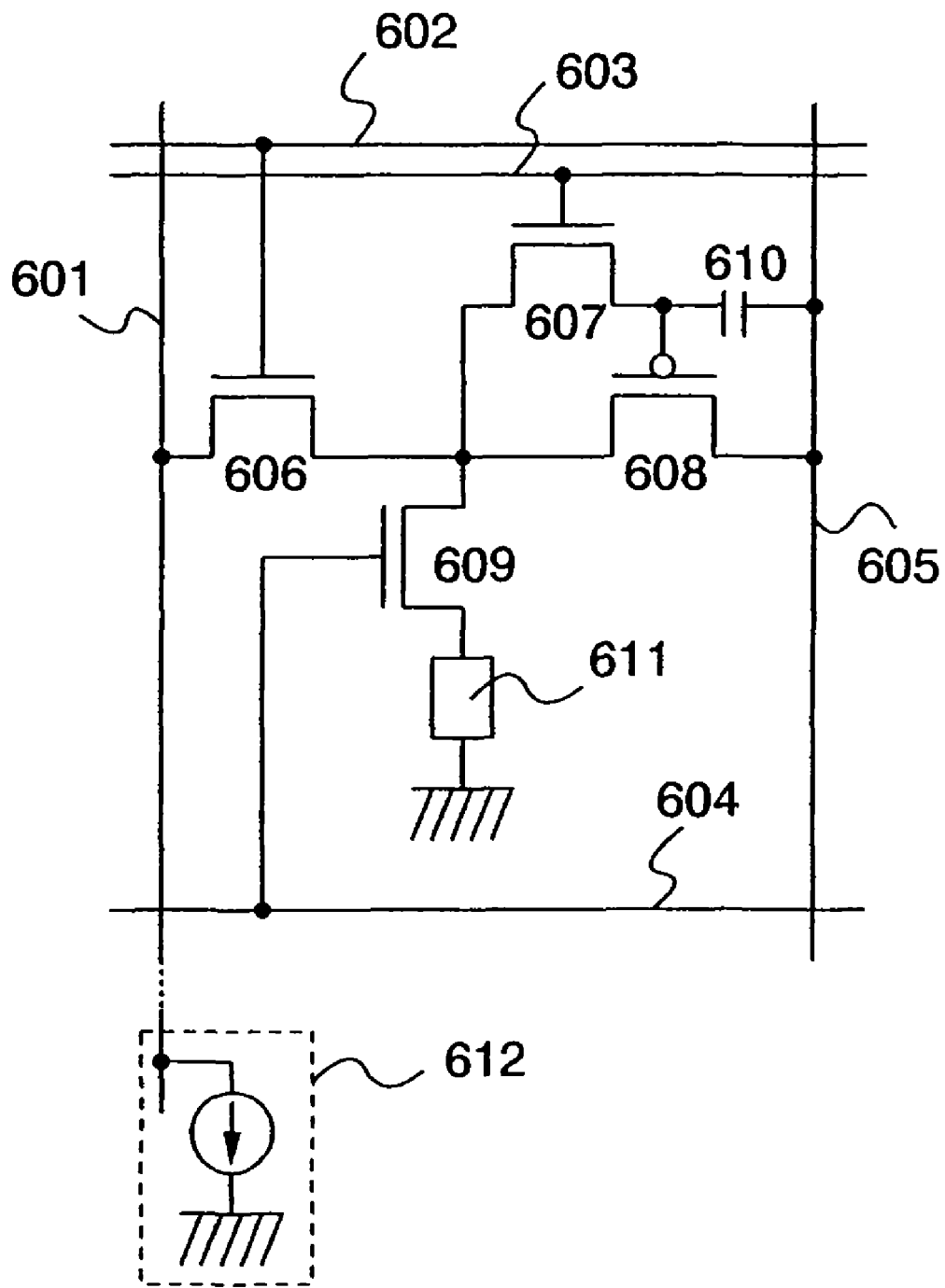
FIG. 6 is a diagram showing a configuration of a conventional pixel.

Note that a gate terminal and a drain terminal of the transistor 102 are connected to each other in FIG. 1, however, the invention is not limited to this. FIG. 1 shows a connection in which a current supplied from the current source 101 flows to the transistor 102 and a signal is written. Therefore, as shown in FIG. 2, switches 202 to 204 are disposed between the gate terminal and the drain terminal of the transistor 102, between the drain terminal of the transistor 102 and the wiring 107, and the like or a load 201 and the like such as a signal line and a light emitting element are disposed in some cases. Further, as shown in FIG. 3, a transistor 302 which forms a current mirror circuit with the transistor 102 is disposed in some cases. Further, as shown in FIGS. 4 and 5, the load 201 is connected to the wiring 107 in some cases. Further, as shown in FIG. 5, switches 501 and 502 are connected to the wiring 107 in some cases. In this manner, various configurations can be employed.

Note that the load 201 in FIG. 2 may be anything. It may be an element such as a resistor, a transistor, an EL element, other light emitting elements, or a current source circuit formed by a transistor, a capacitor, a switch and the like. It may be a signal line or a signal line and a pixel connected to it. The pixel may include any kind of display element such as an EL element or an element used in an FED.

A precharge circuit 111 is connected to the wiring 107. The precharge circuit 111 is formed of a precharge switch 112, a comparison control circuit 114 and the like.

Next, an operation of a circuit of FIG. 1 is described. First, a current is supplied from the current source 101 to the transistor 102. A potential of the wiring 107 at that time is supplied to a first input terminal 116 of the comparison control circuit 114. On the other hand, a predetermined potential is supplied to a wiring 118 of the comparison control circuit 114. A potential of the wiring 118 is preferably the same as a potential of the wiring 107 in the steady state obtained by supplying a current from the current source 101 to the transistor 102.

The comparison control circuit 114 compares a potential of the first input terminal 116 and a potential of the second input terminal 117 and controls the precharge switch 112 from an output terminal 115. That is, provided that the potential of the first input terminal 116 and the potential of the second input terminal 117 have a larger difference than a predetermined level, a charge is supplied from a wiring 113 to the wiring 107 by turning ON the precharge switch 112. When the difference between the potential of the first input terminal 116 and the potential of the second input terminal 117 is smaller than a predetermined level, the supply of charge from the wiring 113 to the wiring 107 is stopped by turning OFF the precharge switch 112. Then, a current is supplied to the transistor 102 only from the current source 101.

In this manner, a precharge operation is performed to the wiring 107 by turning ON the precharge switch 112. Note that a period in which the precharge switch 112 is ON and a timing at which it is turned OFF are controlled while the comparison control circuit 114 detects the potential of the wiring 107. Therefore, the period in which a precharge is performed can be controlled appropriately. Further, when the precharge switch 112 is turned ON, the potential of the wiring 107 approaches the potential of the wiring 113 rapidly. This is because the potential of the wiring 107 when the precharge switch 112 is turned OFF and the potential of the wiring 113 are not necessarily equal to each other. Therefore, the potential of the wiring 107 can approach the potential of the wiring 113 in a shorter period than a time constant. Then, when the potential of the wiring 107 approaches the potential of the wiring 113 sufficiently, the precharge switch 112 is turned OFF by the comparison control circuit 114, thereby the supply of charge from the wiring 113 to the wiring 107 is stopped.

Figure 8A:
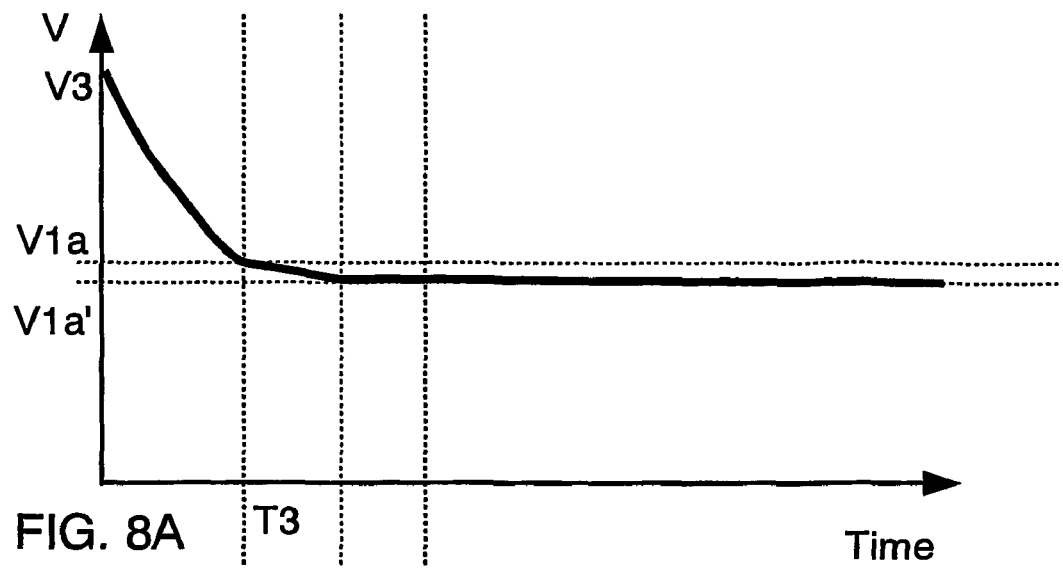
FIGS. 8A to 8C are diagrams each showing a change over time of a potential of a semiconductor device of the invention.
Figure 8B:
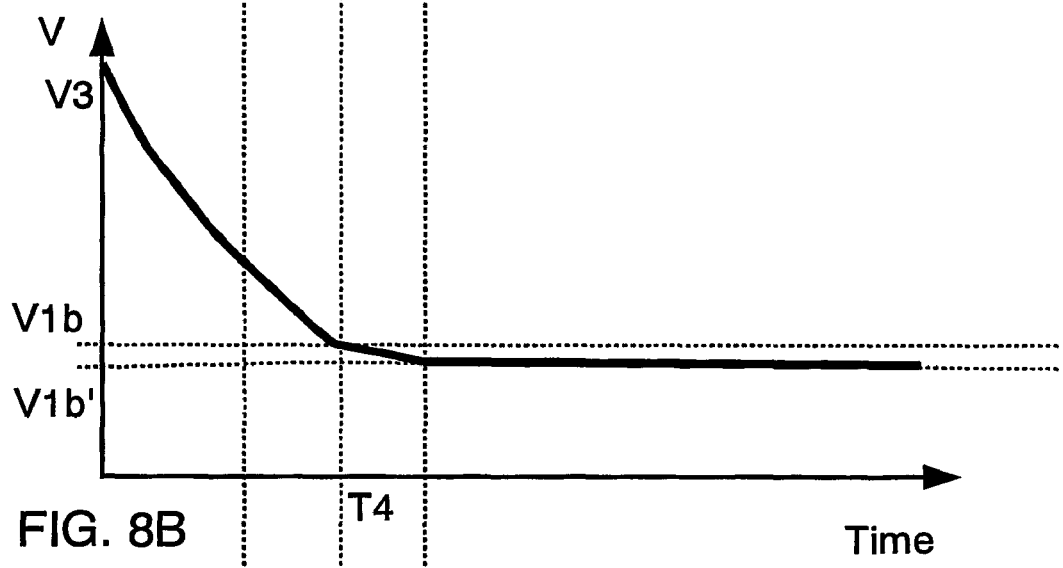
Figure 8C:
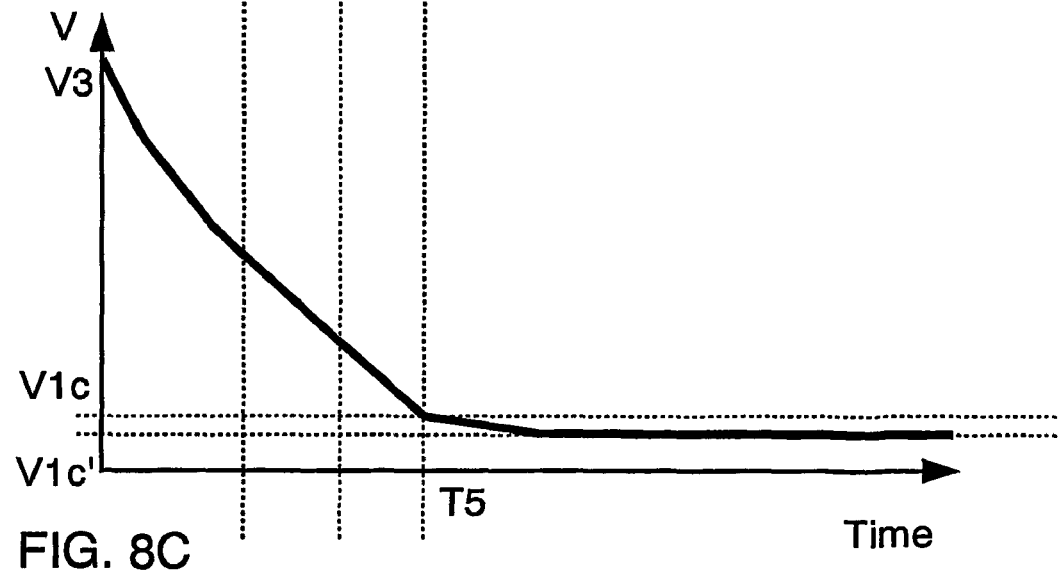

FIG. 8 shows a graph showing a change over time of the potential of the wiring 107 in this case. It is assumed that an initial potential of the wiring 107 is V3. It is also assumed that the potential of the wiring 107 in the steady state obtained by supplying a current from the current source 101 is $V1a'$ in the case of FIG. 8A, $V1b'$ in the case of FIG. 8B, and $V1c'$ in the case of FIG. 8C. Further, it is assumed that $V3>V1a'>V1b'>V1c'$ is satisfied. It is also assumed that the potential of the wiring 118 is $V1a$ in the case of FIG. 8A, $V1b$ in the case of FIG. 8B, and $V1c$ in the case of FIG. 8C. Further, the potential of the wiring 113 is only required to be a potential lower than $V1c'$. For example, it may be equal to the potential of the wiring 105.

Alternatively, it may be 0 V or a negative power source voltage as long as it is lower than $V1c'$. In this case, the steady state is obtained with a voltage lower than the initial voltage V3, therefore, the potential of the wiring 113 is preferably as low as possible. As a result, the potential of the wiring 107 can approach the potential of the wiring 113 in a shorter period than the time constant. Therefore, a time required for charging the potential of the wiring 107 to be $V1a'$, $V1b'$, $V1c'$ and the like can be shortened. That is, a rapid precharge can be performed.

In the case of FIG. 8A, the precharge switch 112 is ON up to the time T3 and the potential of the wiring 107 rapidly changes. In the time T3, the potential of the wiring 107 becomes equal to the potential V1a of the wiring 118 and the precharge switch 112 is turned OFF. Then, only a current from the current source 101 flows to the transistor 102 and the potential of the wiring 107 becomes V1a' in a time T4, thus the steady state is obtained.

In the case of FIG. 8B, the potential of the wiring 107 and the potential of the wiring 118 become equal to each other in the time T4, thereby the precharge switch 112 is turned OFF. That is, the precharge is performed up to the time T4. After that, only a current from the current source 101 flows to the transistor 102 and the potential of the wiring 107 becomes V1b' in a time T5, thus the steady state is obtained.

In the case of FIG. 8C, the potential of the wiring 107 and the potential of the wiring 118 become equal to each other in the time T5, thereby the precharge switch 112 is turned OFF. That is, the precharge is performed up to the time T5. After that, only a current from the current source 101 flows to the transistor 102, thus the steady state is obtained.

In this manner, as is clear from FIGS. 8A to 8C, the precharge switch 112 is turned ON for an optimal period decided by a difference between the initial potential and the potential obtained in the steady state, thus the precharge is performed. As the precharge is performed without wasting time, a current is supplied from the current source 101 to the transistor 102 taking a sufficient time to reduce an effect of variations of the transistor 102.

Note that by performing the set operation by supplying a current from the current source 101 to the transistor 102, even when the current characteristics of the transistors 102 vary, the variations can be compensated and the transistor 102 can supply a predetermined amount of current. Therefore, the steady state is required to be obtained by supplying a current from the current source 101 to the transistor 102. That is, the write of a signal is required to be completed. When the current supply from the current source 101 to the transistor 102 stops before completing the write of a signal, the variations in current characteristics of the transistor 102 cannot be compensated. Therefore, in the period for performing the set operation by supplying a current from the current source 101 to the transistor 102 is preferably sufficiently long in order to complete the write of a signal.

Figure 9:
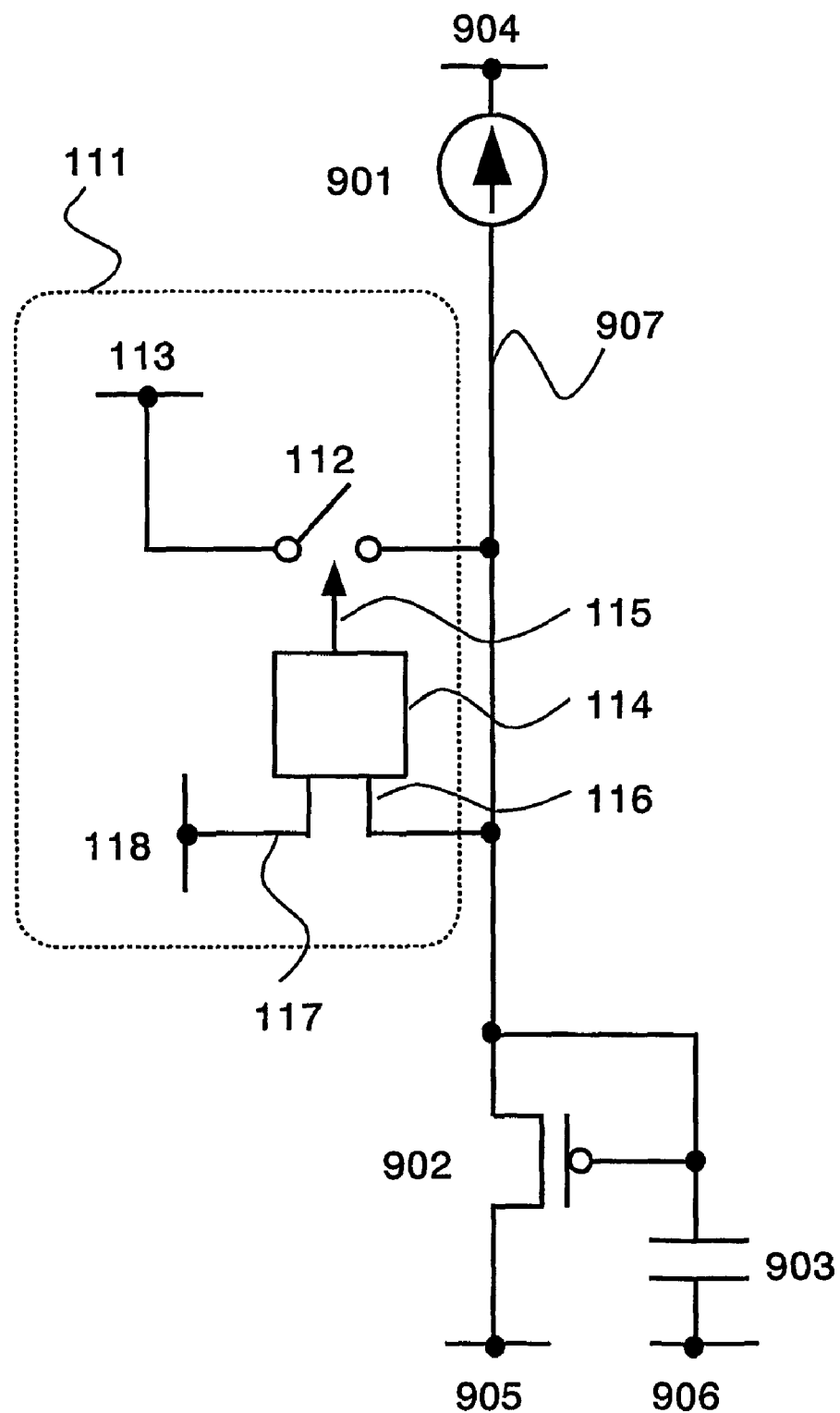
FIG. 9 is a diagram showing a configuration of a semiconductor device of the invention.

Note that FIG. 1 describes the case where a current flows from the current source 101 to the transistor 102 and the transistor 102 is an N-channel type, however, the invention is not limited to this. As shown in FIG. 9, polarity of a transistor 902 can be changed to a P-channel type easily by inverting a direction of current flow. Further, the transistor 902 is connected to a wiring 907, a capacitor 903, and a wiring 905. Further, a wiring 907 is connected to a current source 901 which is connected to a wiring 904. Moreover, the capacitor 903 is connected to a wiring 906.

Figure 10:
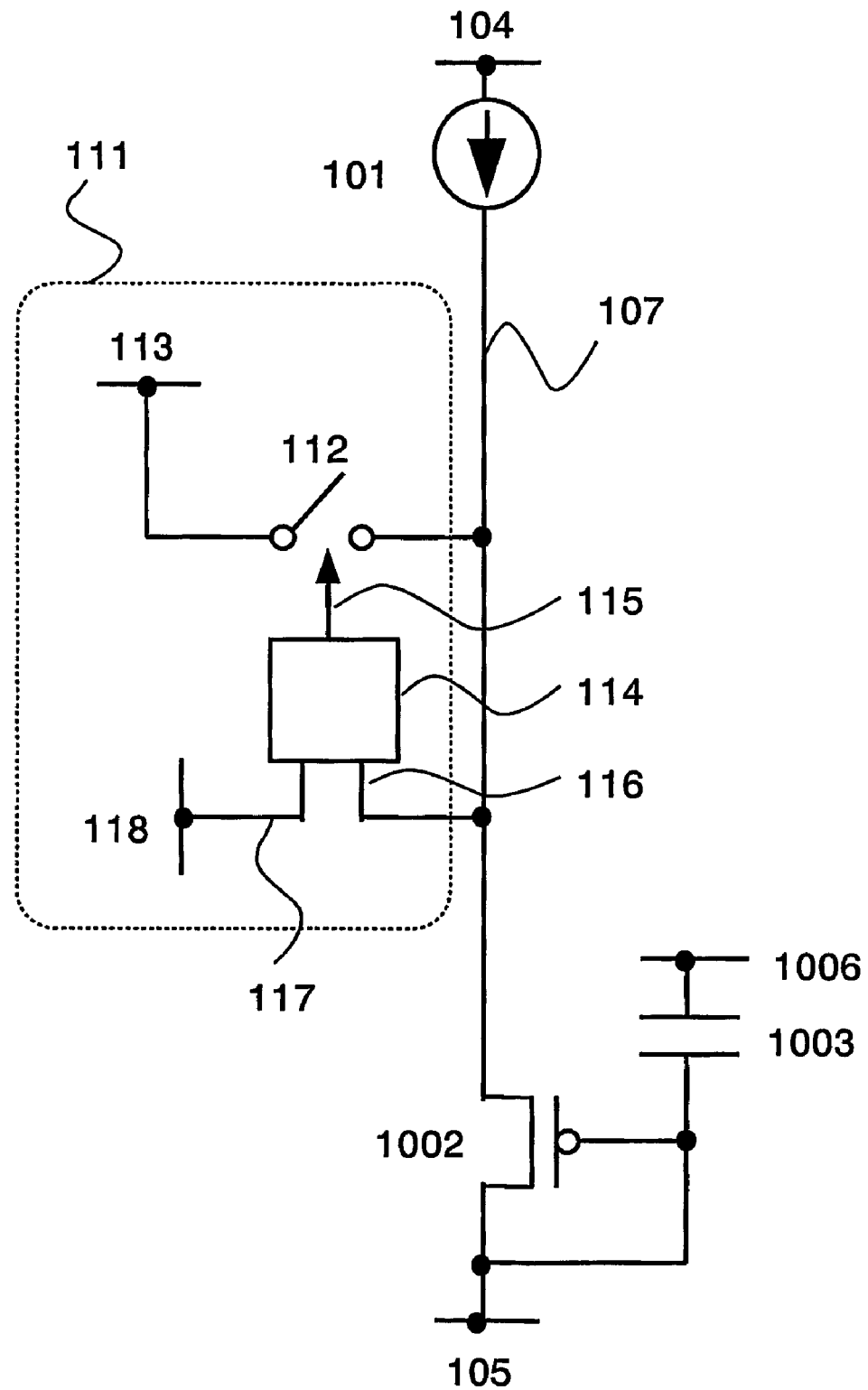
FIG. 10 is a diagram showing a configuration of a semiconductor device of the invention.
Figure 11:
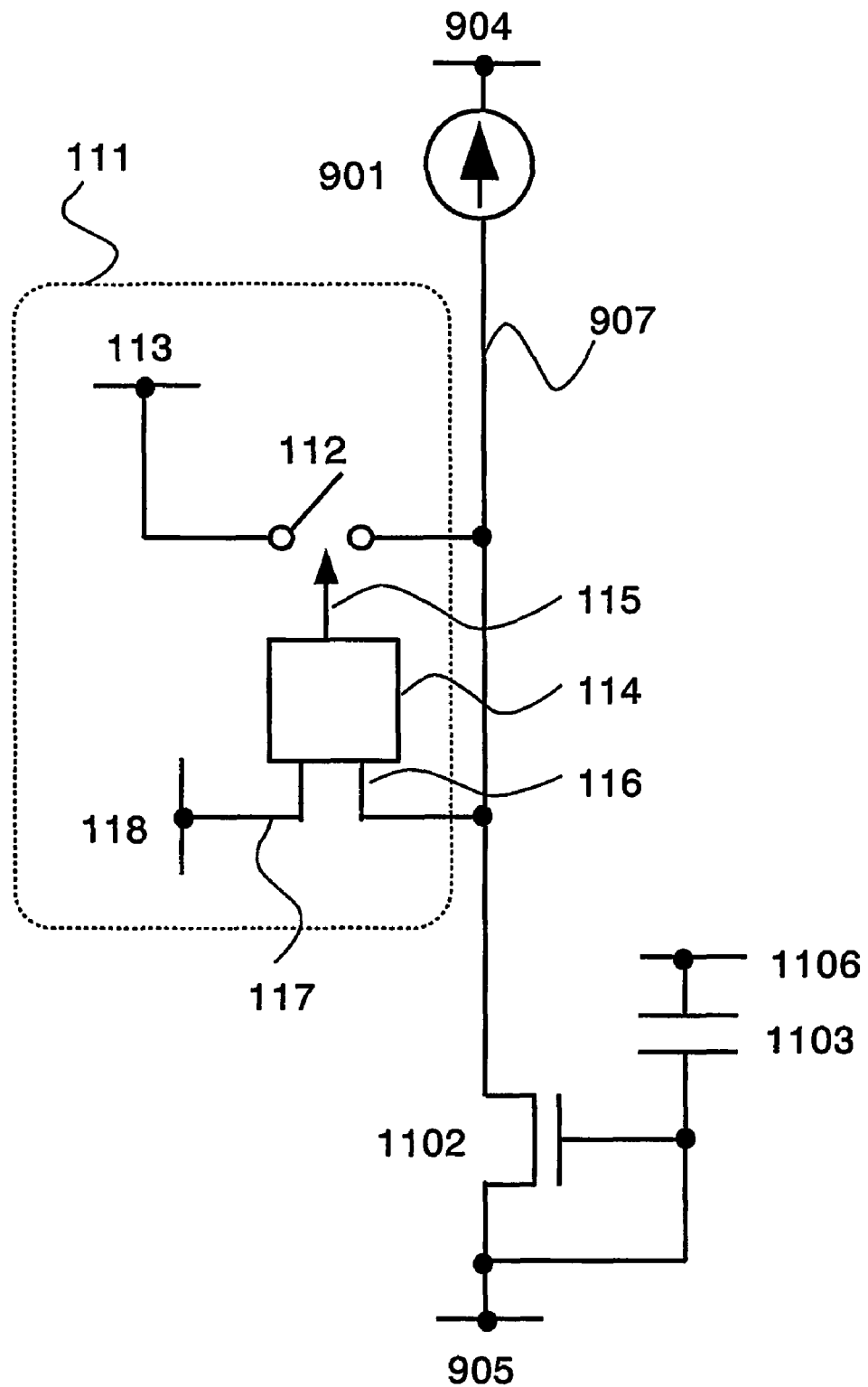
FIG. 11 is a diagram showing a configuration of a semiconductor device of the invention.

Note that in the case where a current flows from the current source 101 to the transistor 102 and the transistor 102 is changed to a P-channel type, a configuration shown in FIG. 10 may be employed. At this time, in order to alleviate an effect of a change of a source potential of a transistor 1002, a wiring 1006 is preferably connected to a source terminal of the transistor 1002. Further, a capacitor 1003 may be provided between the wiring 1006 and the transistor 1002. In the case of changing polarity of the transistor in FIG. 9 also, it is preferable as shown in FIG. 11 that a transistor 1102 be connected to the wiring 907, the wiring 905, the capacitor 1103, and a wiring 1106.

Figure 12:
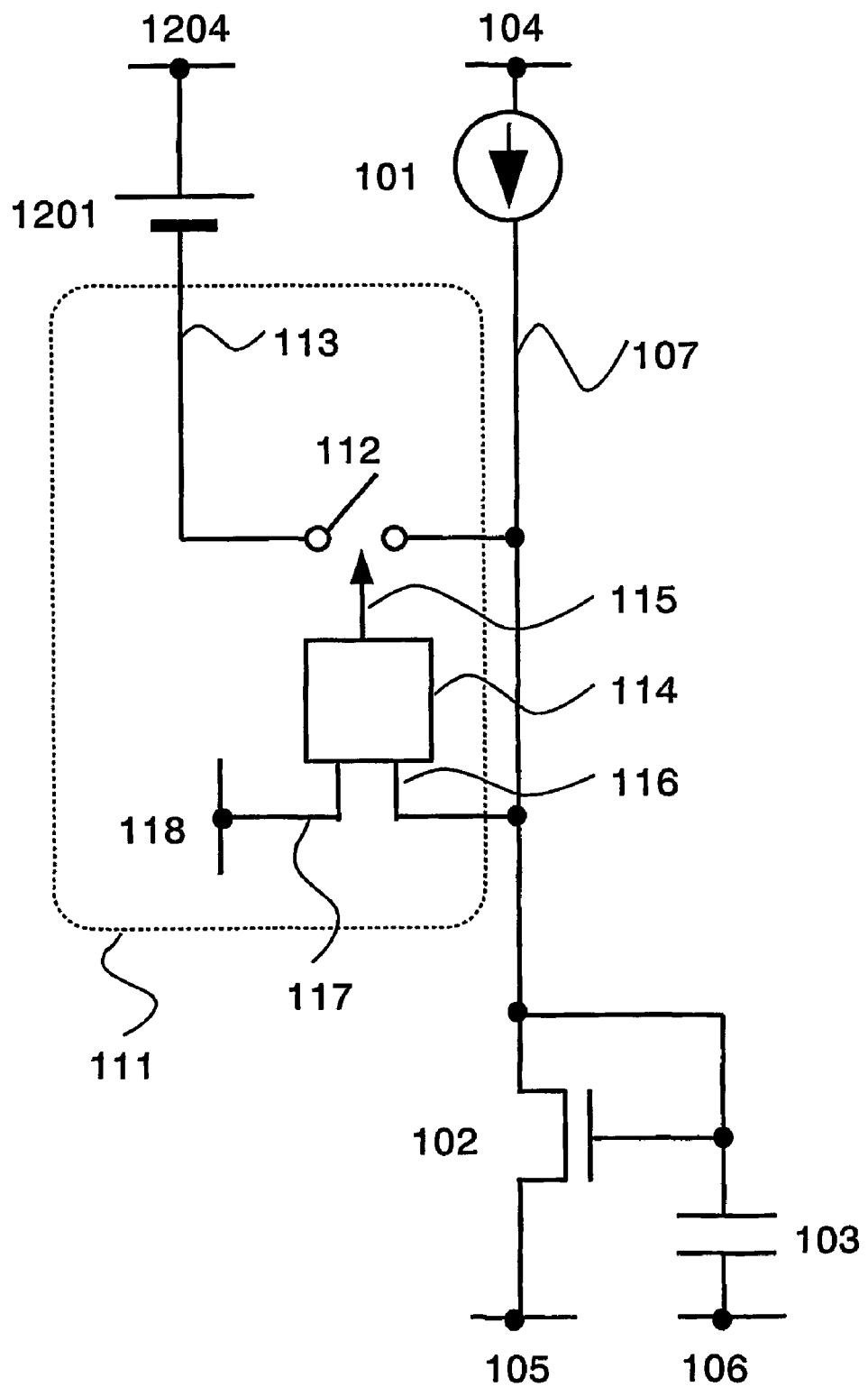
FIG. 12 is a diagram showing a configuration of a semiconductor device of the invention.
Figure 13:
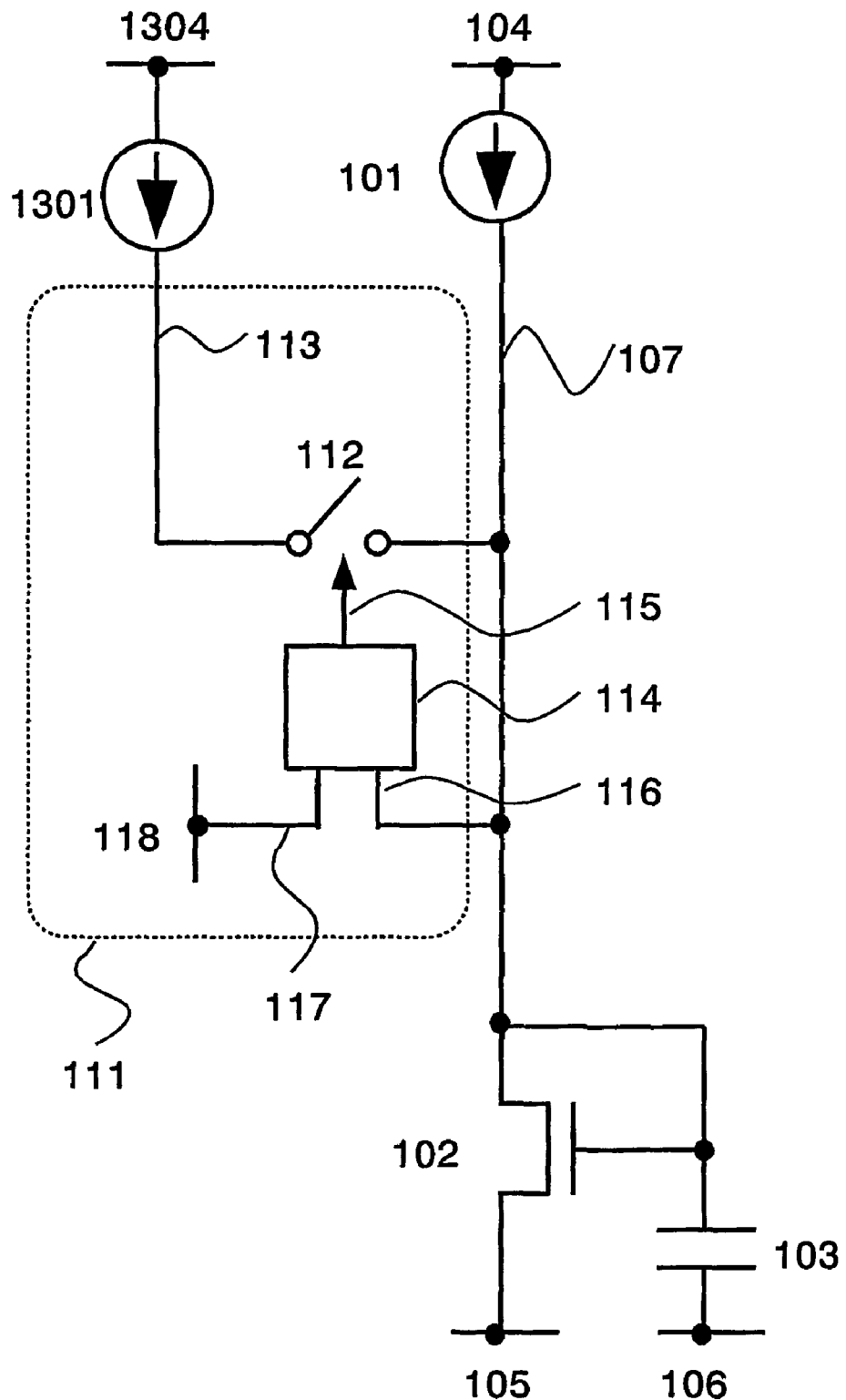
FIG. 13 is a diagram showing a configuration of a semiconductor device of the invention.

Further, a wiring 113 may be connected to a voltage source 1201 and a wiring 1204 as shown in FIG. 12 and may be connected to a current source 1301 and a wiring 1304 as shown in FIG. 13 as well. Alternatively, it may be connected to a wiring 104, a wiring 105 and the like. Otherwise, it may be connected to an operational amplifier or a transistor having a high current supply capacity (for example, a bipolar transistor and the like). That is, the precharge is performed while detecting the potential of the wiring 107 by using the comparison control circuit 114, therefore, it is only required to be capable of supplying a sufficiently large charge.

Note that another precharge operation may be combined as well as the precharge described in FIG. 1. Various precharge techniques are applied and disclosed in Japanese Patent Application No. 2003-019240, Japanese Patent Application No. 2003-055018, Japanese Patent Application No. 2003-131824 and the like, of which contents can be combined with the invention.

That is, the potential of the wiring 107 is detected by a comparison control circuit 2014. Switches 1912a, 1912b, a power source line and the like are disposed in a circuit 2013. A potential detection result obtained by using the comparison control circuit 2014 is inputted to a terminal 2021. Accordingly, the switches 1912a and 1912b disposed in the circuit 2013 are controlled. Then, a predetermined voltage is supplied from a terminal 2020.

Note that the switches shown in FIG. 1 and the like may be any switches such as an electrical switch or a mechanical switch. It may be anything as far as it can control a current. It may be a transistor, a diode, or a logic circuit configured with them. Therefore, in the case of applying a transistor as a switch, polarity thereof (conductivity) is not particularly limited because it operates just as a switch. However, when an off current is preferred to be small, a transistor of polarity with a small off current is favorably used. For example, the transistor which provides an LDD region has a small off current. Further, it is desirable that an N-channel transistor is employed when a potential of a source terminal of the transistor as a switch is closer to the power source potential on the low potential side (Vss, Vgnd, 0 V and the like), and a P-channel transistor is desirably employed when the potential of the source terminal is closer to the power source potential on the high potential side (Vdd and the like). This helps the switch operate efficiently as the absolute value of the gate-source voltage of the transistor can be increased. It is also to be noted that a CMOS type switch can also be applied by using both N-channel and P-channel transistors.

Embodiment Mode 2

FIG. 8 shows the case where the initial potential of the wiring 107 is higher than a potential obtained in the steady state as the most typical case. However, the initial potential of the wiring 107 is practically lower than the potential in the steady state in some cases. Now, the case of performing a precharge regardless of high and low of the initial potential is described.

Figure 14:
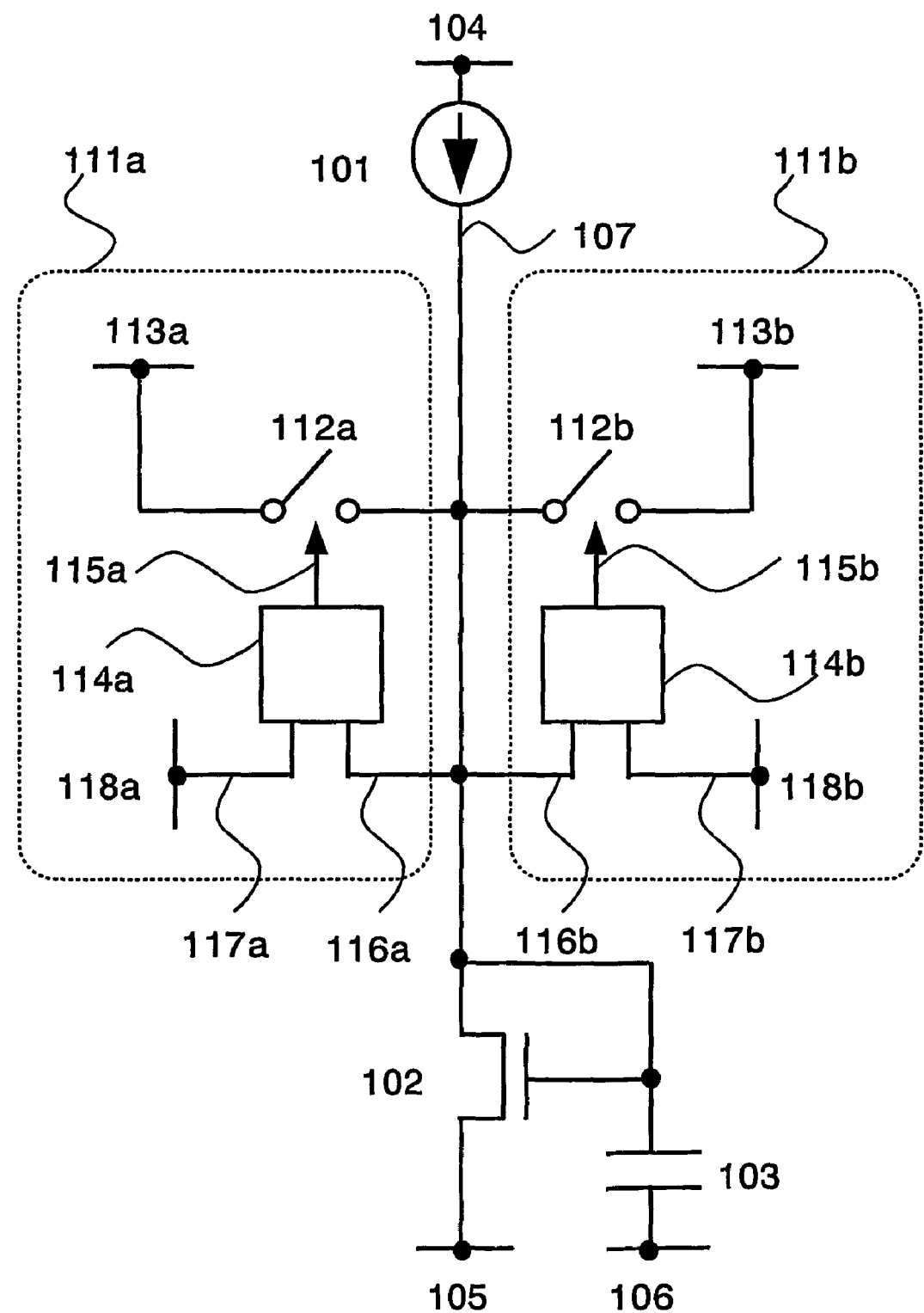
FIG. 14 is a diagram showing a configuration of a semiconductor device of the invention.

First, FIG. 14 shows the case of disposing a plurality of precharge circuits 111a and 111b as a configuration example. It is assumed that a potential of a wiring 113a is higher than a potential of a wiring 113b. Therefore, the wiring 113a may be connected to a wiring 104 while the wiring 113b may be connected to a wiring 105.

In the case where the potential of the wiring 107 is lower, the precharge switch 112a is turned ON and a charge is supplied from the wiring 113a, thereby the potential of the wiring 107 rises rapidly. Otherwise, in the case where the potential of the wiring 107 is higher, the precharge switch 112b is turned ON and a charge is supplied from the wiring 113b, thereby the potential of the wiring 107 falls rapidly.

Thus, a precharge can be performed. Note that output terminals 115a and 115b control the precharge switches 112a and 112b respectively.

Figure 15:
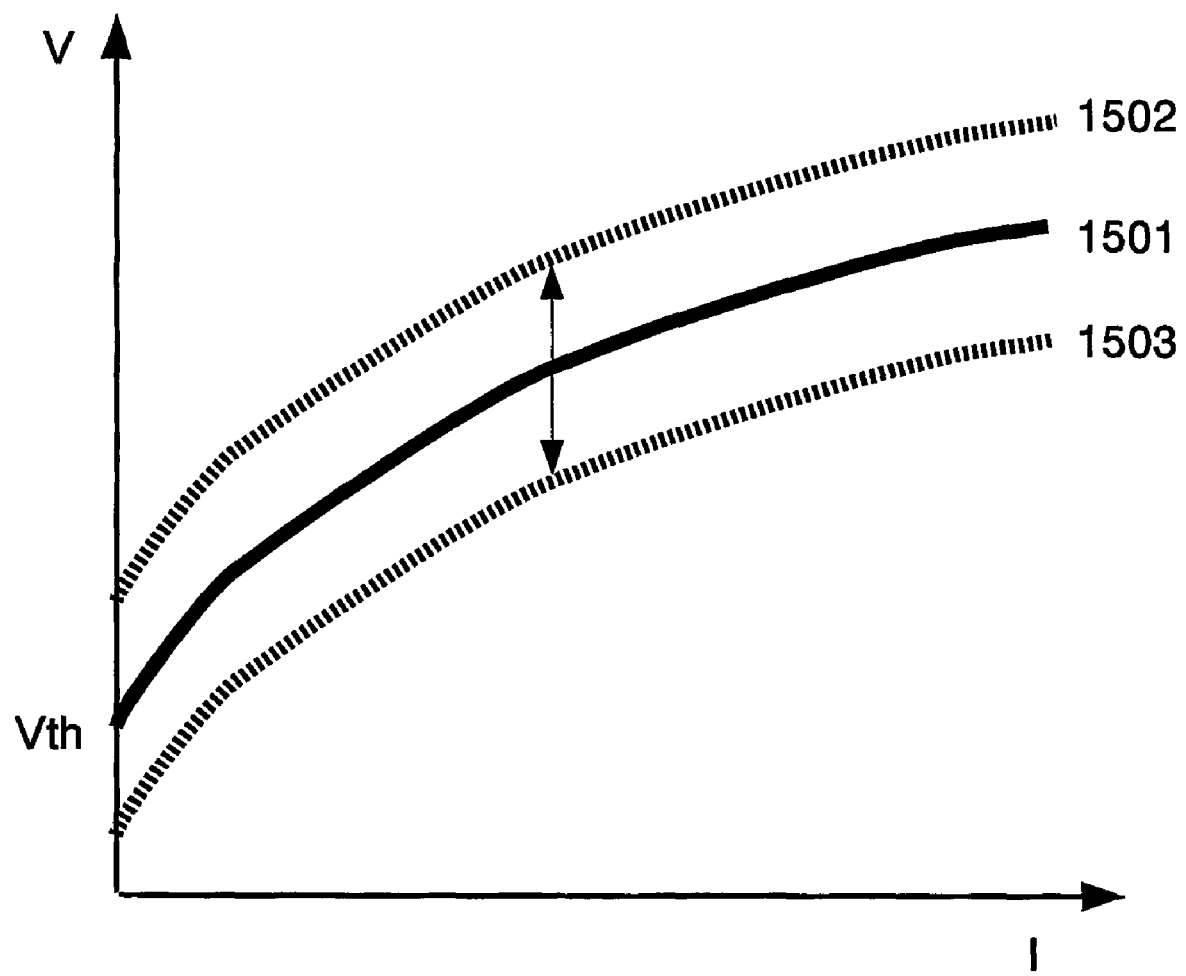
FIG. 15 is a diagram showing a relationship of a current and a potential of a semiconductor device of the invention.

It is now assumed that a comparison control circuit 114a turns OFF the precharge switch 112a when the potential of the first input terminal 116a becomes equal to or higher than the potential of the second input terminal 117a while the comparison control circuit 114b turns OFF the precharge switch 112b when the potential of the first input terminal 116b becomes equal or lower than the potential of the second input terminal 117b. FIG. 15 shows a graph of the potentials of the second input terminal 117a and the second input terminal 117b. The abscissa represents an amount of a current supplied from the current source 101 while the ordinate represents the potentials of the second input terminal 117a and the second input terminal 117b. The second input terminal 117a corresponds to a graph 1503 while the second input terminal 117b corresponds to a graph 1502. The potential of the wiring 107 in the steady state is as shown by a graph 1501. That is, in the case where the potential of the wiring 107 has a value between the graph 1502 and the graph 1503, the precharge switches 112a and 112b are both turned OFF. In the case where the potential of the wiring 107 is lower than the potential of the graph 1503, the precharge switch 112a is turned ON and the potential rises rapidly. In the case where the potential of the wiring 107 is higher than the potential of the graph 1502, the precharge switch 112b is turned ON and the potential falls rapidly. Then, when the potential of the wiring 107 has a value between the graph 1502 and the graph 1503, the precharge switches 112a and 112b are both turned OFF, thereby a current is supplied only from the current source 101 and the current setting is performed.

Provided that both the precharge switches 112a and 112b are not turned OFF no matter how long time passes, it is impossible to supply only the current from the current source 101 to the transistor 102. It ends in performing the precharge constantly, which makes it impossible to compensate the variations in current characteristics of the transistor 102. Therefore, it is required that the precharge not be performed when the potential of the wiring 107 becomes approximately equal to the potential in the steady state.

Therefore, in the case of the configuration of FIG. 14, the potentials of the wirings 118a and 118b are required to be controlled as shown in FIG. 15. Alternatively, the comparison control circuits 114a and 114b are each controlled and the precharge switches 112a and 112b both may be turned OFF when the potential of the wiring 107 becomes approximately equal to the potential in the steady state.

In FIG. 15, the widths of the graphs 1502 and 1503 may be determined in consideration of the variations in the current characteristics of the transistor 102.

Figure 16:
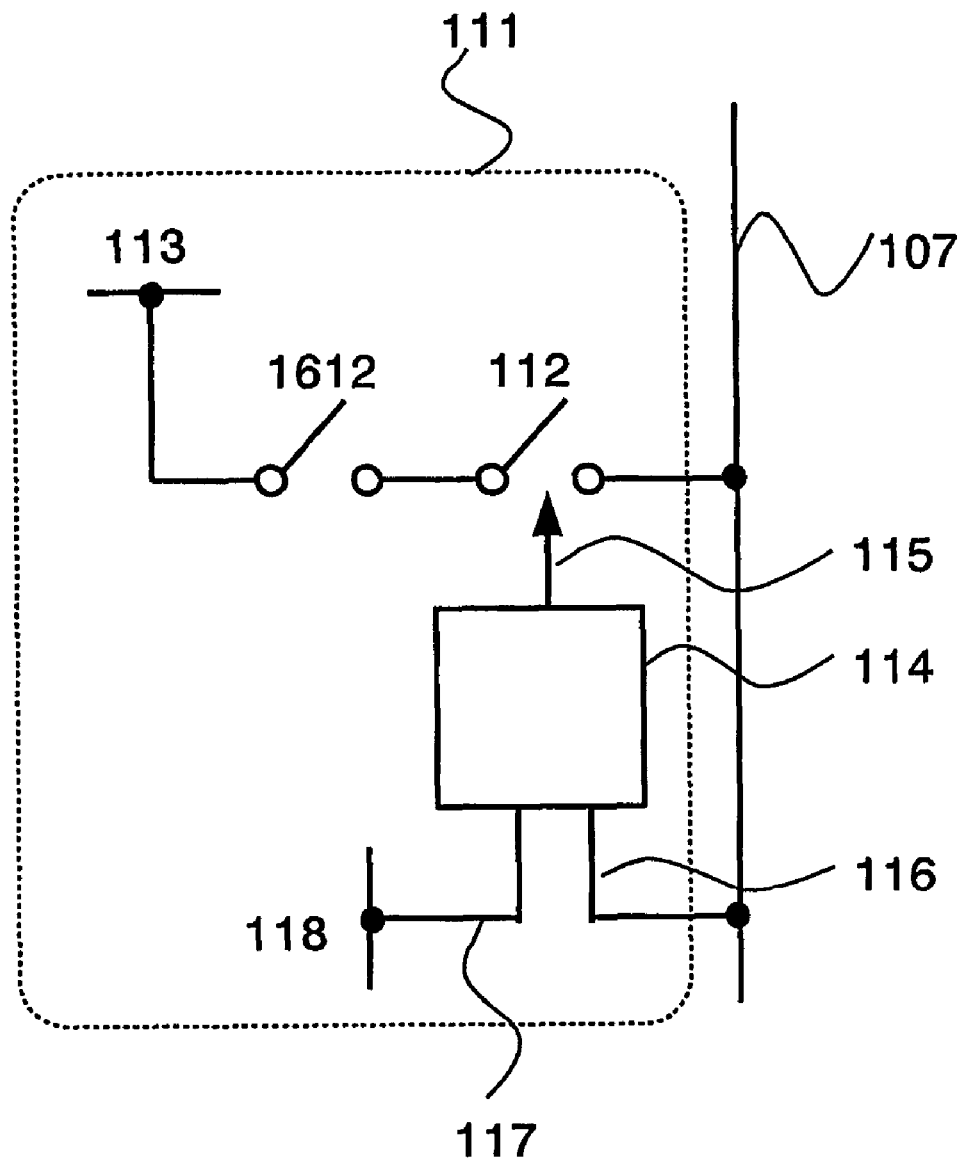
FIG. 16 is a diagram showing a configuration of a semiconductor device of the invention.
Figure 17:
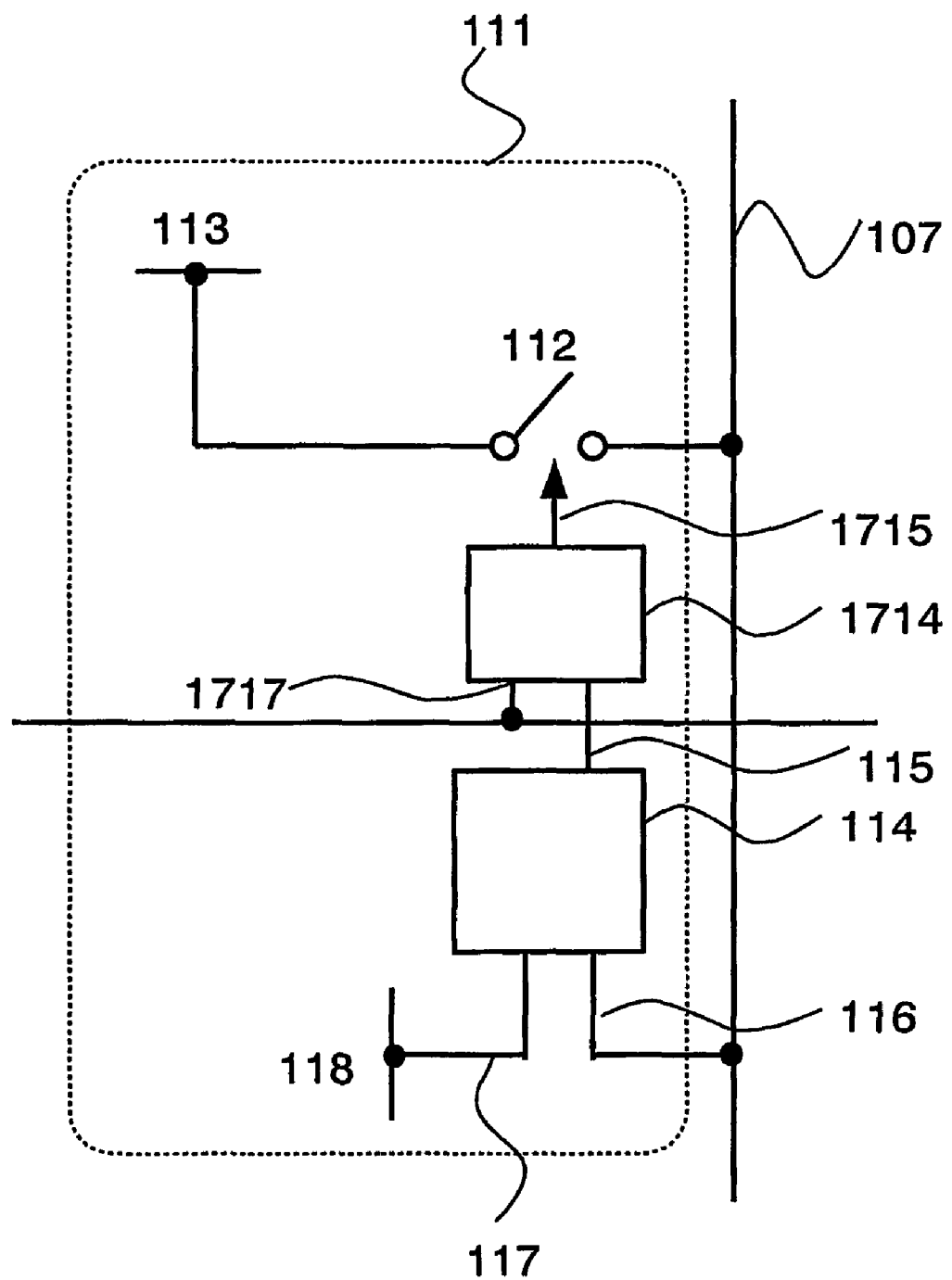
FIG. 17 is a diagram showing a configuration of a semiconductor device of the invention.

Furthermore, the precharge may be stopped forcibly after a while. For example, the precharge may be forcibly stopped by providing a switch 1612 in series with the precharge switch 112 as shown in FIG. 16. Alternatively, the precharge switch 112 may be controlled from an output terminal 1715 by inputting an output of the comparison control circuit 114 to a control circuit 1714 and combining it with a signal inputted to an input terminal 1717 for control. In this case, the precharge may be forcibly stopped by using the signal inputted to the input terminal 1717 for control.

Figure 18:
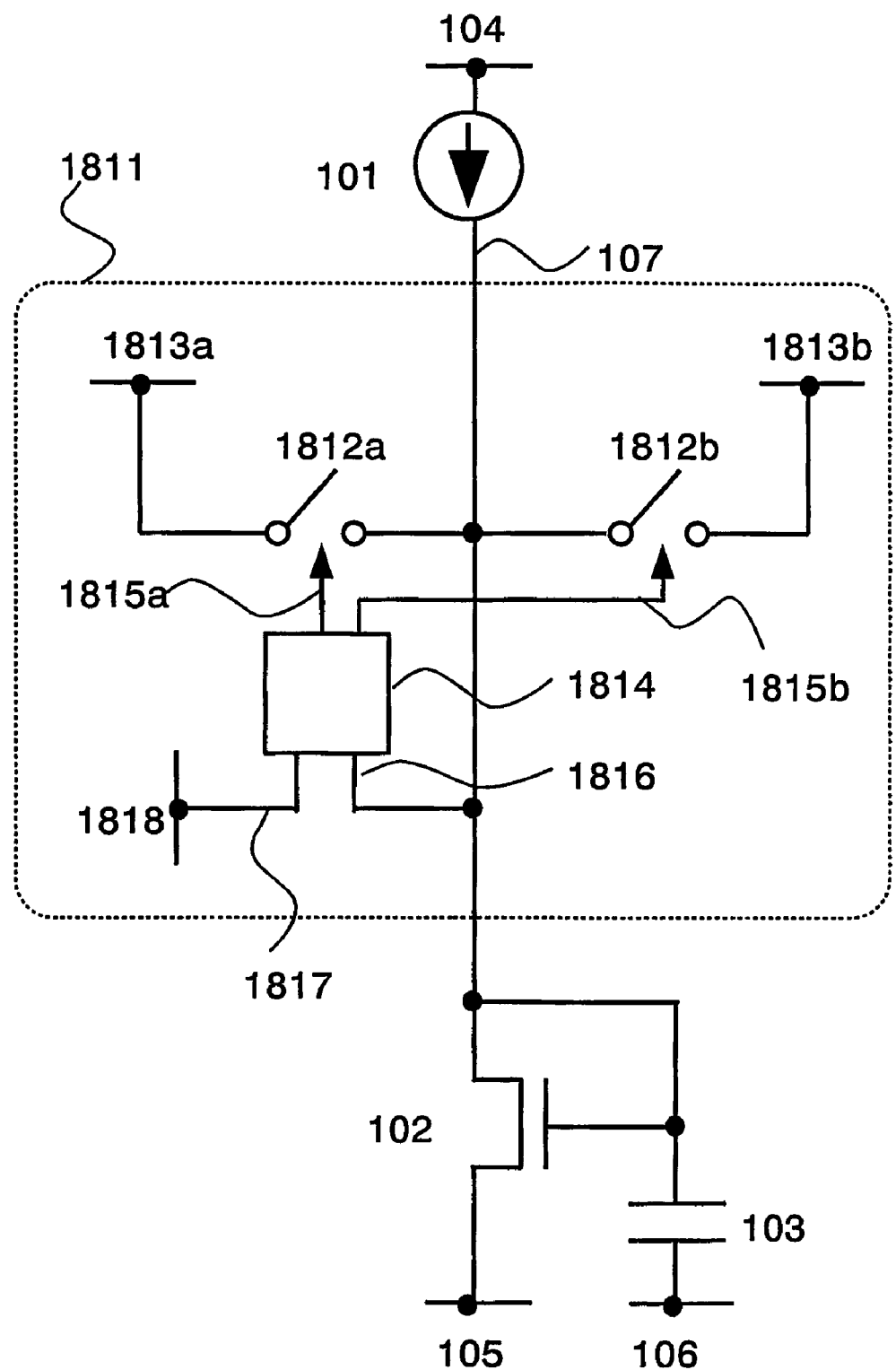
FIG. 18 is a diagram showing a configuration of a semiconductor device of the invention.

Next, FIG. 18 shows another configuration example. It is assumed that the potential of a wiring 1813a in a precharge circuit 1811 is higher than the potential of a wiring 1813b. In the case where the potential of the wiring 107 is low, a precharge switch 1812a is turned ON and a charge is supplied from the wiring 1813a, thus the potential of the wiring 107 rises rapidly. Otherwise, in the case where the potential of the wiring 107 is high, a precharge switch 1812b is turned ON and a charge is supplied from the wiring 1813b, thus the potential of the wiring 107 falls rapidly.

The comparison control circuit 1814 includes input terminals 1816 and 1817, a first output terminal 1815a and a second output terminal 1815b, each of which controls the precharge switches 1812a and 1812b. A wiring 1818 is supplied with a potential approximately equal to the potential of the wiring 107 in the steady state. The comparison control circuit 1814 controls the precharge switches 1812 and 1812b so that either of them is turned ON or both of them are turned OFF according to the potential of the wiring 107. That is, the comparison control circuit 1814 controls so that the precharge switch 1812a is turned ON in the case where the potential of the wiring 107 is lower than the graph 1503, while the precharge switch 1812b is turned ON in the case where the potential of the wiring 107 is higher than the graph 1502 as shown in FIG. 15.

Figure 19:
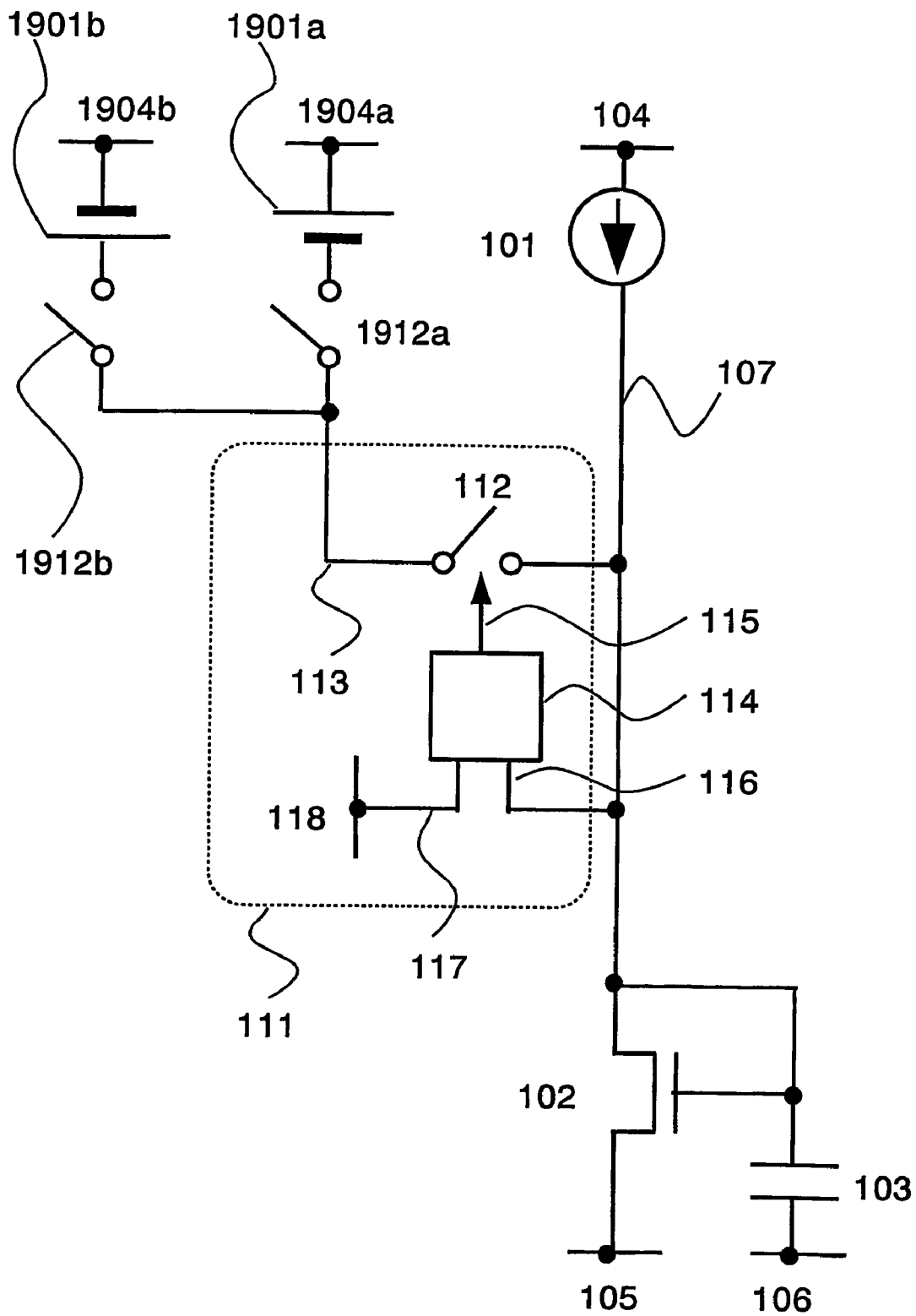
FIG. 19 is a diagram showing a configuration of a semiconductor device of the invention.

FIG. 19 shows another configuration. In the case of the configuration of FIG. 19, the wiring 107 is connected to a high potential through a switch 1912b and connected to a low potential through a switch 1912a. In the case where the potential of the wiring 107 is required to rise, the switch 1912b is turned ON while in the case where the potential of the wiring 107 is required to fall, the switch 1912a is turned ON. Thus, a precharge can be performed regardless of high and low of the initial potential of the wiring 107.

Figure 20:
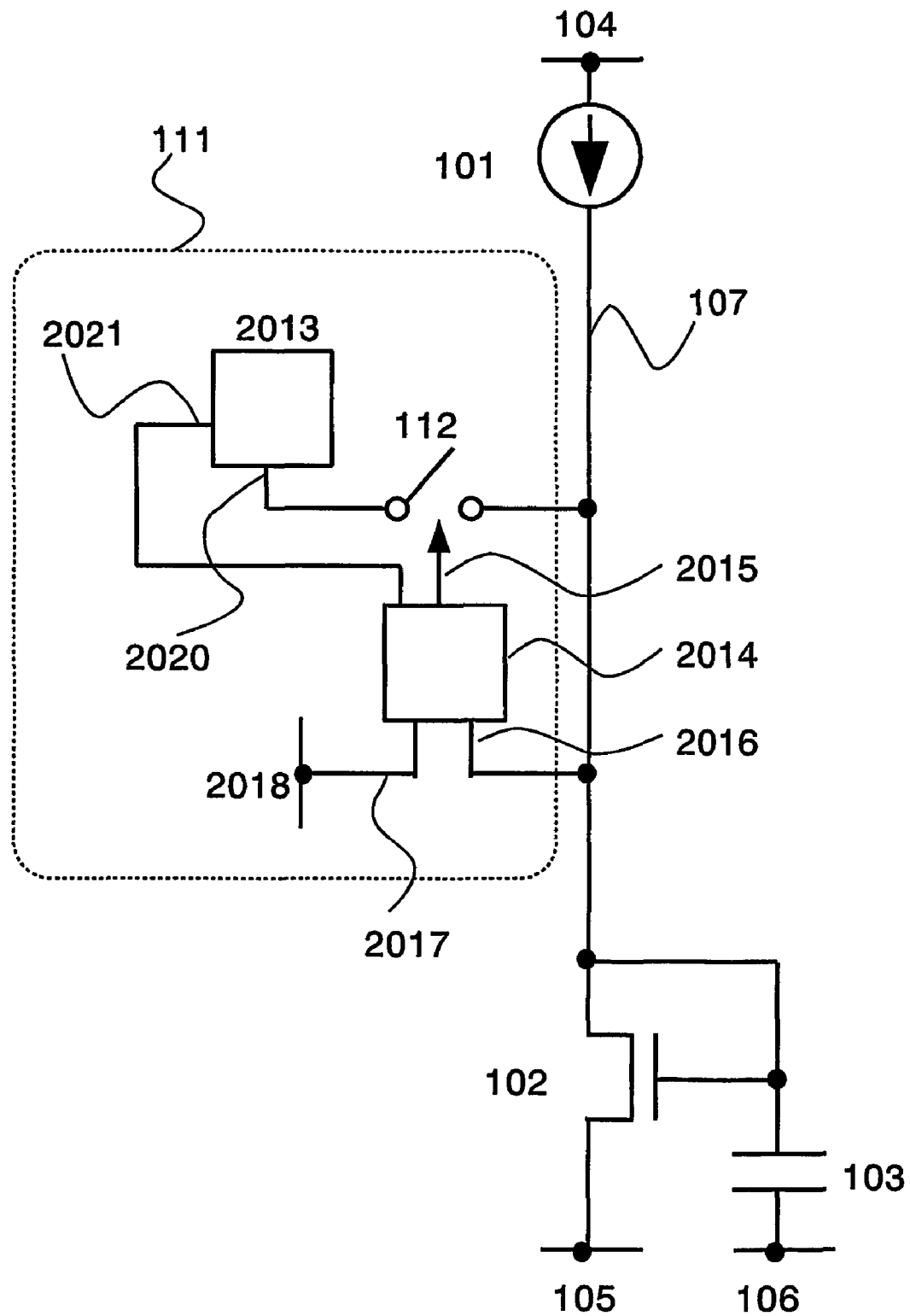
FIG. 20 is a diagram showing a configuration of a semiconductor device of the invention.

Note that the switches 1912a and 1912b are controlled similarly to the comparison control circuit in such a manner that the potential of the wiring 107 is detected and compared with a predetermined potential. The switches 1912a and 1912b are connected to voltage sources 1901a and 1901b respectively, to which wirings 1904a and 1904b are connected respectively. FIG. 20 shows a block diagram of this case.

That is, the potential of the wiring 107 is detected by a comparison control circuit 2014. The switches 1912a and 1912b, a power source line and the like are disposed in the circuit 2013. A potential detection result obtained by the comparison control circuit 2014 is inputted to a terminal 2021. Accordingly, the switches 1912a and 1912b disposed in the circuit 2013 are controlled. Then, a predetermined voltage is supplied from a terminal 2020. Note that the comparison control circuit 2014 is connected to input terminals 2016, 2017 and an output terminal 2015. The input terminal 2017 is connected to a wiring 2018.

Figure 21:
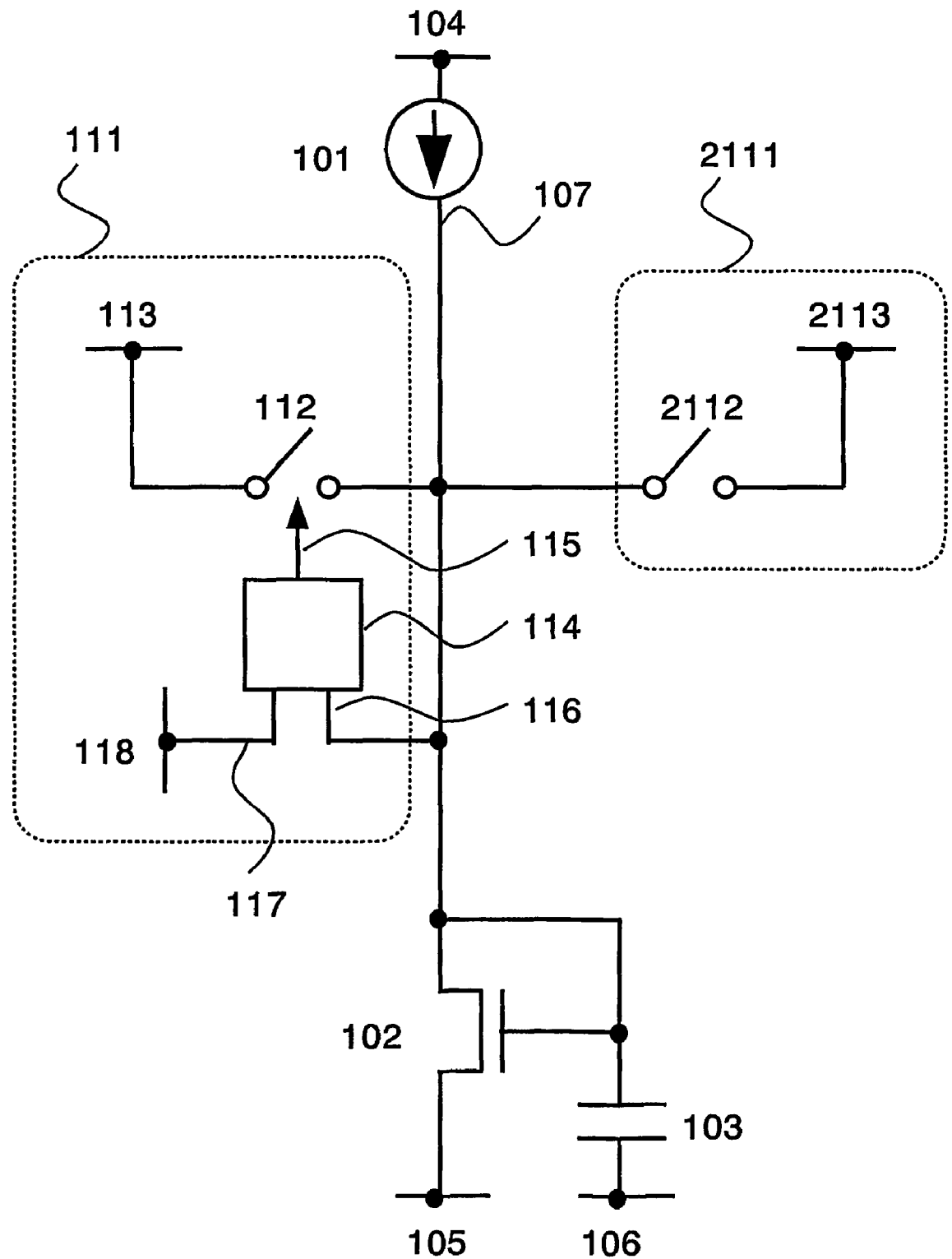
FIG. 21 is a diagram showing a configuration of a semiconductor device of the invention.

Next, another configuration example is described. FIG. 21 shows the case of initializing the potential of the wiring 107. First, a switch 2112 is turned ON and the potential of the wiring 107 is initialized to a potential of a wiring 2113. For example, the potential of the wiring 107 is raised. After that, a precharge is performed by controlling the precharge switch 112 by using the comparison control circuit 114 similarly to the case of FIG. 1.

In the case of FIG. 21, an operation may be performed assuming that there is only the case where the initial potential of the wiring 107 is higher (or lower) than the potential in the steady state. Note that the potential of the wiring 2113 is not limited to be raised. The operation may be performed after the potential is fallen.

Note that both the switch 2112 in a precharge circuit 2111 and the precharge switch 112 are preferably controlled not to be turned ON.

Note that the content described in this embodiment mode is the one which utilizes the configuration described in Embodiment Mode 1, however, the invention is not limited to this and various changes can be made as far as they do not change the gist of the invention. Therefore, the content described in Embodiment Mode 1 can be applied to this embodiment mode as well.

Embodiment Mode 3

Figure 22:
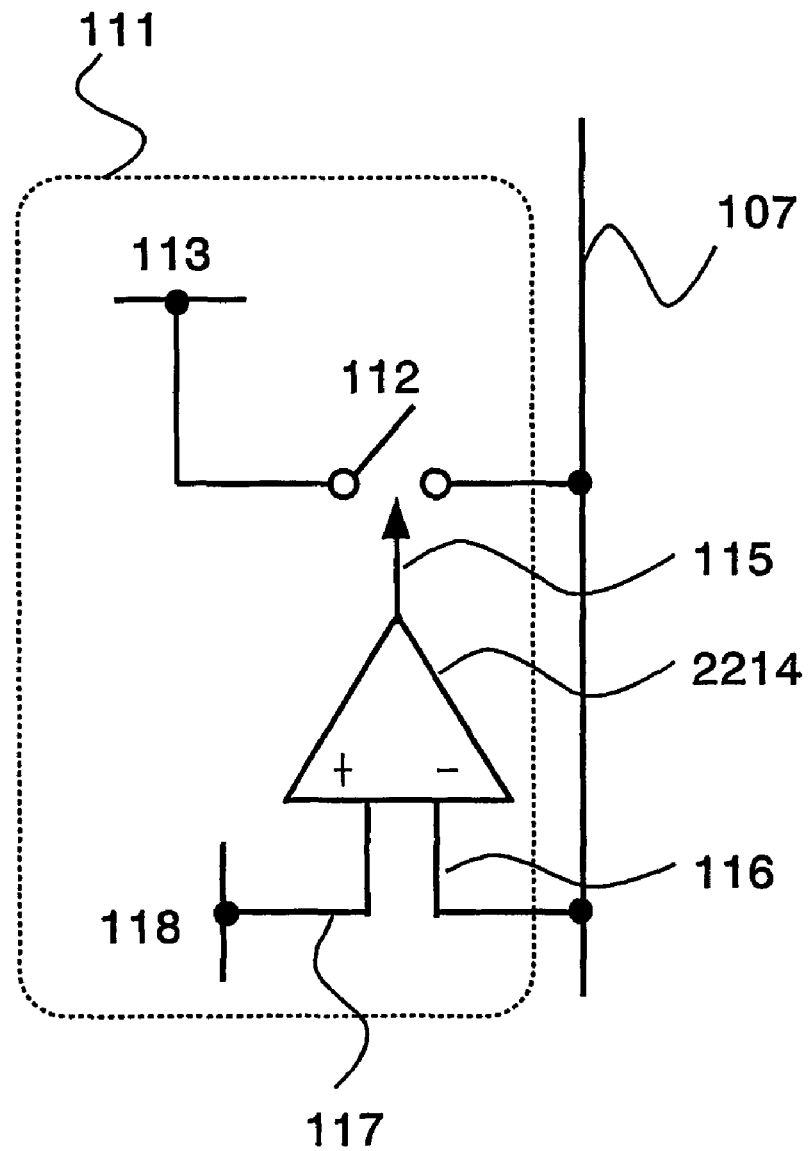
FIG. 22 is a diagram showing a configuration of a semiconductor device of the invention.

Next, a specific example of a comparison control circuit is described. First, FIG. 22 shows the case where a comparison control circuit is configured by using an operational amplifier 2214. In the case of FIG. 22, a non-inverting terminal is connected to the wiring 118 and an inverting terminal is connected to the wiring 107. Therefore, in the case where the potential of the wiring 107 is low, a potential of the output terminal 115 becomes high. In the case where a potential of the wiring 113 is high, a precharge may be performed when the potential of the wiring 107 is low. In that case, the switch 112 may be turned ON.

Figure 23:
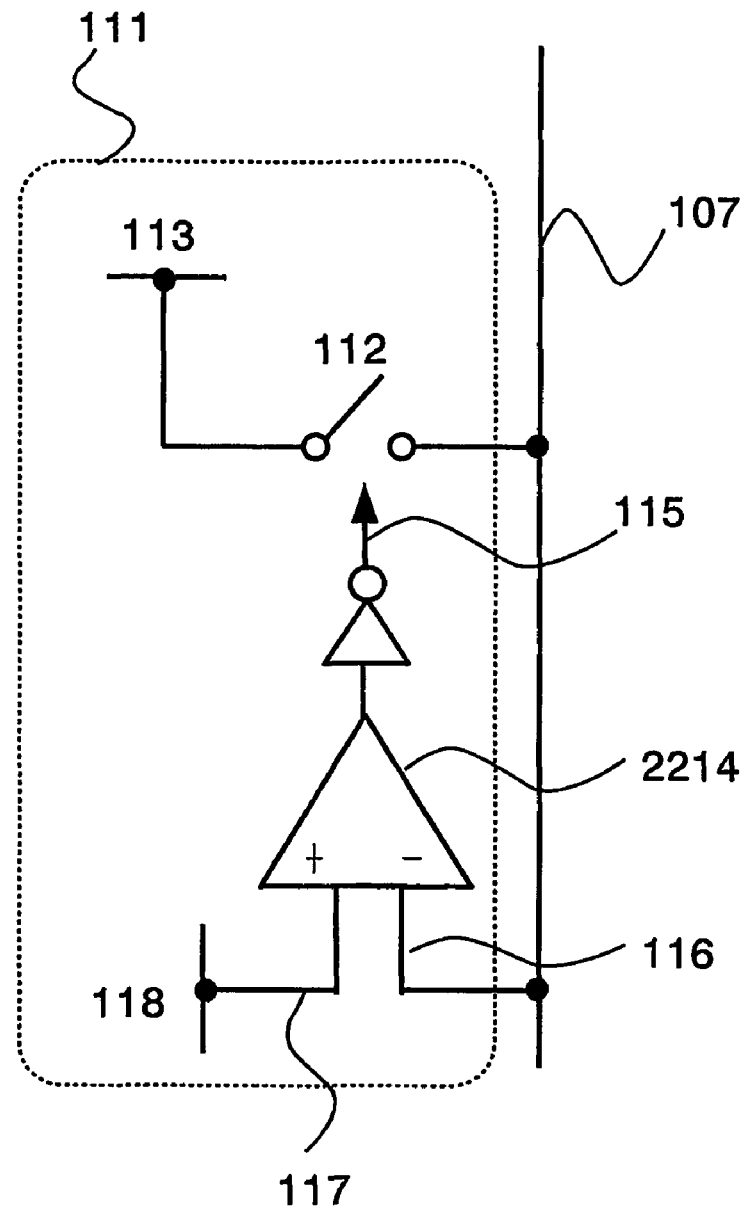
FIG. 23 is a diagram showing a configuration of a semiconductor device of the invention.
Figure 24:
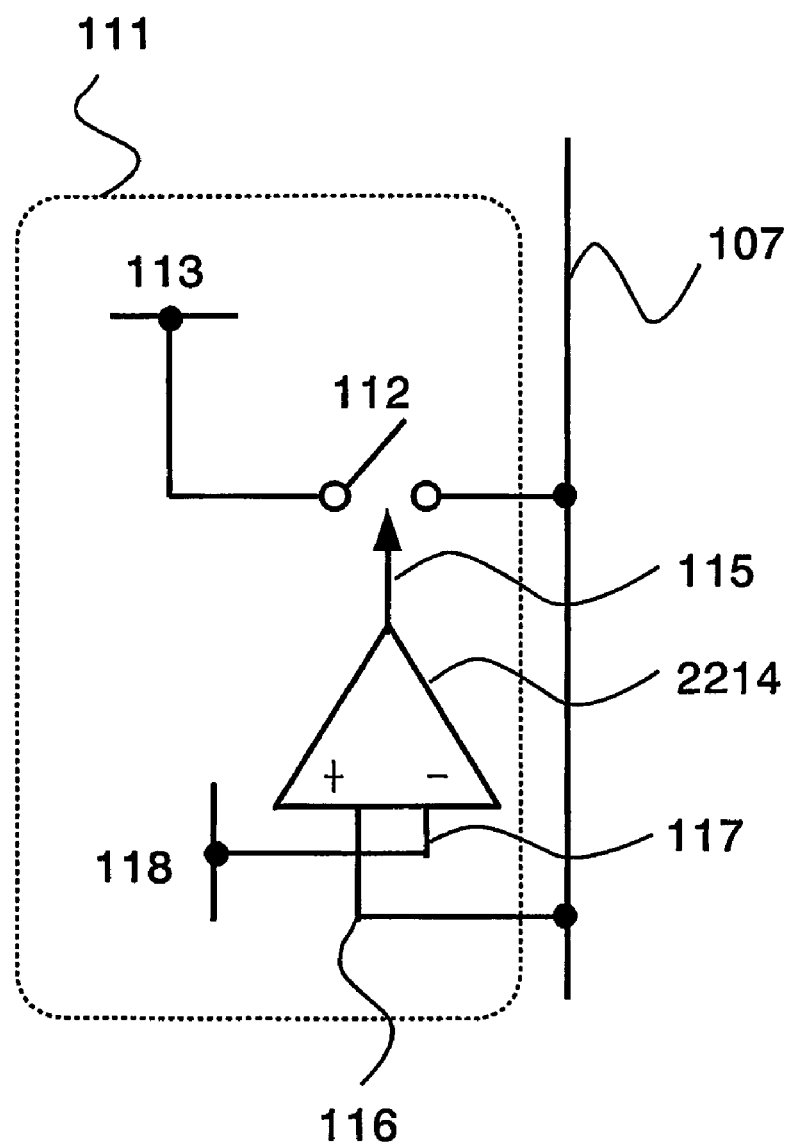
FIG. 24 is a diagram showing a configuration of a semiconductor device of the invention.

Note that in the case where the potential of the output terminal 115 is to be high when the potential of the wiring 107 is high, for example, an inverter may be connected to an end of an output of the operational amplifier 2214 as shown in FIG. 23 to invert data or a connection of the non-inverting terminal and the inverting terminal of the operational amplifier may be inverted as shown in FIG. 24.

Figure 25:
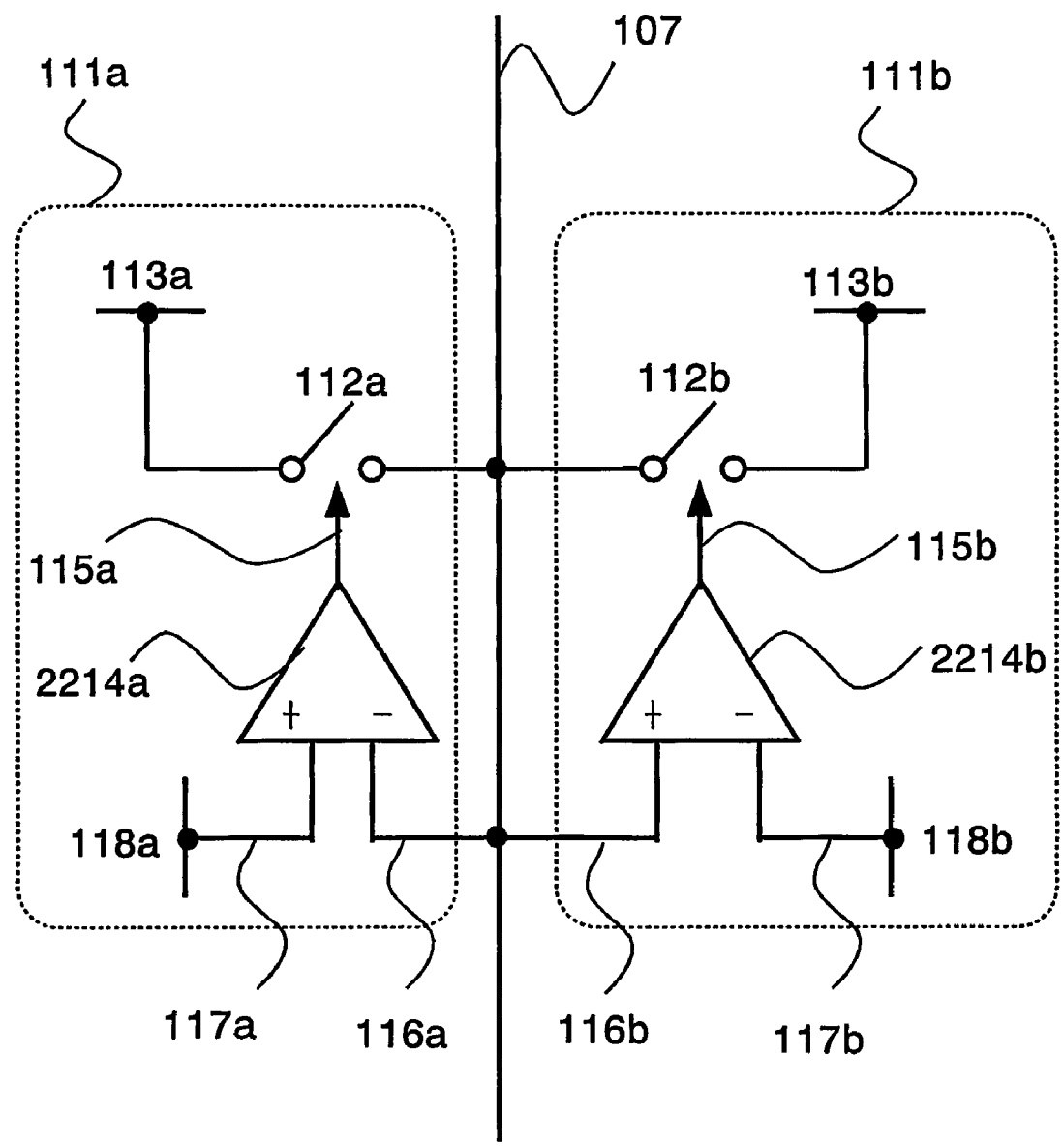
FIG. 25 is a diagram showing a configuration of a semiconductor device of the invention.

Therefore, in the case of FIG. 14, for example, operational amplifiers 2214a and 2214b may be used for configuration as shown in FIG. 25.

In the case of using an operational amplifier, an offset voltage thereof is required to be paid attention to. Therefore, a known method may be used for canceling the offset. Alternatively, the operational amplifier may be controlled to intentionally generate an offset so that an output result changes not in the graph 1501 but in the graphs 1502 and 1503 which are a little different from the graph 1501 as shown in FIG. 15.

In this manner, the case of configuring a comparison control circuit by using an operational amplifier is described, however, the invention is not limited to this. A comparison control circuit can be configured by using such a circuit of which output result changes according to the relation of a certain potential and another potential, that is a comparator circuit, a differential circuit or the like.

Figure 26:
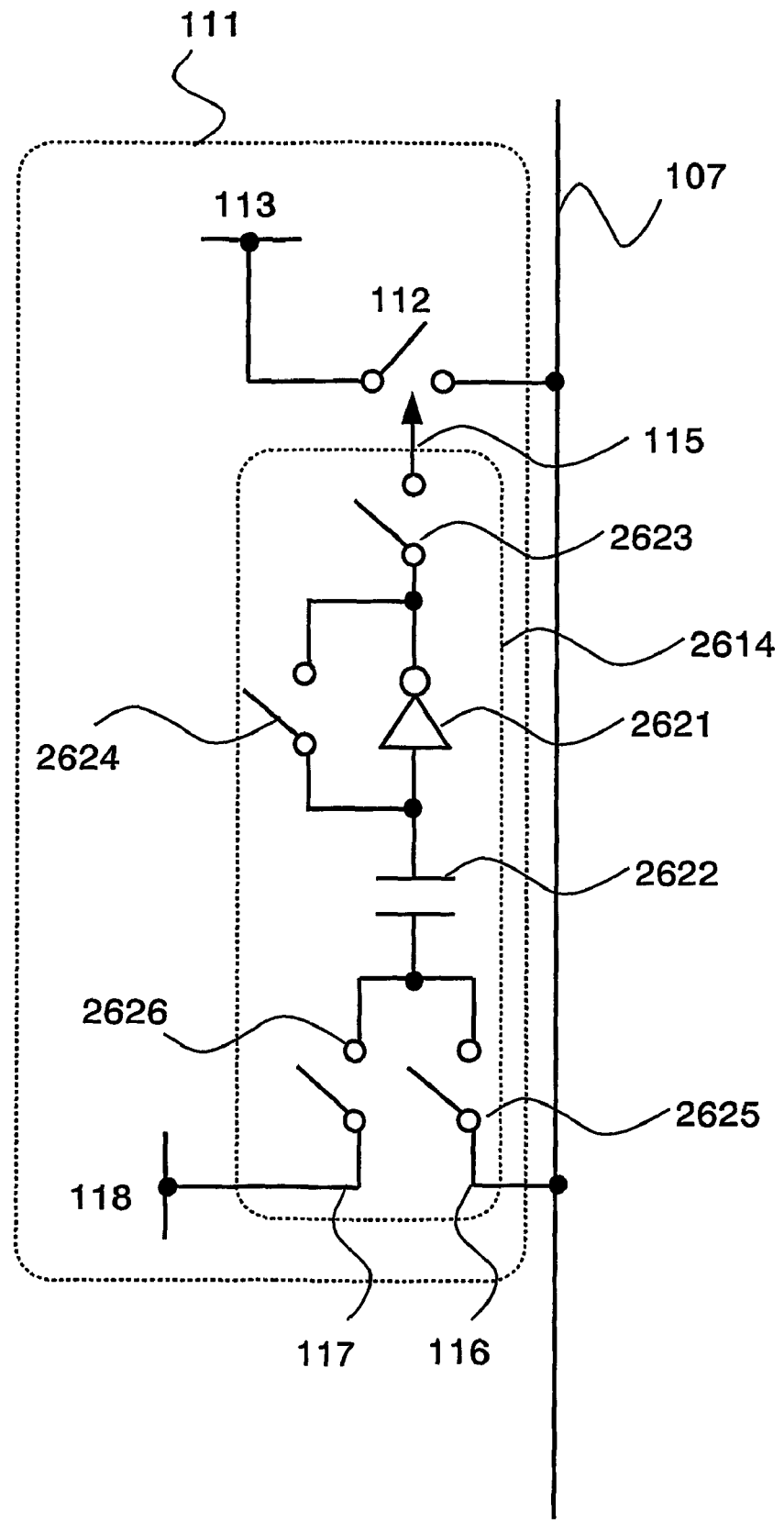
FIG. 26 is a diagram showing a configuration of a semiconductor device of the invention.

FIG. 26 shows the case of configuring a comparison control circuit by using a circuit other than an operational amplifier as a comparator circuit. FIG. 26 is a circuit what is called a chopper inverter comparator 2614 using an inverter 2621 and a capacitor 2622. In the case of employing this configuration, however, an initialization is required to be performed first in order to accumulate an appropriate charge in the capacitor 2622. First, a predetermined potential is supplied to the wiring 118 to turn ON switches 2626 and 2624 and turn OFF a switch 2625. A switch 2623 is preferably OFF. By this initialization operation, a potential to change an output of the chopper inverter comparator is stored. After that, the switches 2624 and 2626 are turned OFF and the switch 2625 is turned ON to operate as a comparator.

Figure 27:
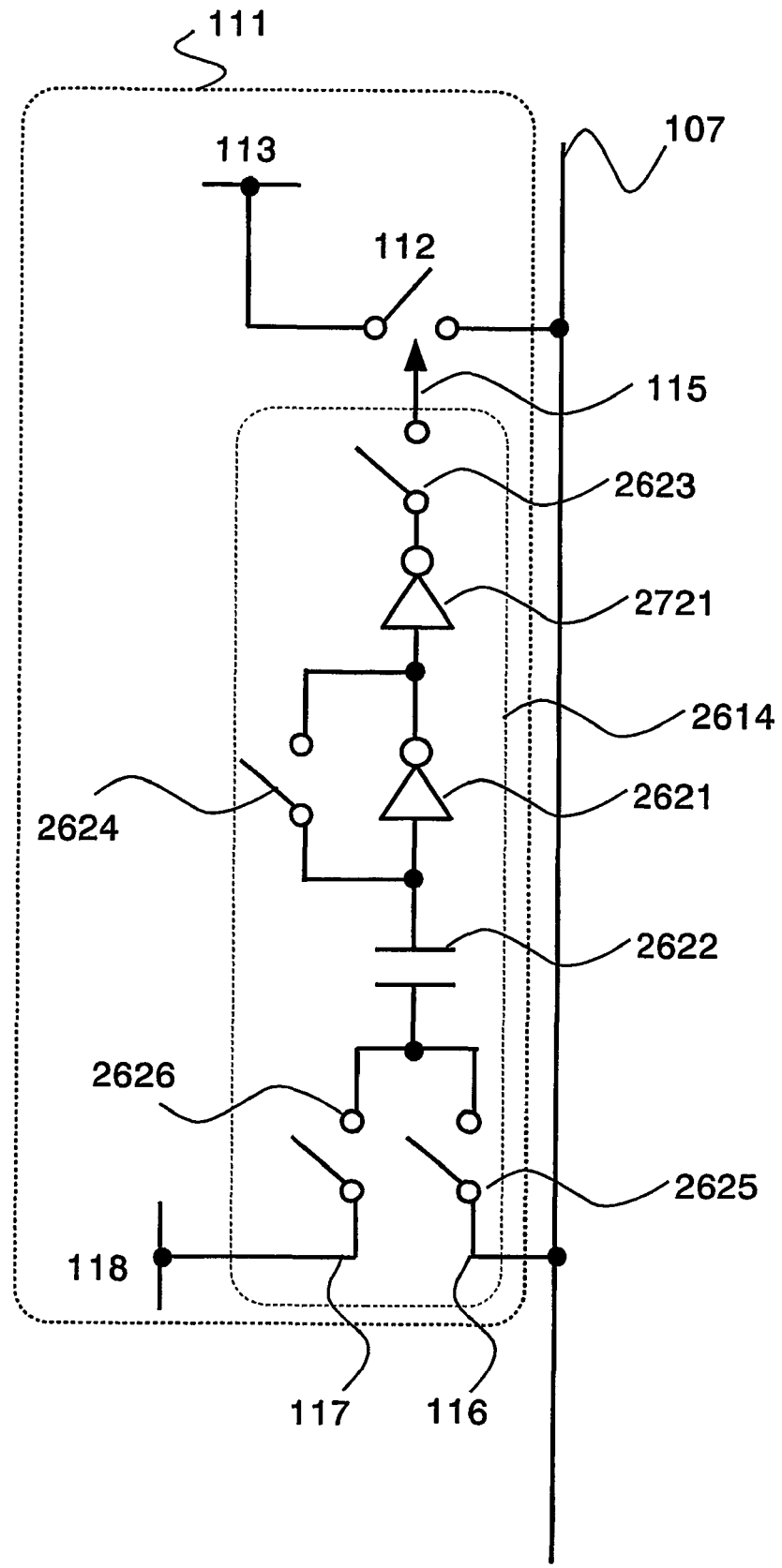
FIG. 27 is a diagram showing a configuration of a semiconductor device of the invention.

Note that in the case where the potential of the output terminal 115 is to be reversed, an inverter 2721 may be provided additionally as shown in FIG. 27.

In the case of using an operational amplifier as a comparison control circuit, an initialization is not required and the operation as shown in FIG. 15 can be performed by intentionally generating an offset voltage. However, there are such problems that a circuit scale becomes large or power consumption increases due to a constant current in the operational amplifier. In the case of using a chopper inverter comparator as a comparison control circuit, on the other hand, it is not affected by the variations since an offset voltage is not generated. Further, a circuit scale can be small and power consumption can be suppressed as well. However, an initialization is required to be performed, which makes the operation complex.

Alternatively, a differential circuit as one of the circuits configuring an operational amplifier may be used. Only a differential circuit being used, a circuit scale and power consumption can be suppressed. Besides, a comparison control circuit can be configured by using various circuits such as a common source amplifier circuit, therefore, the invention is not limited to this embodiment mode.

Note that the content described in this embodiment mode corresponds to the one describing the configurations described in Embodiment Modes 1 and 2 in details, however, the invention is not limited to this and various changes can be made as far as they do not change the gist of the invention. Therefore, the contents described in Embodiment Modes 1 and 2 can be applied to this embodiment mode as well. Further, this embodiment mode can be easily implemented in combination with Embodiment Modes 1 and 2.

Embodiment Mode 4

Next, a means for determining a potential of the second input terminal 117 (or the wiring 118) of a comparison control circuit is described. It is preferable that this potential is approximately equal to or slightly higher or lower as shown in FIG. 15 than the potential of the wiring 107 in the steady state.

The potential of the wiring 107 in the steady state changes according to a current supplied from the current source 101, a channel length L, a channel width W, mobility, and a threshold voltage of the transistor 102 and the like. Therefore, a potential corresponding to the aforementioned is required to be supplied to the second input terminal 117 (or the wiring 118) of the comparison control circuit.

Figure 28:
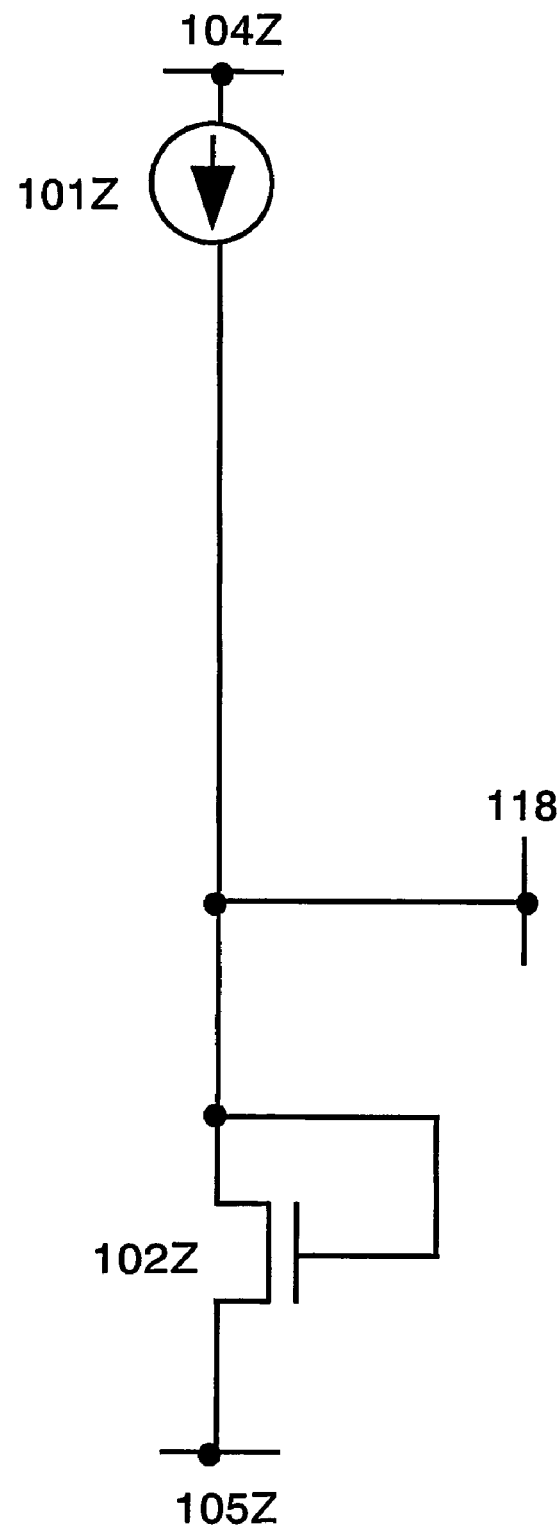
FIG. 28 is a diagram showing a configuration of a semiconductor device of the invention.
Figure 29:
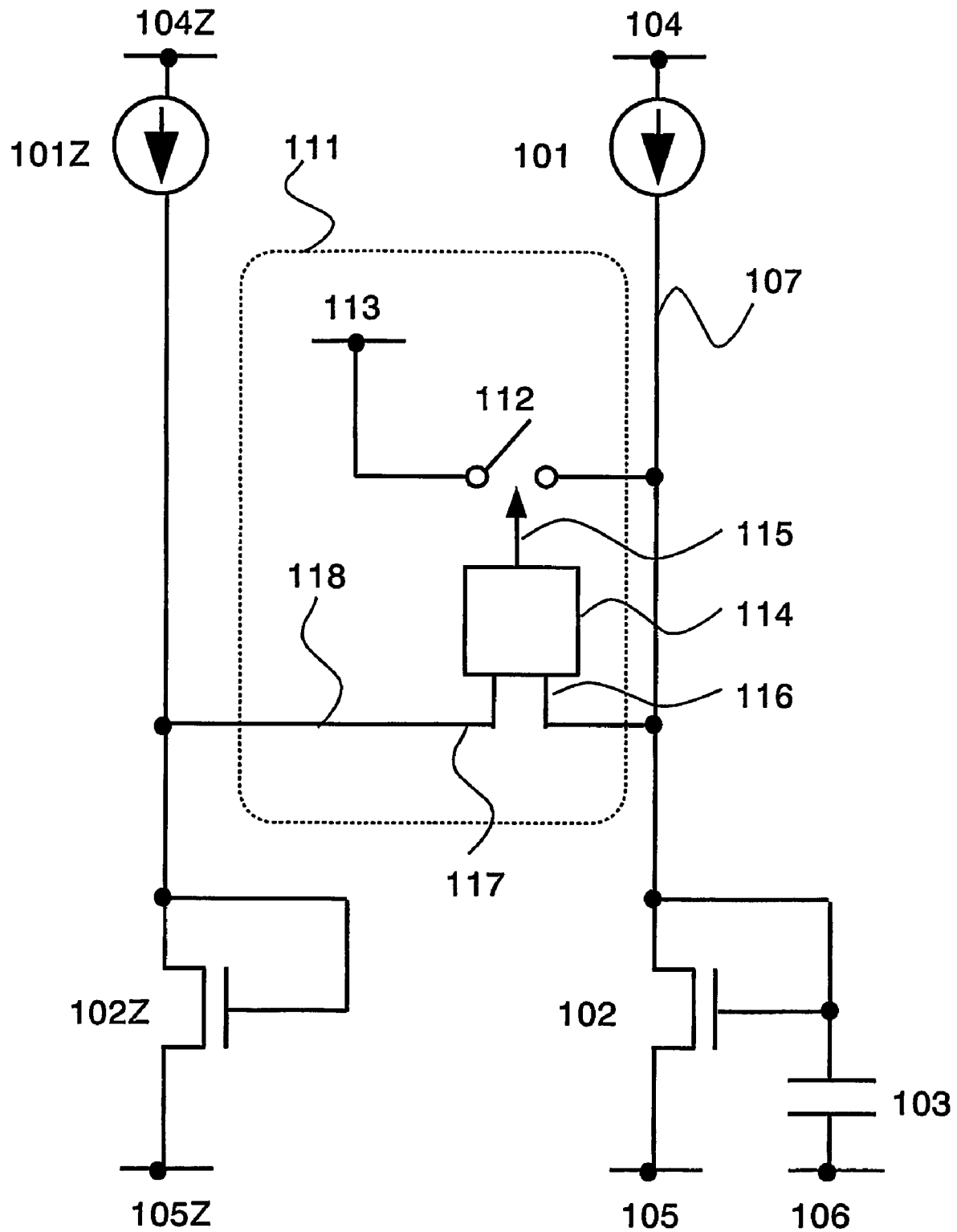
FIG. 29 is a diagram showing a configuration of a semiconductor device of the invention.

FIG. 28 shows a configuration of the case where a dummy current is supplied to a dummy transistor to obtain a potential and FIG. 29 shows the case of combining it with the configuration of FIG. 1.

In the case where the potential of the second input terminal 117 of the comparison control circuit is to be approximately equal to the potential of the wiring 107 in the steady state, a current supplied from a dummy current source 101Z may be equal to A times the current supplied from the current source 101, and W/L of a dummy transistor 102Z may be equal to A times W/L of the transistor 102. Accordingly, the potential of the second input terminal 117 of the comparison control circuit and the potential of the wiring 107 in the stead state become approximately equal to each other. Note that the dummy current source 101Z is connected to a wiring 104Z and the dummy transistor 102Z is connected to a wiring 105Z.

In the case where the potential of the second input terminal 117 of the comparison control circuit is to be lower than the potential of the wiring 107 in the steady state, the current supplied from the dummy current source 101Z may be equal to B times the current supplied from the current source 101, and W/L of the dummy transistor 102Z equals to C times W/L of the transistor 102. Here, B<C is to be satisfied. As a result, a gate-source voltage of the dummy transistor 102Z becomes small, therefore, the potential of the second input terminal 117 of the comparison control circuit can be low.

On the contrary, in the case where the potential of the second input terminal 117 of the comparison control circuit is to be higher than the potential of the wiring 107 in the steady state, B>C is to be satisfied. As a result, the gate-source voltage of the dummy transistor 102Z becomes large, therefore, the potential of the second input terminal 117 of the comparison control circuit can be high. It is to be noted here that A, B, and C are arbitrary numbers larger than 0.

Note that power consumption can be reduced by making a current supplied from the dummy current source 101Z small while satisfying A<1 (or B<1 and C<1) as a current value is small. Further, as the dummy current source 101Z and the dummy transistor 102Z can be formed small, which allows a layout area and a frame to be formed small.

Figure 30:
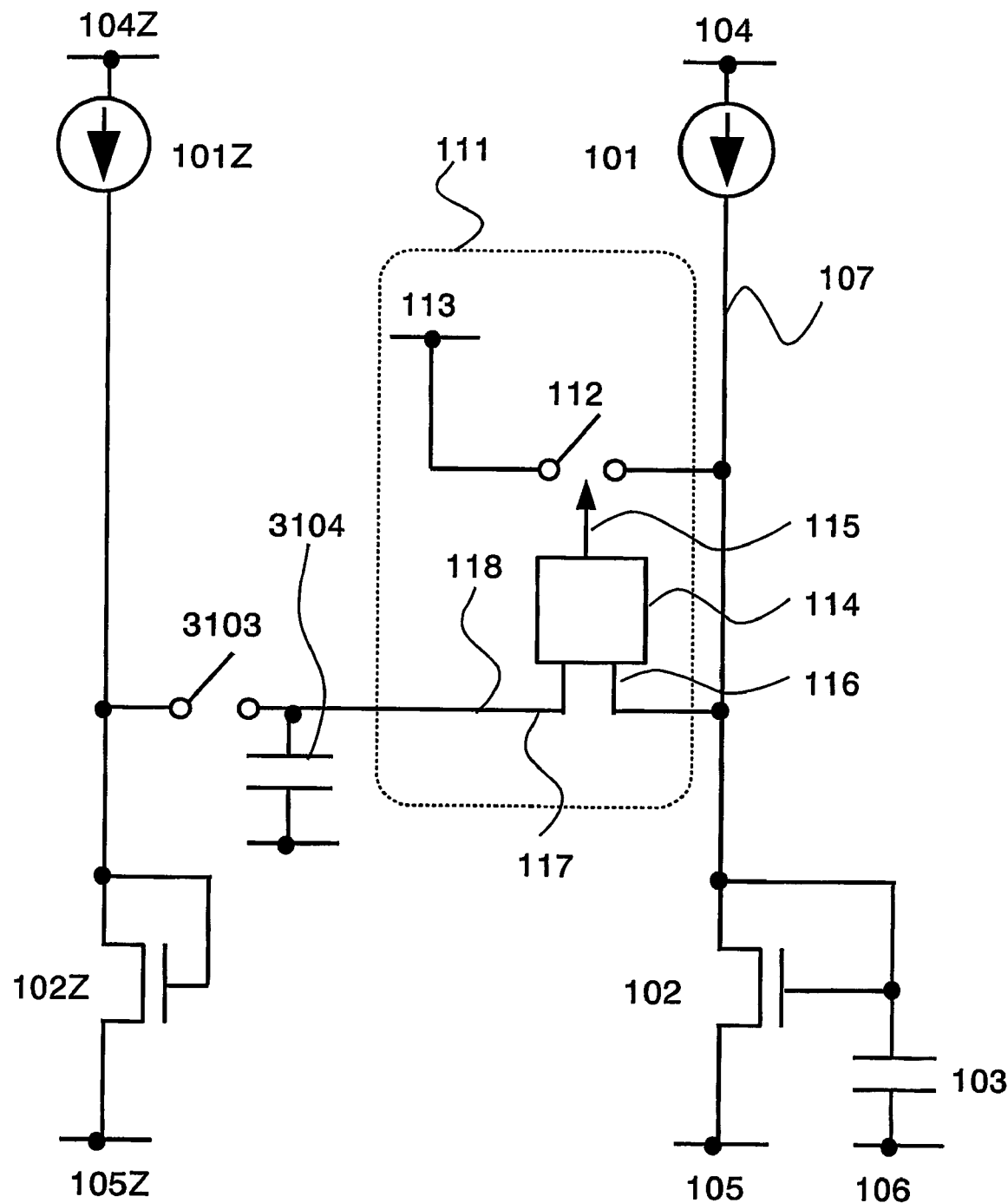
FIG. 30 is a diagram showing a configuration of a semiconductor device of the invention.

However, in the case where a potential keeps being supplied to the second input terminal 117 of the comparison control circuit in the case of the configuration of FIG. 29, the dummy current source 101Z is required to keep supplying a current, which increases power consumption. Therefore, a capacitor 3104 may be provided as shown in FIG. 30 so as to maintain the potential of the second input terminal 117 of the comparison control circuit. By storing a charge with the capacitor 3104 and turning OFF a switch 3103, the potential of the second input terminal 117 of the comparison control circuit is maintained. After the switch 3103 is turned OFF, the dummy current source 101Z is not required to keep supplying a current. Therefore, a current may not flow by stopping the current or providing a switch at an end of the dummy current source 101Z.

Figure 31:
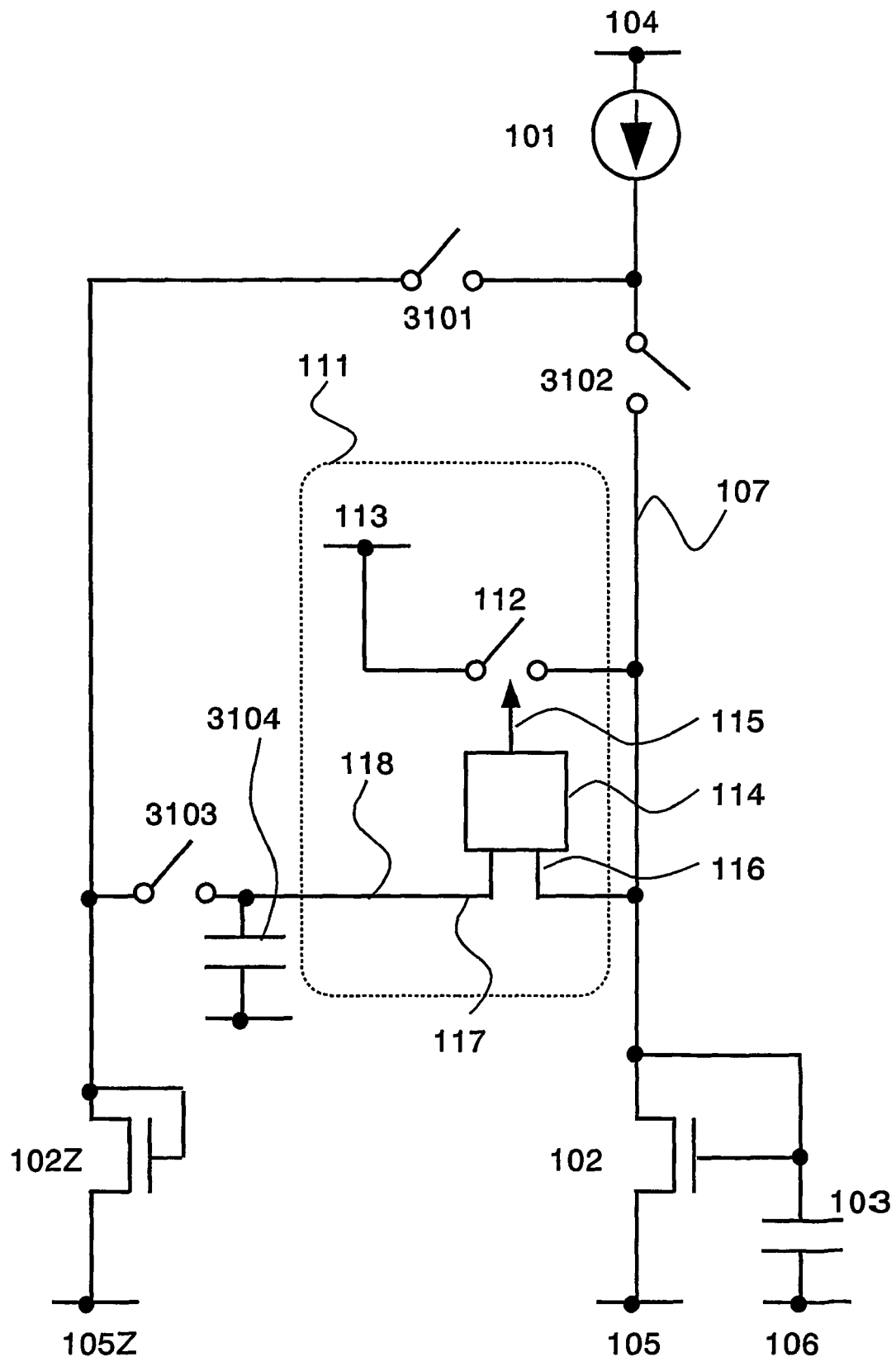
FIG. 31 is a diagram showing a configuration of a semiconductor device of the invention.

In this manner, the current source 101Z is used in FIGS. 29 and 30, however, the current source 101 may be used for supplying a current to a dummy transistor. FIG. 31 shows a configuration diagram in this case.

First, a switch 3102 is turned OFF and switches 3101 and 3103 are turned ON to flow a current to the dummy transistor 102Z. Then, a charge is accumulated in the capacitor 3104. After that, the switch 3102 is turned ON and the switches 3101 and 3103 are turned OFF to flow a current to the transistor 102.

In the case of making the potential of the second input terminal 117 of the comparison control circuit approximately equal to the potential of the wiring 107 in the steady state, W/L of the dummy transistor 102Z may be equal to W/L of the transistor 102. In the case where the potential of the second input terminal 117 of the comparison control circuit is to be lower than the potential of the wiring 107 in the steady state, W/L of the dummy transistor 102Z may be larger than W/L of the transistor 102. On the contrary, in the case where the potential of the second input terminal 117 of the comparison control circuit is to be higher than the potential of the wiring 107 in the steady state, W/L of the dummy transistor 102Z may be smaller than W/L of the transistor 102. In this manner, by controlling W/L of the dummy transistor 102Z, a gate-source voltage of the dummy transistor 102Z may be controlled.

As shown in FIGS. 29 to 31, it is preferable that a direction of current flow (from a current source to a transistor or from a transistor to a current source) be the same between the case of the dummy current source 101Z and the dummy transistor 102Z and the case of the current source 101 and the transistor 102, and that the polarity of the dummy transistor 102Z and the transistor 102 be the same. Thus, an appropriate potential can be supplied to the second input terminal 117 of the comparison control circuit regardless of an amount of current supplied from the current source 101.

Figure 32:
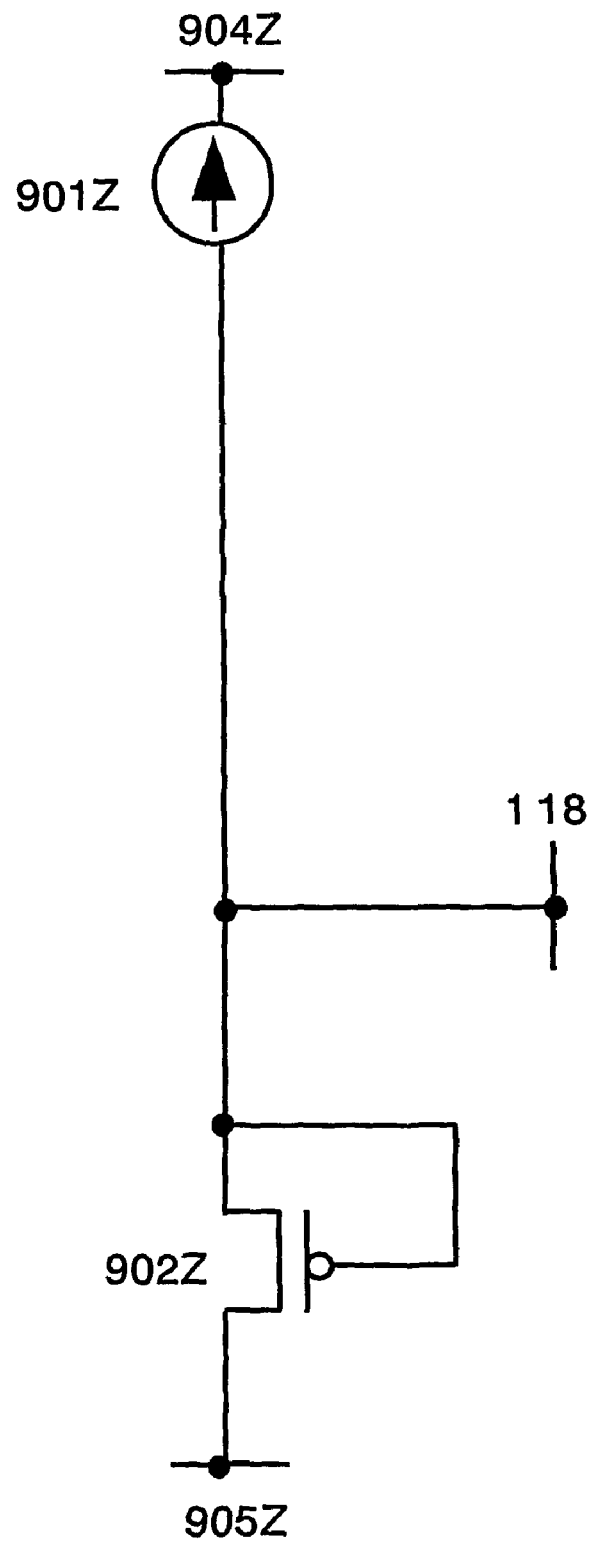
FIG. 32 is a diagram showing a configuration of a semiconductor device of the invention.
Figure 33:
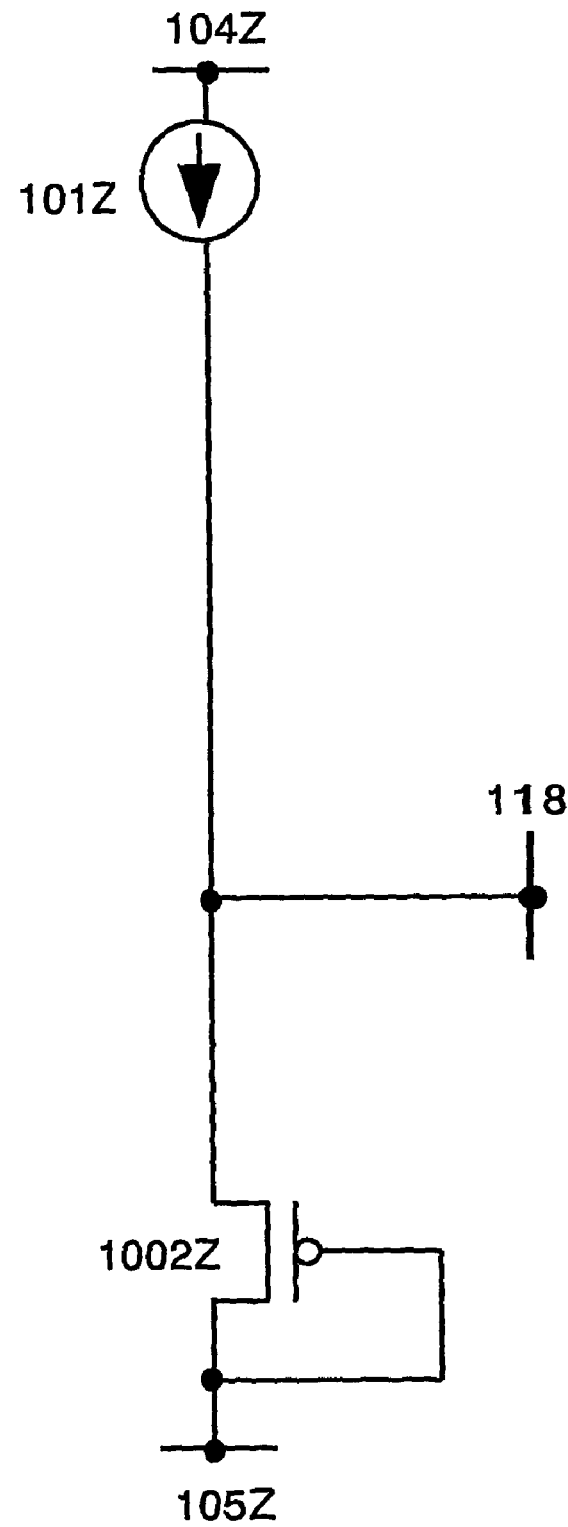
FIG. 33 is a diagram showing a configuration of a semiconductor device of the invention.
Figure 34:
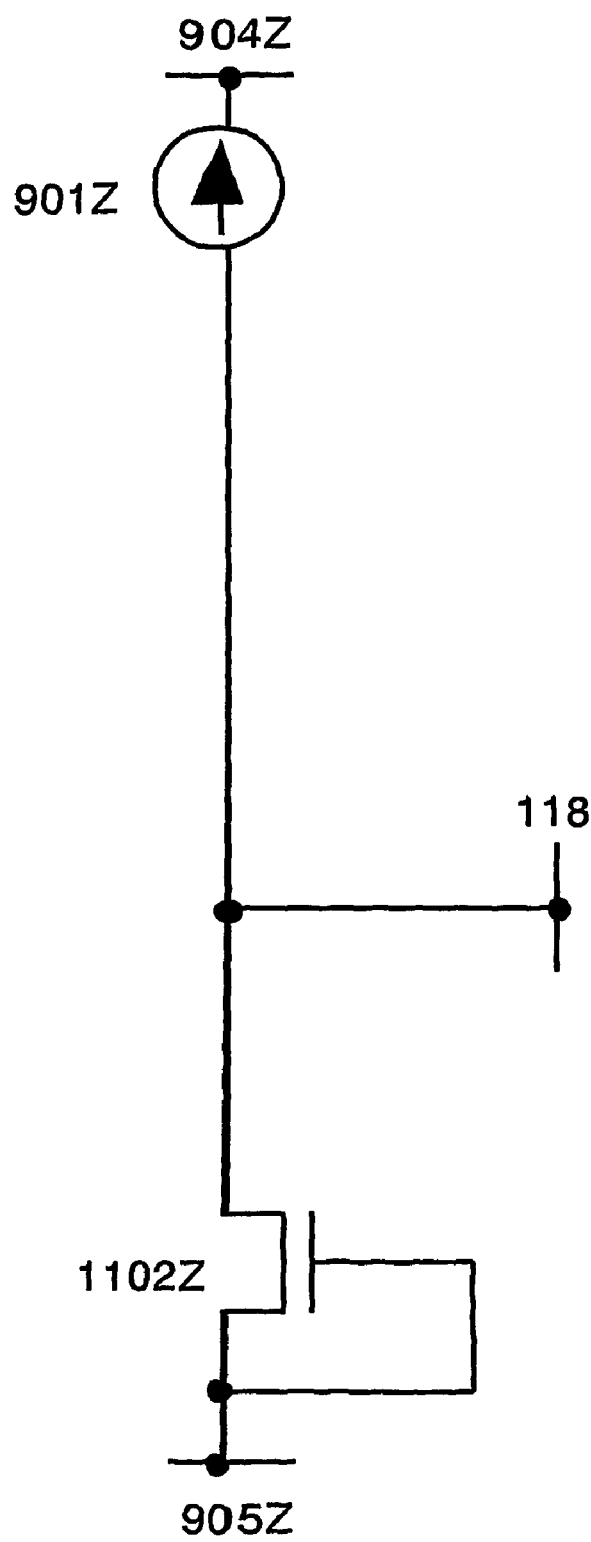
FIG. 34 is a diagram showing a configuration of a semiconductor device of the invention.

Therefore, it is preferable to employ the configuration of FIG. 28 in the case of FIG. 1. Similarly, it is preferable to employ a configuration of FIG. 32 in the case of FIG. 9, a configuration of FIG. 33 in the case of FIG. 10, and a configuration of FIG. 34 in the case of FIG. 11.

Note that it is preferable that the transistor 102 and the dummy transistor 102Z are uniform in characteristics as much as possible. This is because an accurate potential cannot be obtained easily when current characteristics vary. Therefore, it is preferable that the current characteristics thereof become uniform as much as possible in the step for forming the transistor. In the case of irradiating laser on semiconductor layers of the transistor 102 and the dummy transistor 102Z, for example, it is preferable that the laser be irradiated so that the current characteristics thereof become uniform.

Note that the content described in this embodiment mode corresponds to a part of the configurations described in Embodiment Modes 1 to 3 specifically described, however, the invention is not limited to this and various changes can be made as far as they do not change the gist of the invention. Therefore, the contents described in Embodiment Modes 1 to 3 can be applied to this embodiment mode as well. Further, this embodiment mode can be freely implemented in combination with Embodiment Modes 1 to 3.

Embodiment Mode 5

In FIG. 1 and the like, one transistor 102 is connected to the wiring 107. Next, the case where a plurality of transistors are connected to the wiring 107 is described.

Figure 35:
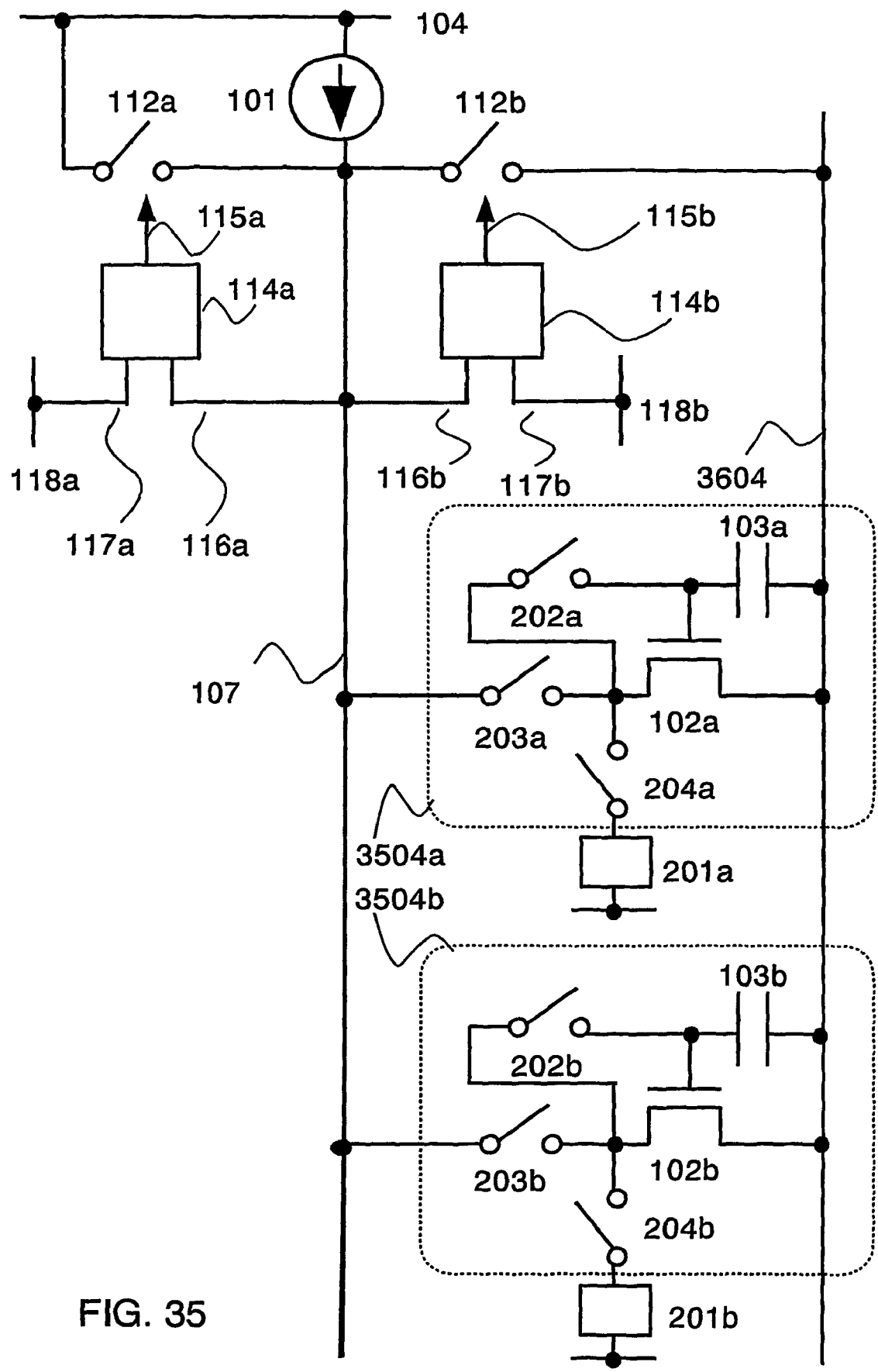
FIG. 35 is a diagram showing a configuration of a semiconductor device of the invention.

FIG. 35 shows the case where a plurality of transistors are connected in the configuration of FIG. 14. The transistors 102a and 102b correspond to the plurality of transistors connected to the wiring 107. The transistor 102a, switches 202a, 203a, 204a, a capacitor 103a, a load 201a and the like fall into one group. In the case where the load 201a is a light emitting element and the like, this group corresponds to a pixel and the current source 101 and the like correspond to a signal driver circuit (or a part of it). Alternatively, in the case where the load 201a is a signal line or a pixel and the like connected to the signal line, the group corresponds to a signal driver circuit (or a part of it) and the current source 101 and the like correspond to a circuit for supplying a current to the signal driver circuit (or a part of it).

It is to be noted in FIG. 35 that the wiring 113a in FIG. 14 is connected to the wiring 104 which corresponds to a first power source line and a wiring 113b in FIG. 14 is connected to a wiring 3604 which corresponds to a second power source line. Here, the transistor 102a, the switches 202a, 203a, 204a, and the capacitor 103a are referred to as a unit circuit 3504a collectively. Further, the transistor 102b, switches 202b, 203b, 204b, and the capacitor 103b are referred to as a unit circuit 3504b collectively.

It is to be noted in FIG. 35 that the two transistors 102a and 102b are connected to the wiring 107, that is, the elements are provided two each, such as the unit circuit 3504a and the load 201a, the unit circuit 3504b and the load 201b, however, the invention is not limited to this. Similarly, more transistors (or a group thereof, a unit circuit, or a load) can be connected.

Figure 36:
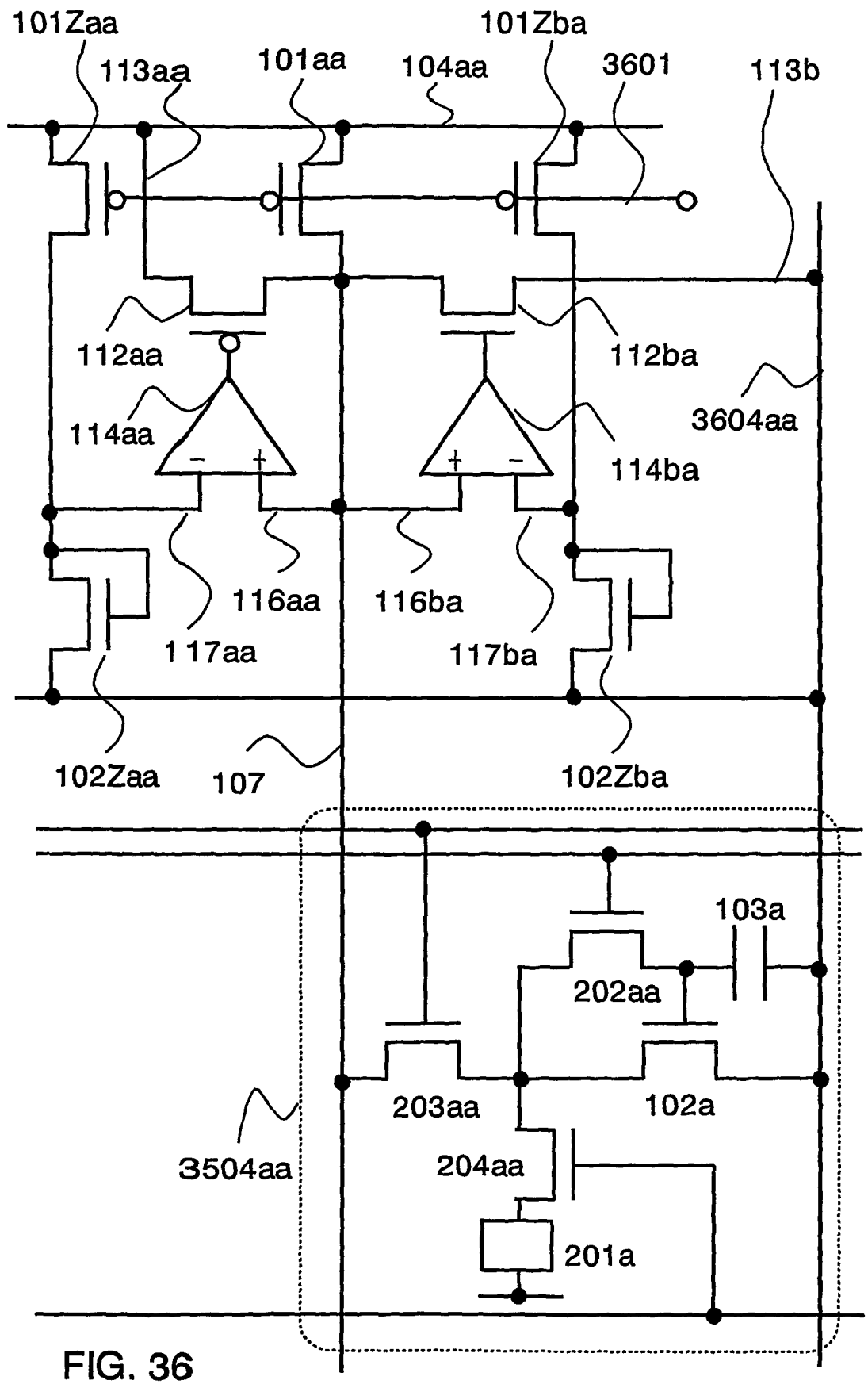
FIG. 36 is a diagram showing a configuration of a semiconductor device of the invention.

Next, FIG. 36 shows a circuit diagram which specifically shows the configuration of FIG. 35, with which the configurations of FIGS. 22 and 29 are further combined.

It is to be noted in FIG. 35 that the two transistors 102a and 102b are connected to the wiring 107, however, it is assumed for simplicity that one transistor 102aa is connected to the wiring 107 in FIG. 36.

Comparison control circuits 114a and 114b correspond to operational amplifiers 114aa and 114ba in FIG. 36. Further, the precharge switches 112a and 112b correspond to transistors 112aa and 112ba in FIG. 36. Note that a CMOS structure may be employed although it is not employed in FIG. 36. However, as the P-channel transistor 112aa is connected to a wiring having a higher potential and the N-channel transistor 112*ba* is connected to a wiring having a lower potential, a normal operation can be obtained without employing a CMOS structure.

Further, the current source 101 in FIG. 35 corresponds to a transistor 101*aa* in FIG. 36. Further, the dummy current source 101Z in FIG. 29 corresponds to transistors 101Z*aa* and 101Z*ba* in FIG. 36. By connecting gate terminals of the transistors 101*aa*, 101Z*aa*, and 101Z*ba* as shown in FIG. 36, a current corresponding to a current supplied by the transistor 101*aa* which corresponds to the current source 101 can be supplied from the transistors 101Z*aa* and 101Z*ba* which correspond to the dummy current source 101Z.

Note that input terminals 116*aa* and 117*aa* are connected to the operational amplifier 114*aa* and input terminals 116*ba* and 117*ba* are connected to the operational amplifier 114*ba*. Further, transistors 102Z*aa* and 102Z*ba* are connected to the input terminals 117*aa* and 117*ba* respectively and a wiring 113*aa* is connected to the transistor 112*aa*. A wiring 3601 is connected to gate electrodes of the transistors 101Z*aa*, 101*aa*, and 101Z*ba*. Further, wirings 104*aa* and 3604*aa* in FIG. 36 correspond to the wirings 104 and 3604 in FIG. 35 respectively. Here, the transistors 102*a*, 202*aa*, 203*aa*, 204*aa*, the load 201*a*, and the capacitor 103*a* are referred to as a unit circuit 3504*aa* collectively.

Note that a pixel and a signal driver circuit may have any configuration as long as it at least employs a method of inputting a current. Further, a load other than an EL element may be disposed in the pixel. It may be an element such as a resistor, a transistor, an EL element, other light emitting elements, a current source circuit configured with a transistor, a capacitor, a switch and the like, a wiring connected to an arbitrary circuit, a signal line, or a pixel connected to the signal line. The pixel may include an EL element, an element used in an FED, or an element driven by receiving a current.

Therefore, it is possible to apply and combine the invention with the contents applied in the International Publication WO03/027997 and Japanese Patent Application No. 2002-274680 of the same applicant.

The configurations of the signal driver circuit and the current source circuit are described in International Publication WO03/038793, International Publication WO03/038794, International Publication WO03/038795, International Publication WO03/038796, and International Publication WO03/038797 of which contents can be applied to and implemented in combination with the invention.

In the various configurations described heretofore, switches are disposed in each portion, however, the disposition is not limited to the aforementioned ones. The switches may be disposed arbitrarily as long as they operate normally.

Note that the content described in this embodiment mode corresponds to the one to which the configurations described in Embodiment Modes 1 to 4 are applied, however, the invention is not limited to this and various changes can be made as far as they do not change the gist of the invention. Therefore, the contents described in Embodiment Modes 1 to 4 can be applied to this embodiment mode as well. Further, this embodiment mode can be easily implemented in combination with Embodiment Modes 1 to 4.

Embodiment Mode 6

In this embodiment mode, a display device, a configuration and an operation of a signal driver circuit and the like are described. The invention can be applied to a portion of a signal driver circuit and a pixel.

Figure 37:
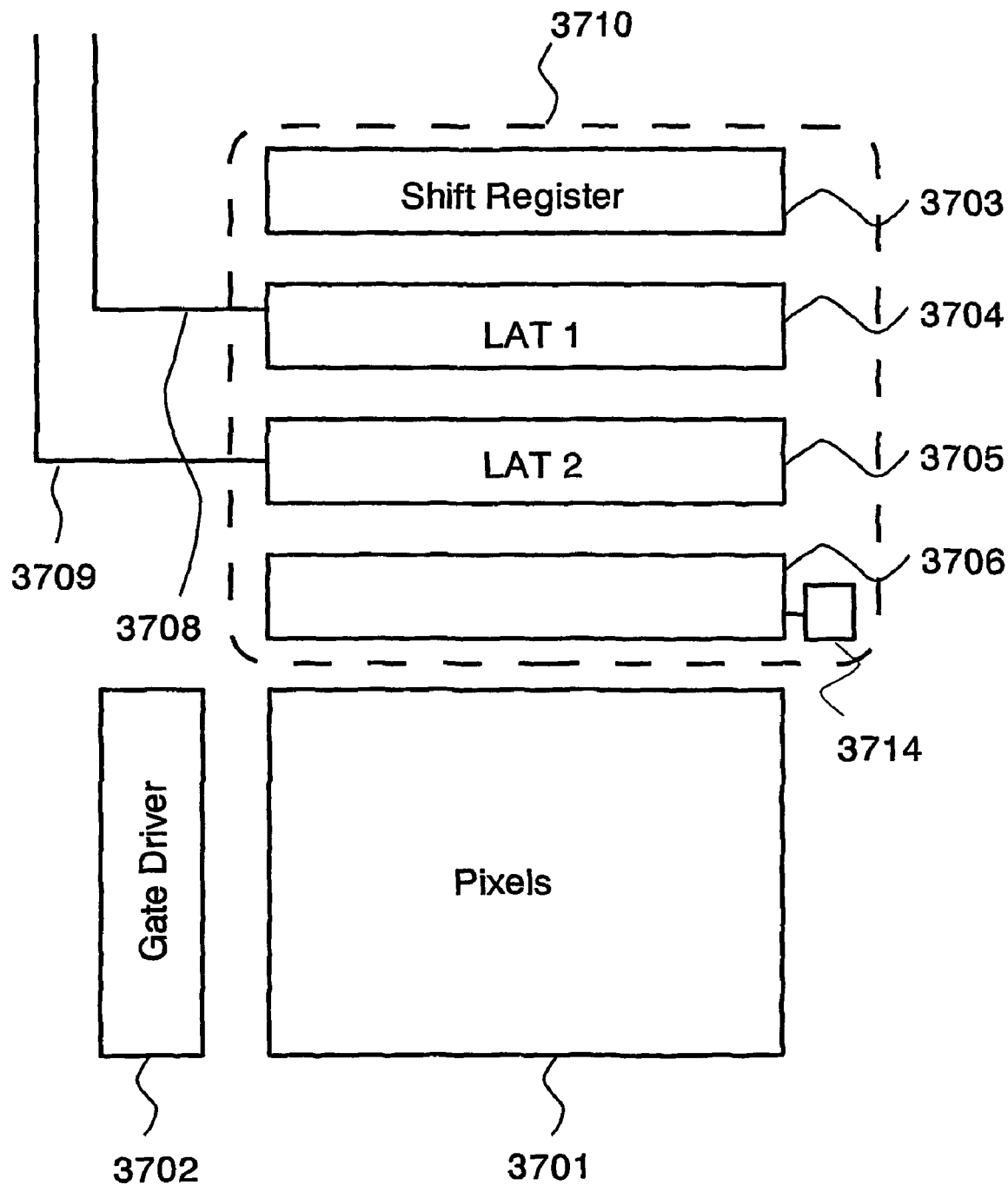
FIG. 37 is a diagram showing a structure of a display device to which the invention is applied.

A display device shown in FIG. 37 includes a pixels 3701, a gate driver 3702, and a signal driver circuit 3710. The gate driver 3702 sequentially outputs a selection signal to the pixels 3701. The signal driver circuit 3710 sequentially outputs a video signal to the pixels 3701. The pixels 3701 displays an image by controlling the state of light in accordance with the video signal. The video signal inputted from the signal driver circuit 3710 to the pixels 3701 is often a current. That is, a display element and an element which controls the display element disposed in each pixel change their states in accordance with the video signal (current) inputted from the signal driver circuit 3710. The display element disposed in the pixel includes an EL element, an element used in an FED (Field Emission Display) and the like.

Note that there may be a plurality of the gate driver 3702 and the signal driver circuit 3710.

The signal driver circuit 3710 can be divided into a plurality of portions in configuration. Briefly, it can be divided into a shift register 3703, a first latch circuit (LAT 1) 3704, a second latch circuit (LAT 2) 3705, and a digital-analog converter circuit 3706. The digital-analog converter circuit 3706 includes a function to convert a voltage into a current and may include a function to provide a gamma correction as well. That is, the digital-analog converter circuit 3706 includes a circuit for outputting a current (video signal) to a pixel, that is a current source circuit to which the invention can be applied.

Further, a pixel includes a display element such as an EL element. It also includes a circuit for outputting a current (video signal) to the display element, that is a current source circuit, to which the invention can be applied.

Note that a digital voltage signal for a video signal and a current for controlling a current source circuit in a pixel are inputted to the pixel in some cases. In that case, the digital-analog converter circuit 3706 does not include a digital-analog converting function but includes a function to convert a voltage into a current and a circuit for outputting the current to a pixel as a current for control, that is a current source circuit to which the invention can be applied.

An operation of the signal driver circuit 3710 is briefly described. The shift register 3703 is formed by using a plurality of stages of flip-flop circuits (FFs) and the like and inputted with a clock signal (S-CLK), a start pulse (SP), and an inverted clock signal (S-CLK). Sampling pulses are outputted in accordance with the timing of these signals.

A sampling pulse outputted from the shift register 3703 is inputted to the first latch circuit (LAT 1) 3704. The first latch circuit (LAT 1) 3704 is inputted with a video signal from a video signal line 3708 and holds a video signal in each column in accordance with the timing at which the sampling pulse is inputted. Note that in the case where the digital-analog converter circuit 3706 is disposed, a video signal has a digital value. Further, the video signal in this phase is often a voltage.

In the case where the first latch circuit 3704 (LAT 1) and the second latch circuit (LAT 2) 3705 can store analog values, however, the digital-analog converter circuit 3706 can be omitted in many cases. In that case, the video signal is often a current. Further, when data outputted to the pixels 3701 has a binary value, that is a digital value, the digital-analog converter circuit 3706 can be omitted in many cases.

When video signals are held up to the final column in the first latch circuit (LAT 1) 3704, a latch pulse is inputted from a latch control line 3709 in a horizontal retrace period and the video signals held in the first latch circuit (LAT 1) 3704 are transferred to the second latch circuit (LAT 2) 3705 all at once. After that, the video signals held in the second latch circuit (LAT 2) 3705 are inputted to the digital-analog converter circuit 3706 one row at a time. Then, the signals outputted from the digital-analog converter circuit 3706 are inputted to the pixels 3701.

While the video signals held in the second latch circuit (LAT 2) 3705 are inputted to the digital-analog converter circuit 3706 and then to the pixels 3701, sampling pulses are outputted again in the shift register 3703. That is, two operations are simultaneously performed. Accordingly, a line sequential drive can be performed. After this, the aforementioned operation is repeated.

Note that in the case where the current source circuit in the digital-analog converter circuit 3706 performs the set operation and the output operation, a circuit for flowing a current to the current source circuit is required. In that case, a reference current source circuit 3714 is provided.

Note that the signal driver circuit and a portion of it do not exist on the same substrate as the pixels 3701 but formed by using, for example, an external IC chip in some cases.

Note that configurations of the signal driver circuit and the like are not limited to FIG. 37.

Figure 38:
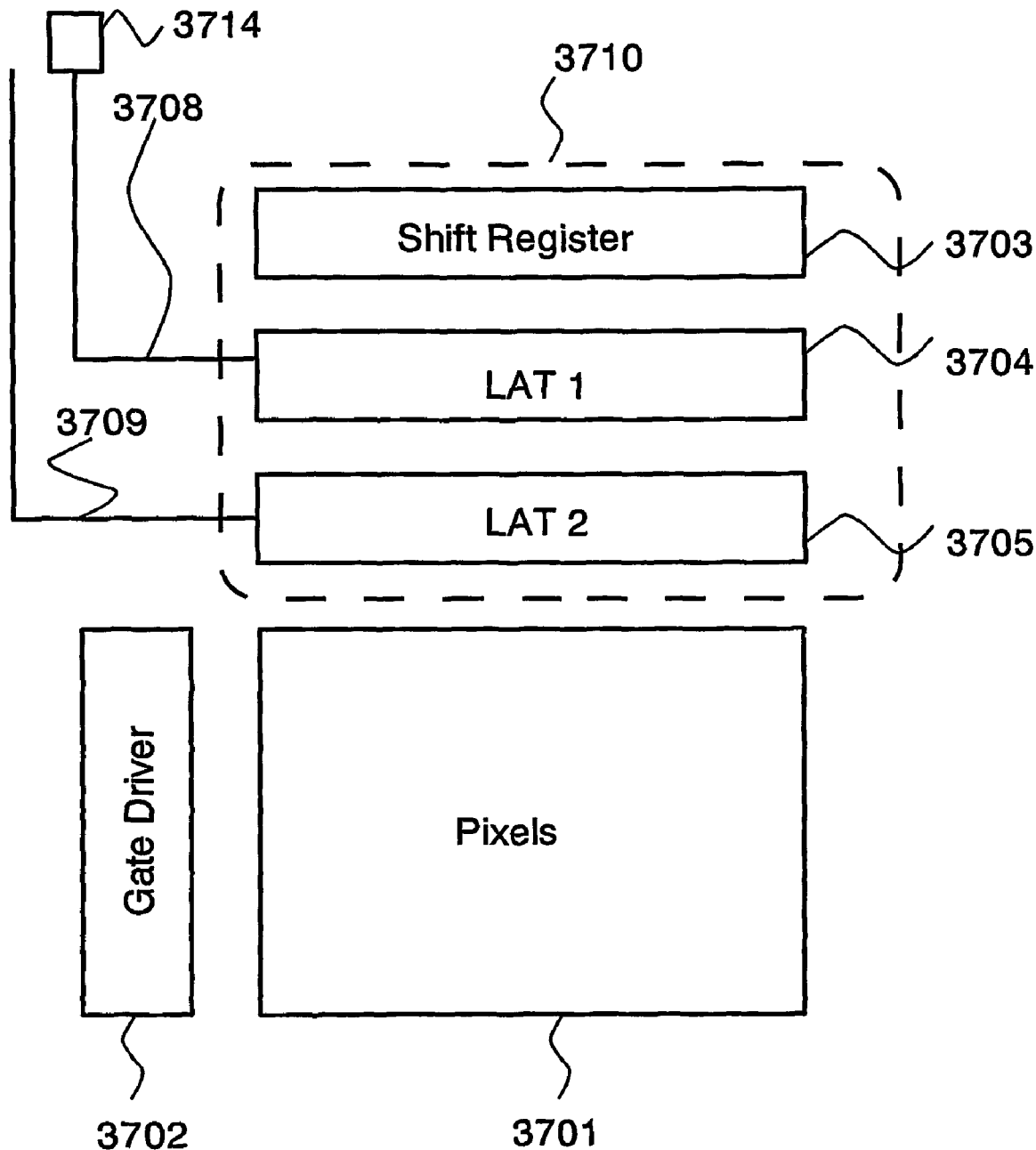
FIG. 38 is a diagram showing a structure of a display device to which the invention is applied.

For example, in the case where the first latch circuit (LAT 1) 3704 and the second latch circuit (LAT 2) 3705 are capable of storing analog values, a video signal (analog current) may be inputted from the reference current source circuit 3714 to the first latch circuit (LAT 1) 3704 as shown in FIG. 38. Furthermore, the second latch circuit (LAT 2) 3705 may not be provided in FIG. 38. In that case, more current source circuits are disposed in the first latch circuit (LAT 1) 3704 in many cases.

Note that specific configurations and the like are described in Japanese Patent Application No. 2002-287997, Japanese Patent Application No. 2002-288104, Japanese Patent Application No. 2002-288043, Japanese Patent Application No. 2002-287921, Japanese Patent Application No. 2002-287948 and the like, of which contents can be implemented in combination with the invention.

In such a case, the invention can be applied to a current source circuit in the digital-analog converter circuit 3706 in FIG. 37. There are many unit circuits in the digital-analog converter circuit 3706 and the current source 101 is disposed in the reference current source circuit 3714.

Alternatively, the invention can be applied to a current source circuit in the first latch circuit (LAT 1) 3704 in FIG. 38.

Alternatively, the invention can be applied to a pixel (a current source circuit therein) in the pixels 3701 in FIGS. 37 and 38. There are many current source circuits in the pixels 3701 and the current source 101 is disposed in the signal driver circuit 3710.

Figure 39:
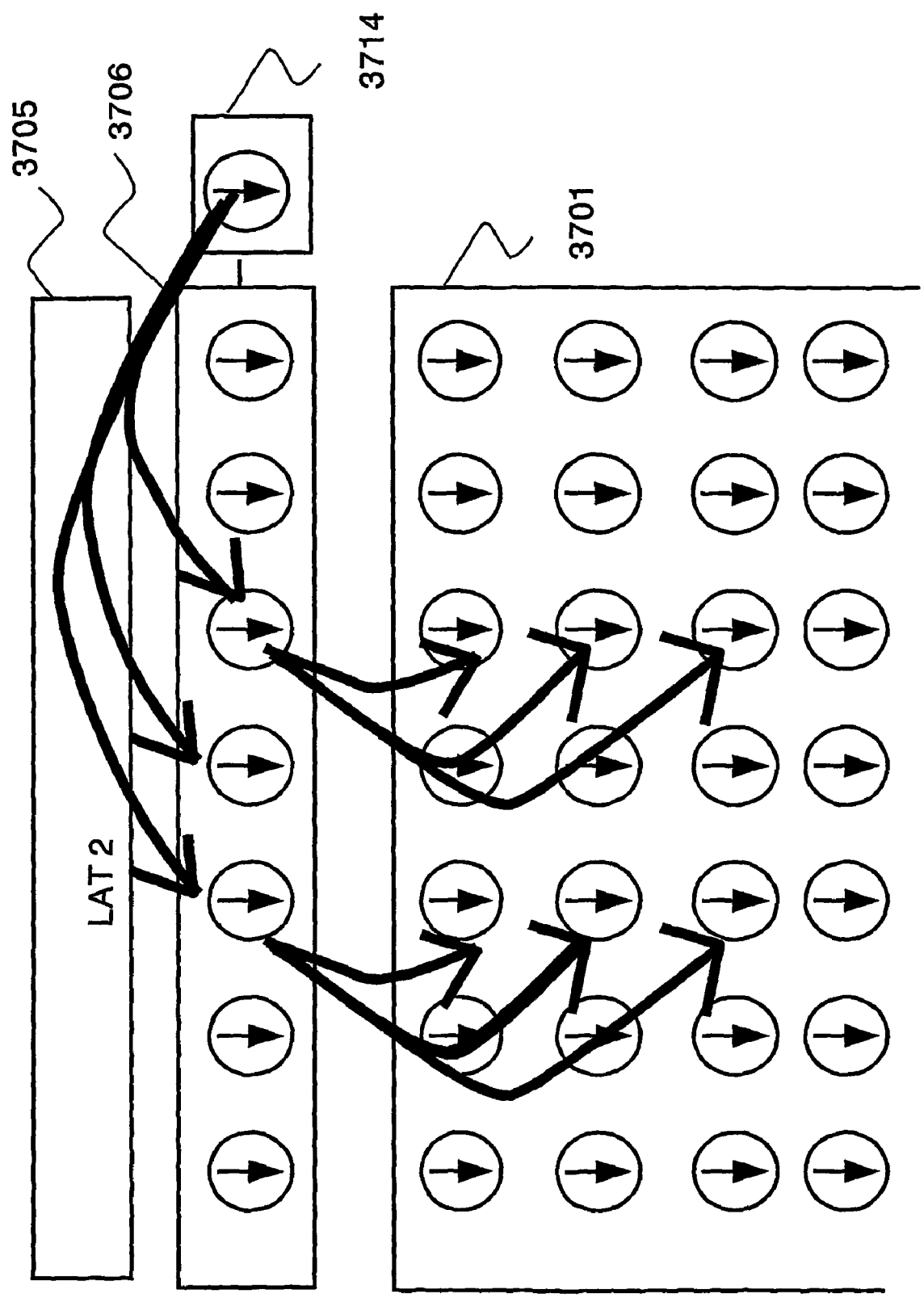
FIG. 39 is a diagram showing a configuration of a semiconductor device of the invention.
Figure 40:
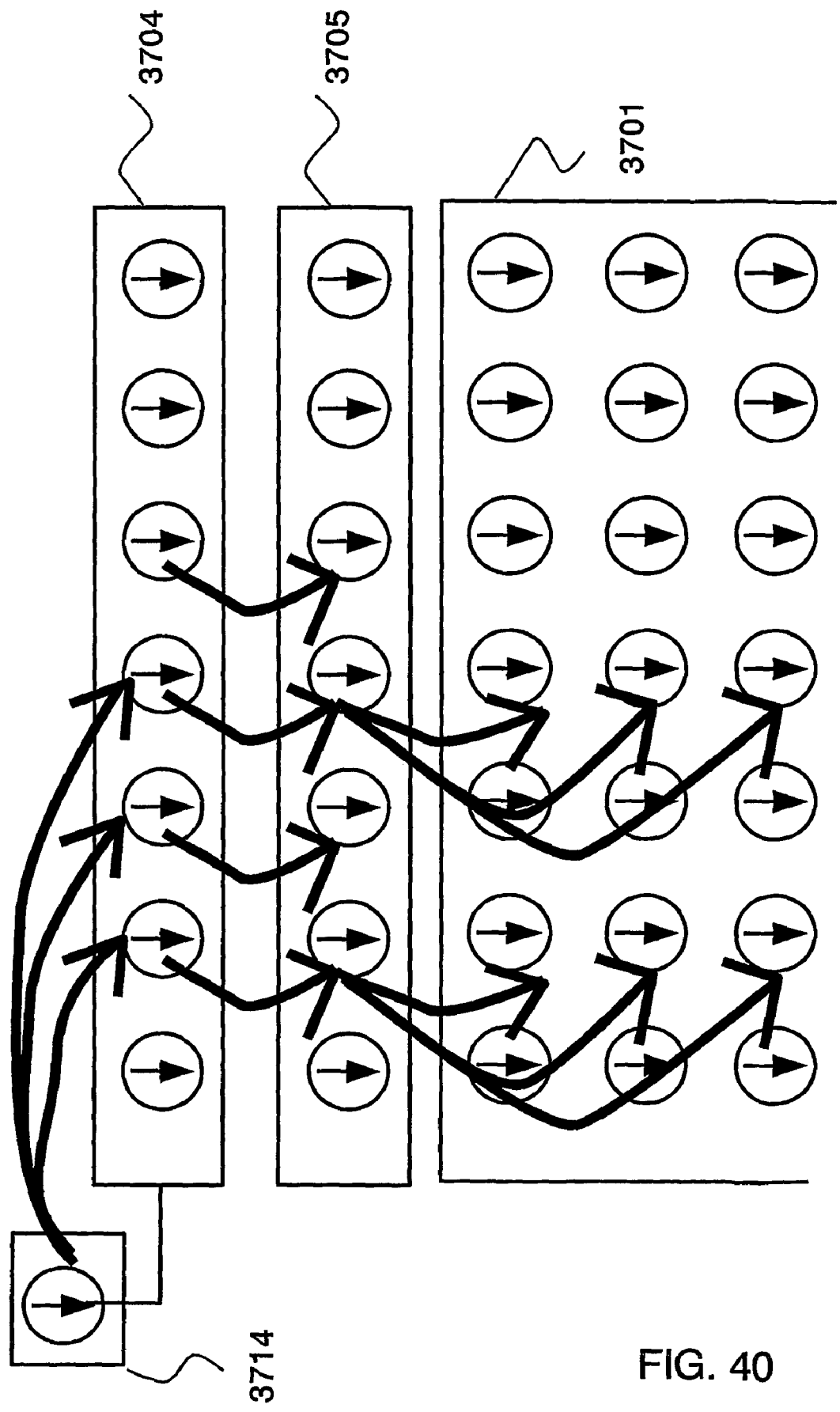
FIG. 40 is a diagram showing a configuration of a semiconductor device of the invention.
Figure 41:
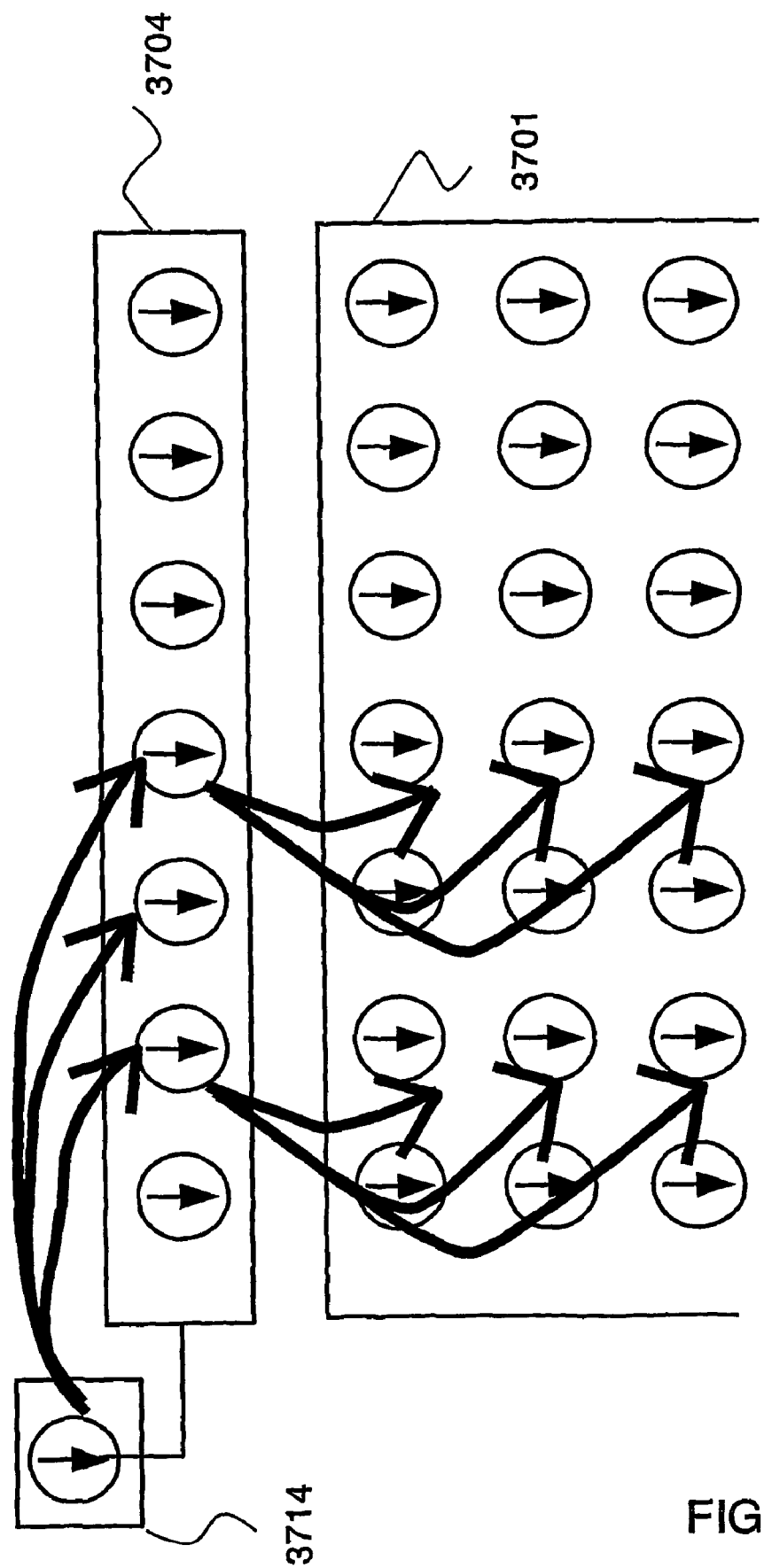
FIG. 41 is a diagram showing a configuration of a semiconductor device of the invention.

That is, a circuit for supplying a current exists in various portions of a circuit. Such a current source circuit is required to output an accurate current. Therefore, another current source circuit is used to perform setting so that a transistor can output an accurate current. The another current source circuit is required to output an accurate current as well. Therefore, as shown in FIGS. 39, 40, and 41, a current source circuit as a reference is provided at a certain place, thereby current source transistors are set sequentially. Accordingly, a current source circuit can output an accurate current. Therefore, the invention can be applied to such a portion.

Note that the content described in this embodiment mode corresponds to the one utilizing the contents described in Embodiment Modes 1 to 5. Therefore, the contents described in Embodiment Modes 1 to 5 can be applied to this embodiment mode as well.

Embodiment Mode 7

Electronic apparatuses using the invention include a video camera, a digital camera, a goggle type display (head mounted display), a navigation system, an audio reproducing system (a car audio, an audio component system and the like), a laptop personal computer, a game machine, a portable information terminal (a mobile computer, a portable phone, a portable game machine, an electronic book and the like), an image reproducing device provided with a recording medium (specifically, a device which reproduces a recording medium such as a Digital Versatile Disc (DVD) and has a display to display the reproduced image) and the like. Specific examples of these electronic apparatuses are shown in FIGS. 42A to 42H.

Figure 42A:
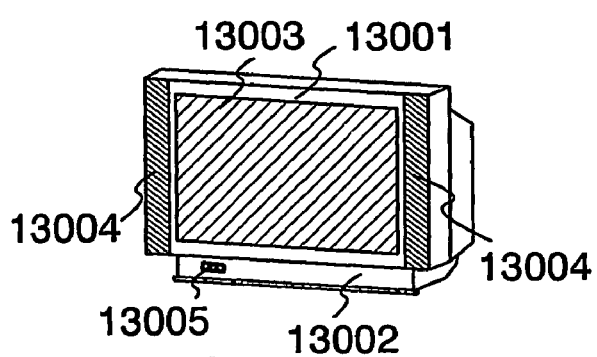
FIGS. 42A to 42H are views of electronic apparatuses to which the invention is applied.

FIG. 42A illustrates a light emitting device including a housing 13001, a support base 13002, a display portion 13003, speaker portions 13004, a video input terminal 13005 and the like. The invention can be applied to a semiconductor device which forms the display portion 13003. As an effect of variations of transistors can be reduced according to the invention, luminance variations can be reduced. Thus, an accurate signal can be inputted even to a pixel of low gray scale level by a precharge operation, therefore, a fine image can be displayed and the light emitting device as shown in FIG. 42A is completed. As the light emitting device is self-luminous type, no backlight is required and a display portion thinner than a liquid crystal display can be formed. Note that the light emitting device refers to all light emitting devices for displaying information, including ones for personal computers, for TV broadcasting reception, and for advertisement.

Figure 42B:
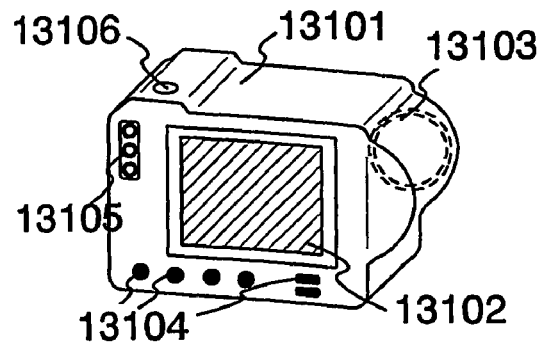

FIG. 42B illustrates a digital still camera including a main body 13101, a display portion 13102, an image receiving portion 13103, operating keys 13104, an external connecting port 13105, a shutter 13106 and the like. The invention can be applied to a semiconductor device which forms the display portion 13102. As an effect of variations of transistors can be reduced according to the invention, luminance variations can be reduced. Thus, an accurate signal can be inputted even to a pixel of low gray scale level by a precharge operation, therefore, a fine image can be displayed and the digital still camera as shown in FIG. 42B is completed.

Figure 42C:
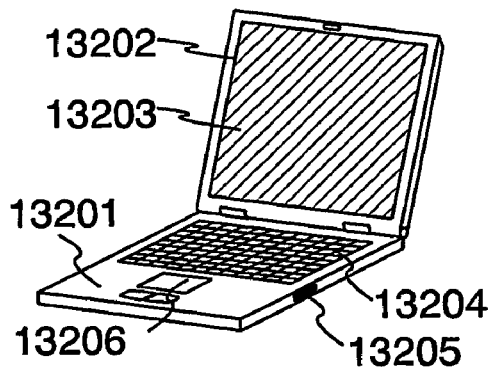

FIG. 42C illustrates a laptop personal computer including a main body 13201, a housing 13202, a display portion 13203, a keyboard 13204, an external connecting port 13205, a pointing mouse 13206, and the like. The invention can be applied to a semiconductor device which forms the display portion 13203. As an effect of variations of transistors can be reduced according to the invention, luminance variations can be reduced. Thus, an accurate signal can be inputted even to a pixel of low gray scale level by a precharge operation, therefore, a fine image can be displayed and the laptop personal computer as shown in FIG. 42C is completed.

Figure 42D:
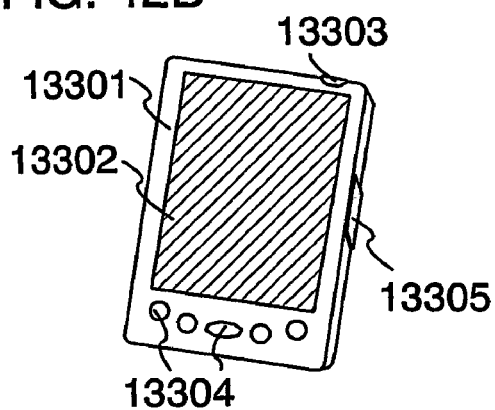

FIG. 42D illustrates a mobile computer including a main body 13301, a display portion 13302, a switch 13303, operating keys 13304, an infrared port 13305 and the like. The invention can be applied to a semiconductor device which forms the display portion 13302. As an effect of variations of transistors can be reduced according to the invention, luminance variations can be reduced. Thus, an accurate signal can be inputted even to a pixel of low gray scale level by a precharge operation, therefore, a fine image can be displayed and the mobile computer as shown in FIG. 42D is completed.

Figure 42E:
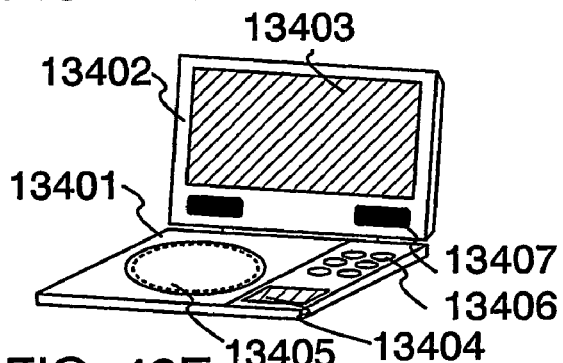

FIG. 42E illustrates a portable image reproducing device provided with a recording medium (specifically a DVD reproducing device), including a main body 13401, a housing 13402, a display portion A13403, a display portion B13404, a recording medium (DVD and the like) reading portion 13405, an operating key 13406, a speaker portion 13407, and the like. The display portion A13403 mainly displays image data while the display portion B13404 mainly displays text data. The invention can be applied to a semiconductor device which forms the display portions A13403 and B13404. Note that the image reproducing device provided with a recording medium includes a home game machine and the like. As an effect of variations of transistors can be reduced according to the invention, luminance variations can be reduced. Thus, an accurate signal can be inputted even to a pixel of low gray scale level by a precharge operation, therefore, a fine image can be displayed and the DVD reproducing device as shown in FIG. 42E is completed.

Figure 42F:
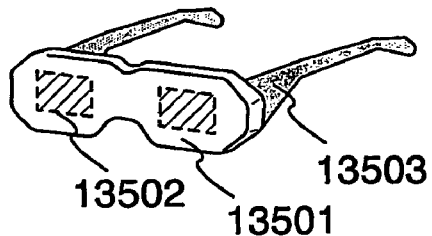

FIG. 42F illustrates a goggle type display (head mounted display) including a main body 13501, a display portion 13502, and an arm portion 13503. The invention can be applied to a semiconductor device which forms the display portion 13502. As an effect of variations of transistors can be reduced according to the invention, luminance variations can be reduced. Thus, an accurate signal can be inputted even to a pixel of low gray scale level by a precharge operation, therefore, a fine image can be displayed and the goggle type display as shown in FIG. 42F is completed.

Figure 42G:
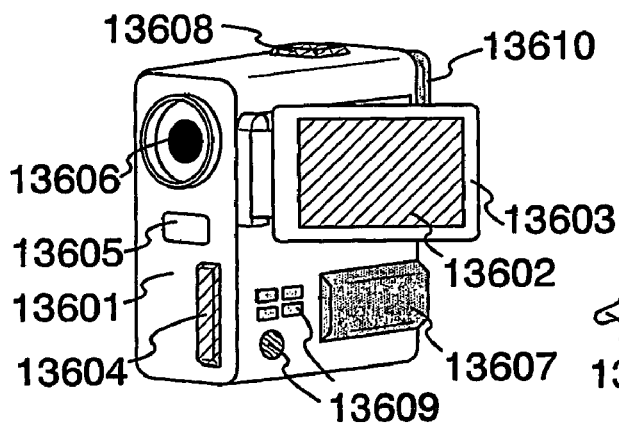

FIG. 42G illustrates a video camera including a main body 13601, a display portion 13602, a housing 13603, an external connecting port 13604, a remote control receiving portion 13605, an image receiving portion 13606, a battery 13607, an audio input portion 13608, operating keys 13609, an ocular portion 13610 and the like. The invention can be applied to a semiconductor device which forms the display portion 13602. As an effect of variations of transistors can be reduced according to the invention, luminance variations can be reduced. Thus, an accurate signal can be inputted even to a pixel of low gray scale level by a precharge operation, therefore, a fine image can be displayed and the video camera as shown in FIG. 42G is completed.

Figure 42H:
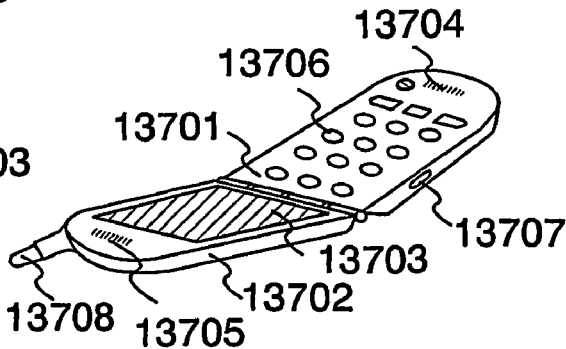
Figure 43:
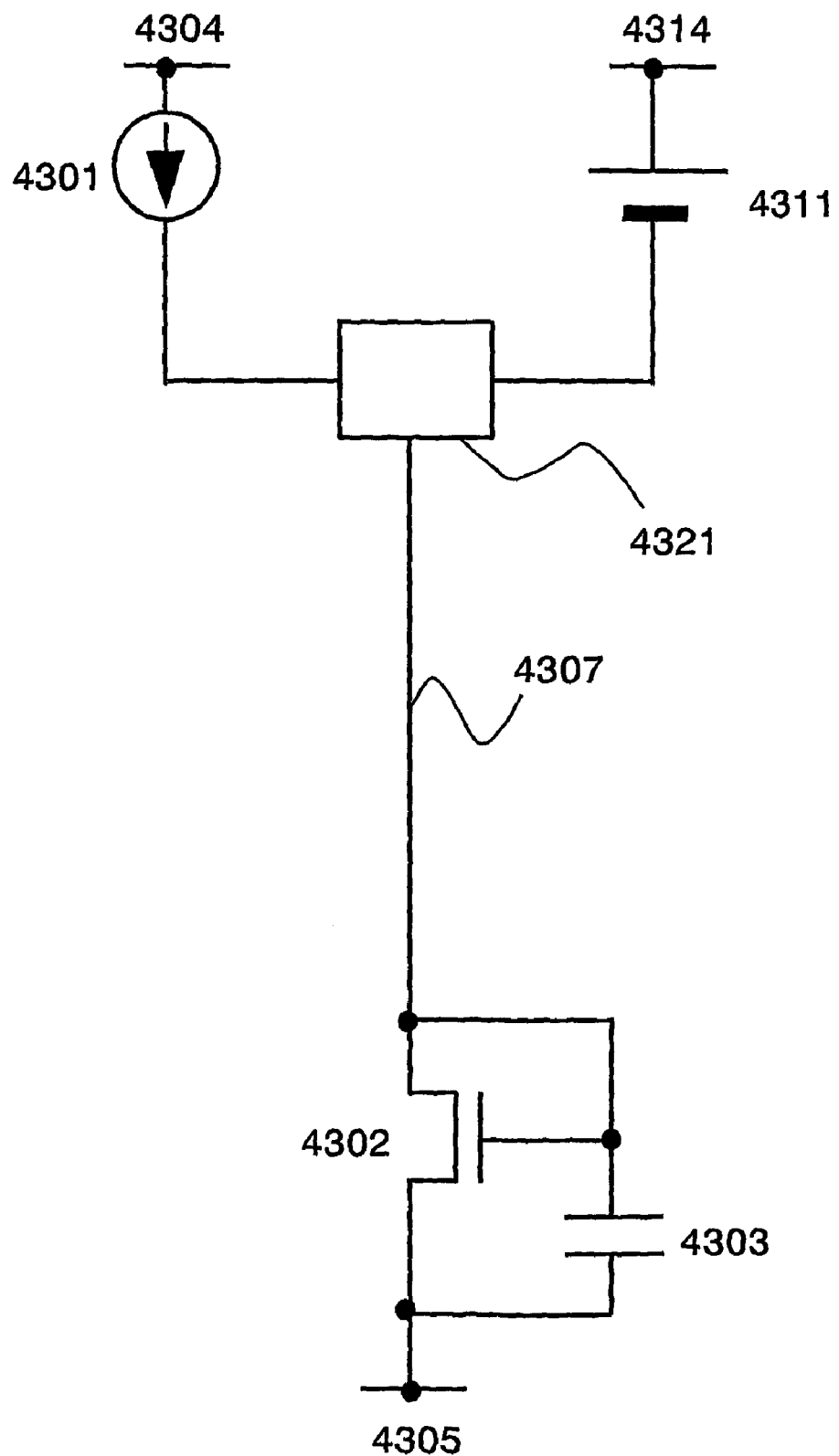
FIG. 43 is a diagram showing a configuration of a semiconductor device of the invention.
Figure 44A:
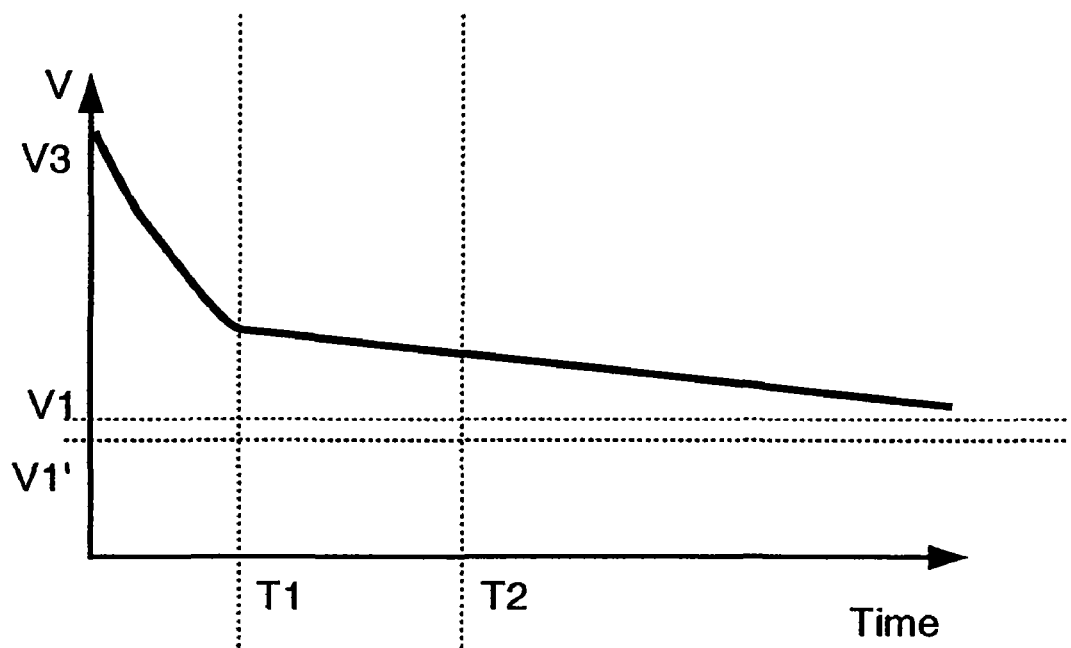
FIGS. 44A and 44B are diagrams showing a change over time of a potential of a conventional semiconductor device.
Figure 44B:
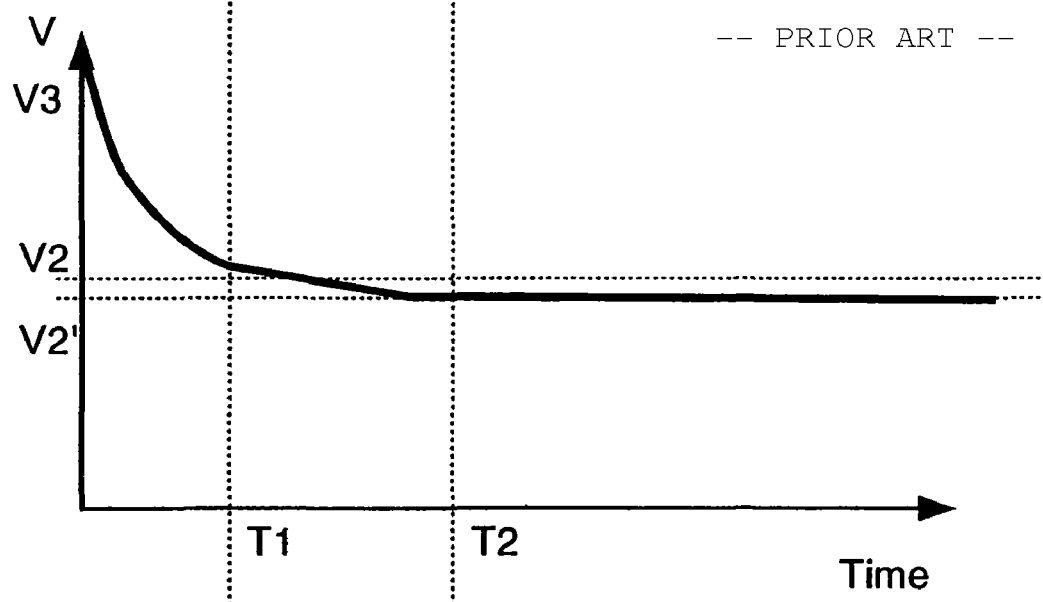
Figure 45A:
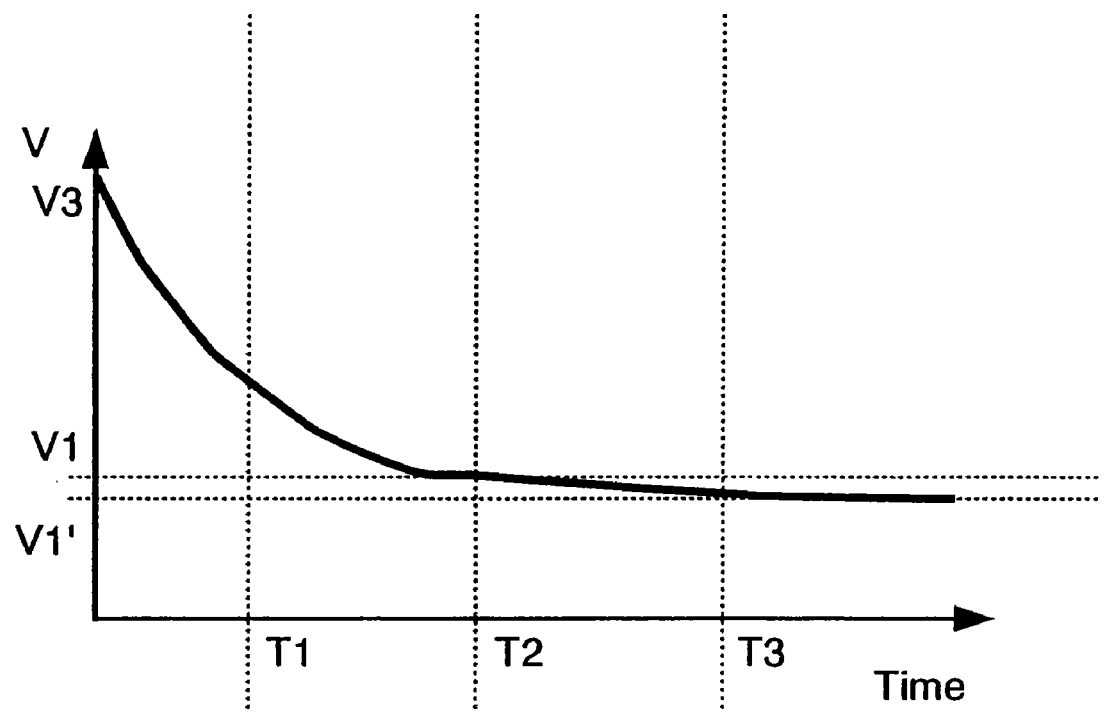
FIGS. 45A and 45B are diagrams showing a change over time of a potential of a conventional semiconductor device.
Figure 45B:
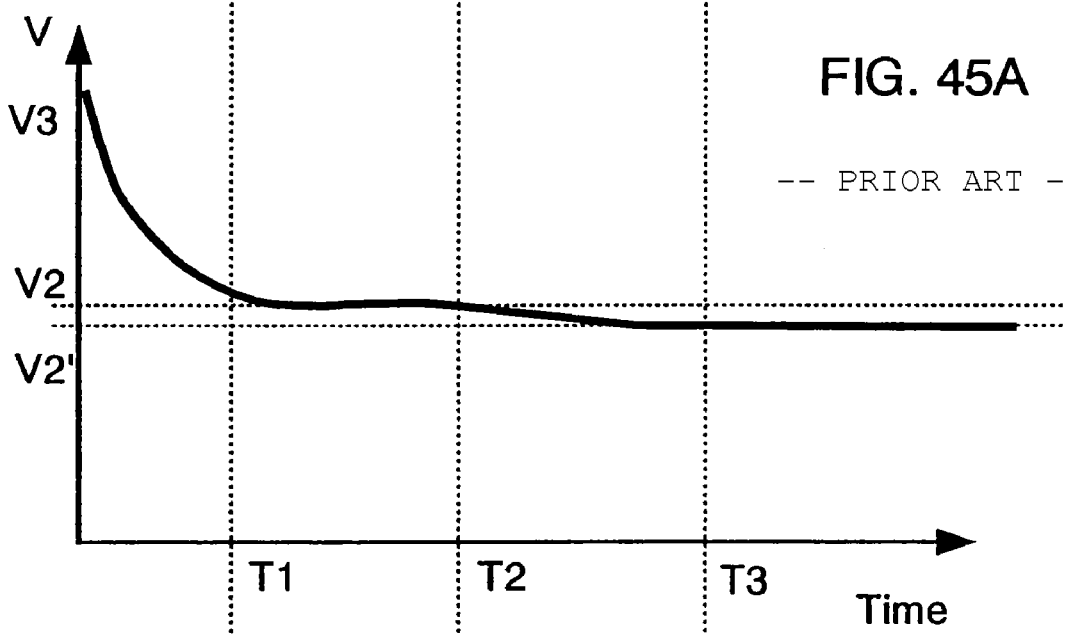

FIG. 42H illustrates a portable phone including a main body 13701, a housing 13702, a display portion 13703, an audio input portion 13704, an audio output portion 13705, an operating key 13706, an external connecting port 13707, an antenna 13708 and the like. The invention can be applied to a semiconductor device which forms the display portion 13703. Note that current consumption of the portable phone can be suppressed by displaying white text on a black background in the display portion 13703. As an effect of variations of transistors can be reduced according to the invention, luminance variations can be reduced. Thus, an accurate signal can be inputted even to a pixel of low gray scale level by a precharge operation, therefore, a fine image can be displayed and the portable phone as shown in FIG. 42H is completed.

Provided that a luminance of a light emitting material becomes high in the future, the light including outputted image data can be expanded and projected by using a lens and the like to be used for a front or rear type projector.

Furthermore, the aforementioned electronic apparatuses are becoming to be more used for displaying information distributed through a telecommunication path such as Internet, a CATV (cable television system), and in particular for displaying moving image data. The light emitting device is suitable for displaying moving images since the light emitting material can exhibit high response speed.

It is preferable to display data with as small light emitting portion as possible because the light emitting device consumes power in the light emitting portion. Therefore, in the case of using the light emitting device in the display portions of the portable information terminal, in particular a portable phone or an audio reproducing device which mainly displays text data, it is preferable to drive so that the text data is formed by a light emitting portion with a non-light emitting portion as a background.

As described above, the application range of the invention is so wide that the invention can be used in various fields of electronic apparatuses. The electronic apparatuses described in this embodiment can use any configuration of the semiconductor device described in Embodiment Modes 1 to 6.

The invention claimed is:

1. A semiconductor device comprising:
   a transistor comprising a source, a drain and a gate;
   a capacitor electrically connected to the gate and one of the source and the drain a current source electrically connected to the gate and the one of the source and the drain;
   a charge supply means; and
   a precharge circuit configured to supply a charge to the transistor, the precharge circuit comprising:
   a comparison control circuit having an output terminal, a first input terminal, and a second input terminal electrically connected to the gate and the one of the source and the drain; and
   a switch electrically connected to the output terminal,
   wherein the charge supply means is electrically connected to the gate and the one of the source and the drain through the switch, and
   wherein a current supplied from the current source flows into the transistor.

2. A semiconductor device according to claim 1, wherein the charge supply means is a second current source.

3. A semiconductor device according to claim 1, wherein the charge supply means is a power source.

4. The semiconductor device according to claim 1, wherein the comparison control circuit comprises an operational amplifier.

5. The semiconductor device according to claim 1, wherein the comparison control circuit comprises a chopper inverter comparator.

6. An electronic apparatus having the semiconductor device according to claim 1, wherein the electronic apparatus is selected from the group consisting of a light emitting device, a digital still camera, laptop personal computer, a mobile computer, a portable image reproducing device, a goggle type display, a video camera and a portable phone.

7. A display device comprising:
   a light emitting element;
   a transistor comprising a source, a drain and a gate, and electrically connected to the light emitting element;
   a current source electrically connected to the gate and one of the source and the drain; and
   a precharge circuit comprising a first terminal and a second terminal, wherein both the first terminal and the second terminal are electrically connected to the gate and the one of the source and the drain,
   wherein a current supplied from the current source flows into the transistor.

8. A display device according to claim 7, wherein the precharge circuit comprises:
   a comparison control circuit for the comparison between the potential of the first terminal and the potential of the second terminal; and
   a switch controlled by the comparison control circuit.

9. A display device according to claim 8, wherein the comparison control circuit comprises an operational amplifier.

10. A display device according to claim 8, wherein the comparison control circuit comprises a chopper inverter comparator.

11. An electronic apparatus having the display device according to claim 7, wherein the electronic apparatus is selected from the group consisting of a light emitting device, a digital still camera, laptop personal computer, a mobile computer, a portable image reproducing device, a goggle type display, a video camera and a portable phone.

12. A display device comprising:
a light emitting element;
a transistor comprising a source, a drain and a gate, and electrically connected to the light emitting element;
a current source electrically connected to the gate and one of the source and the drain;
a charge supply means; and
a precharge circuit configured to supply a charge to the transistor, the precharge circuit comprising:
a comparison control circuit having an output terminal, a first input terminal, and a second input terminal electrically connected to the gate and the one of the source and the drain; and
a switch electrically connected to the output terminal,
wherein the charge supply means is electrically connected to the gate and the source and the drain through the switch, and
wherein a current supplied from the current source flows into the transistor.

13. A display device according to claim 12, wherein the charge supply means is a second current source.

14. A display device according to claim 12, wherein the charge supply means is a power source.

15. The display device according to claim 12, wherein the comparison control circuit comprises an operational amplifier.

16. The display device according to claim 12, wherein the comparison control circuit comprises a chopper inverter comparator.

17. An electronic apparatus having the display device according to claim 12, wherein the electronic apparatus is selected from the group consisting of a light emitting device, a digital still camera, laptop personal computer, a mobile computer, a portable image reproducing device, a goggle type display, a video camera and a portable phone.

18. A display device comprising:
a light emitting element;
a transistor comprising a source, a drain and a gate;
a capacitor electrically connected to the gate and one of the source and the drain;
a current source electrically connected to the gate and the one of the source and the drain;
a charge supply means; and
a precharge circuit configured to supply a charge to the transistor, the precharge circuit comprising:
a comparison control circuit having an output terminal, a first input terminal, and a second input terminal electrically connected to the gate and the one of the source and the drain; and
a switch electrically connected to the output terminal,
wherein the charge supply means is electrically connected to the gate and the one of the source and the drain through the switch,
wherein the light emitting element is electrically connected to any one of the source and the drain, and
wherein a current supplied from the current source flows into the transistor.

19. A display device according to claim 18, wherein the charge supply means is a second current source.

20. A display device according to claim 18, wherein the charge supply means is a power source.

21. The display device according to claim 18, wherein the comparison control circuit comprises an operational amplifier.

22. The display device according to claim 18, wherein the comparison control circuit comprises a chopper inverter comparator.

23. An electronic apparatus having the display device according to claim 18, wherein the electronic apparatus is selected from the group consisting of a light emitting device, a digital still camera, laptop personal computer, a mobile computer, a portable image reproducing device, a goggle type display, a video camera and a portable phone.

* * * * *